(12) United States Patent
Sasao et al.

(10) Patent No.: US 7,486,109 B2
(45) Date of Patent: Feb. 3, 2009

(54) PROGRAMMABLE LOGIC DEVICE

(75) Inventors: Tsutomu Sasao, Fukuoka (JP);
Yukihiro Iguchi, Ashigarashimo-gun (JP)

(73) Assignee: Kitakyushu Foundation for the Advancement of Industry, Science and Technology, Kitakyushu-shi (JP)

( * ) Notice: Subject to any disclaimer, the term of this patent is extended or adjusted under 35 U.S.C. 154(b) by 0 days.

(21) Appl. No.: 10/551,391

(22) PCT Filed: Mar. 31, 2004

(86) PCT No.: PCT/JP2004/004752

§ 371 (c)(1),
(2), (4) Date: Mar. 14, 2008

(87) PCT Pub. No.: WO2004/088500

PCT Pub. Date: Oct. 14, 2004

(65) Prior Publication Data

US 2008/0204072 A1    Aug. 28, 2008

(30) Foreign Application Priority Data

Mar. 31, 2003  (JP)  ............................. 2003-093922
Apr. 9, 2003  (JP)  ............................. 2003-105762

(51) Int. Cl.
*G06F 7/38*    (2006.01)
*H03K 19/173*    (2006.01)

(52) U.S. Cl. .............................. 326/38; 326/40; 326/41

(58) Field of Classification Search ............. 326/38–41, 326/46–47

See application file for complete search history.

(56) References Cited

U.S. PATENT DOCUMENTS

RE34,363 E    8/1993  Freeman (Continued)

OTHER PUBLICATIONS

Tsutomu Sasao et al., "Tashutsuryoku Kansu no Cascade Jitsugen to Saikosei Kano Hardware ni yoru Jitsugen", The institute of Electronics, Information and Communication Engineers Gijutsu Kenkyu Hokoku, vol. 101, No. 3, Apr. 6, 2001, pp. 57-64; Cited in the international search report.

(Continued)

*Primary Examiner*—Anh Q Tran
(74) *Attorney, Agent, or Firm*—Edwards Angell Palmer & Dodge LLP

(57) ABSTRACT

The PLD that can change the number of input lines and the number of rail between the memories for logic according to the objective logic function, and to which the optimum design can be done to make the size of memory minimum. The memories for logic (4) are arranged in series, and LUT is memorized in them. The input variables are input from the external input lines to each memories for logic (4). The interconnection circuit (5) connects the output lines or the external input lines of memory for logic (4) in the preceding stage and the input lines of memory for logic (4) of the succeeding stage between two memories for logic (4), according to the information for connection memorized in memory for interconnections (6). By rewriting the information for connection according to the objective logic function, the interconnection circuit can be reconfigured, and the number of input lines and the number of rail can be changed. The size of memory can be suppressed to the minimum by optimizing the ratio of the number of rail and the number of input lines according to the logic function.

13 Claims, 53 Drawing Sheets

U.S. PATENT DOCUMENTS

2008/0100337 A1* 5/2008 Kajigaya ................ 326/38

OTHER PUBLICATIONS

Akihiko Tomita et al., "LUT Array-gata PLD no Sekkei to Shisaku", The Institute of Electronics, Information and Communication Engineers Gijutsu Kenkyu Hokoku, vol. 100, No. 475, Nov. 23, 2000, pp. 173-178; Cited in the international search report.

T. Sasao et al., "A Cascade Realization of Multiple-Output Function and Its Application to Reconfigurable Hardware," The Institute of Electronics, Information and Communication Engineers, vol. 101, No. 3, Mile University, FTS2001-8, Apr. 2001, pp. 57-64. English abstract is included. Discussed in the specification.

T. Sasao et al. "A Cascade Realization of Multiple-Output Function for Reconfigurable Hardware" International Workshop on Logic and Synthesis (IWLS01), Lake Tahoe, CA, Jun. 12-15, 2001, pp. 225-230 w/cover page and the TOC, Discussed in the specification.

T. Tomita et al., "A Design of LUT-Array-Based PLD," The Institute of Electronics, Information and Communication Engineers, vol. 100, No. 475, Nov. 2000, pp. 173-178. English abstract is included.

Y. Iguchi et al., "Realization of Multiple-Output Functions by Reconfigurable Cascades," International Conference on Computer Design: VLSI in Computers & Processors (ICCD-2001), Austin, TX, Sep. 23-26, 2001. pp. 388-393 (published page number).

A. Mishchenko et al., "Encoding of Boolean Functions and Its Application to LUT Cascade Synthesis," International Workshop on Logic and Synthesis (IWLS2002), New Orleans, Louisiana, Jun. 4-7, 2002, pp. 115-120.

T. Sasao, "Design Methods for Multi-Rail Cascades," International Workshop on Boolean Problems (IWBP2002), Freiberg, Germany, Sep. 19-20, 2002, pp. 123-132.

T. Sasao et al., "A Design Method for Irredundant Cascades," International Symposium on New Paradigm VLSI Computing, Sendai, Japan, Dec. 12-14, 2002, pp. 37-40.

A. Mishchenko et al., "Logic Synthesis of LUT Cascades with Limited Rails," The Institute of Electronics, Information and Communication Engineers, Lake Biwa, VLD2002-99, Nov. 2002, pp. 1-6.

H. Gouji et al., "On a Method to Reduce the Number of LUTs in LUT cascades," The Institute of Electronics, Information and Communication Engineers, Kitakyushu, VLD2001-99, Nov. 2001, 6 sheets, English abstract is included.

M. Matsuura et al., "Compact Representaions of BDDs for Multiple-Output Functions and Their Optimization," The Institute of Electronics; Information and Communication Engineers, Kitakyushu, VLS2001-100, Nov. 2001, 6 sheets, English abstract is included.

* cited by examiner

FIG. 14

| $s_0$ | 1 | 0 | 1 | 0 | 0 | 1 | 0 | 1 | 1 | 0 | 1 | 0 | 0 | 1 | 0 | 1 |
| $s_1$ | 0 | 1 | 1 | 0 | 1 | 1 | 0 | 0 | 1 | 0 | 0 | 1 | 0 | 0 | 1 | 1 |
| $c_{out}$ | 0 | 0 | 0 | 1 | 0 | 0 | 1 | 1 | 0 | 1 | 1 | 1 | 1 | 1 | 1 | 1 |
| $b_0$ | 0 | 1 | 0 | 1 | 0 | 1 | 0 | 1 | 0 | 1 | 0 | 1 | 0 | 1 | 0 | 1 |
| $b_1$ | 0 | 0 | 1 | 1 | 0 | 0 | 1 | 1 | 0 | 0 | 1 | 1 | 0 | 0 | 1 | 1 |
| $a_0$ | 0 | 0 | 0 | 0 | 1 | 1 | 1 | 0 | 0 | 0 | 0 | 1 | 1 | 1 | 1 | 1 |
| $a_1$ | 0 | 0 | 0 | 0 | 0 | 0 | 0 | 0 | 1 | 1 | 1 | 1 | 1 | 1 | 1 | 1 |
| $c_{in}$ | 1 | 1 | 1 | 1 | 1 | 1 | 1 | 1 | 1 | 1 | 1 | 1 | 1 | 1 | 1 | 1 |

| $s_0$ | 0 | 1 | 0 | 1 | 1 | 0 | 1 | 0 | 0 | 1 | 0 | 1 | 1 | 0 | 1 | 0 |
| $s_1$ | 0 | 0 | 1 | 1 | 0 | 1 | 1 | 0 | 1 | 1 | 0 | 0 | 1 | 0 | 0 | 1 |
| $c_{out}$ | 0 | 0 | 0 | 0 | 0 | 0 | 0 | 1 | 0 | 0 | 1 | 1 | 0 | 1 | 1 | 1 |
| $b_0$ | 0 | 1 | 0 | 1 | 0 | 1 | 0 | 1 | 0 | 1 | 0 | 1 | 0 | 1 | 0 | 1 |
| $b_1$ | 0 | 0 | 1 | 1 | 0 | 0 | 1 | 1 | 0 | 0 | 1 | 1 | 0 | 0 | 1 | 1 |
| $a_0$ | 0 | 0 | 0 | 0 | 1 | 1 | 1 | 1 | 0 | 0 | 0 | 0 | 1 | 1 | 1 | 1 |
| $a_1$ | 0 | 0 | 0 | 0 | 0 | 0 | 0 | 0 | 1 | 1 | 1 | 1 | 1 | 1 | 1 | 1 |
| $c_{in}$ | 0 | 0 | 0 | 0 | 0 | 0 | 0 | 0 | 0 | 0 | 0 | 0 | 0 | 0 | 0 | 0 |

FIG. 15

| Address | | | | | | | | Memory value | | | | | | | |
|---|---|---|---|---|---|---|---|---|---|---|---|---|---|---|---|
| $i_0$ | $i_1$ | $i_2$ | $i_3$ | $i_4$ | $i_5$ | $i_6$ | $i_7$ | $o_7$ | $o_6$ | $o_5$ | $o_4$ | $o_3$ | $o_2$ | $o_1$ | $o_0$ |
| 0 | 0 | 0 | 0 | 0 | - | - | - | - | - | - | 0 | 0 | 0 | - | - |
| 0 | 0 | 0 | 0 | 1 | - | - | - | - | - | - | 0 | 0 | 1 | - | - |
| 0 | 0 | 0 | 1 | 0 | - | - | - | - | - | - | 0 | 1 | 0 | - | - |
| 0 | 0 | 0 | 1 | 1 | - | - | - | - | - | - | 0 | 1 | 1 | - | - |
| 0 | 0 | 1 | 0 | 0 | - | - | - | - | - | - | 0 | 0 | 1 | - | - |
| 0 | 0 | 1 | 0 | 1 | - | - | - | - | - | - | 0 | 1 | 0 | - | - |
| 0 | 0 | 1 | 1 | 0 | - | - | - | - | - | - | 0 | 1 | 1 | - | - |
| 0 | 0 | 1 | 1 | 1 | - | - | - | - | - | - | 1 | 0 | 0 | - | - |
| 0 | 1 | 0 | 0 | 0 | - | - | - | - | - | - | 0 | 1 | 0 | - | - |
| 0 | 1 | 0 | 0 | 1 | - | - | - | - | - | - | 0 | 1 | 1 | - | - |
| 0 | 1 | 0 | 1 | 0 | - | - | - | - | - | - | 1 | 0 | 0 | - | - |
| 0 | 1 | 0 | 1 | 1 | - | - | - | - | - | - | 1 | 0 | 1 | - | - |
| 0 | 1 | 1 | 0 | 0 | - | - | - | - | - | - | 0 | 1 | 1 | - | - |
| 0 | 1 | 1 | 0 | 1 | - | - | - | - | - | - | 1 | 0 | 0 | - | - |
| 0 | 1 | 1 | 1 | 0 | - | - | - | - | - | - | 1 | 0 | 1 | - | - |
| 0 | 1 | 1 | 1 | 1 | - | - | - | - | - | - | 1 | 1 | 0 | - | - |

| Address | | | | | | | | Memory value | | | | | | | |
|---|---|---|---|---|---|---|---|---|---|---|---|---|---|---|---|
| $i_0$ | $i_1$ | $i_2$ | $i_3$ | $i_4$ | $i_5$ | $i_6$ | $i_7$ | $o_7$ | $o_6$ | $o_5$ | $o_4$ | $o_3$ | $o_2$ | $o_1$ | $o_0$ |
| 1 | 0 | 0 | 0 | 0 | - | - | - | - | - | - | 0 | 0 | 1 | - | - |
| 1 | 0 | 0 | 0 | 1 | - | - | - | - | - | - | 0 | 1 | 0 | - | - |
| 1 | 0 | 0 | 1 | 0 | - | - | - | - | - | - | 0 | 1 | 1 | - | - |
| 1 | 0 | 0 | 1 | 1 | - | - | - | - | - | - | 1 | 0 | 0 | - | - |
| 1 | 0 | 1 | 0 | 0 | - | - | - | - | - | - | 0 | 1 | 0 | - | - |
| 1 | 0 | 1 | 0 | 1 | - | - | - | - | - | - | 0 | 1 | 1 | - | - |
| 1 | 0 | 1 | 1 | 0 | - | - | - | - | - | - | 1 | 0 | 0 | - | - |
| 1 | 0 | 1 | 1 | 1 | - | - | - | - | - | - | 1 | 0 | 1 | - | - |
| 1 | 1 | 0 | 0 | 0 | - | - | - | - | - | - | 0 | 1 | 1 | - | - |
| 1 | 1 | 0 | 0 | 1 | - | - | - | - | - | - | 1 | 0 | 0 | - | - |
| 1 | 1 | 0 | 1 | 0 | - | - | - | - | - | - | 1 | 0 | 1 | - | - |
| 1 | 1 | 0 | 1 | 1 | - | - | - | - | - | - | 1 | 1 | 0 | - | - |
| 1 | 1 | 1 | 0 | 0 | - | - | - | - | - | - | 1 | 0 | 0 | - | - |
| 1 | 1 | 1 | 0 | 1 | - | - | - | - | - | - | 1 | 0 | 1 | - | - |
| 1 | 1 | 1 | 1 | 0 | - | - | - | - | - | - | 1 | 1 | 0 | - | - |
| 1 | 1 | 1 | 1 | 1 | - | - | - | - | - | - | 1 | 1 | 1 | - | - |

FIG. 16

| Address | | | | | | | | Memory value | | | | | | | |
|---|---|---|---|---|---|---|---|---|---|---|---|---|---|---|---|
| $i_0$ | $i_1$ | $i_2$ | $i_3$ | $i_4$ | $i_5$ | $i_6$ | $i_7$ | $o_7$ | $o_6$ | $o_5$ | $o_4$ | $o_3$ | $o_2$ | $o_1$ | $o_0$ |
| 0 | - | - | - | 0 | 0 | 0 | 0 | - | - | - | 0 | 0 | 0 | - | - |
| 0 | - | - | - | 0 | 0 | 0 | 1 | - | - | - | 0 | 0 | 1 | - | - |
| 0 | - | - | - | 0 | 0 | 1 | 0 | - | - | - | 0 | 1 | 0 | - | - |
| 0 | - | - | - | 0 | 0 | 1 | 1 | - | - | - | 0 | 1 | 1 | - | - |
| 0 | - | - | - | 0 | 1 | 0 | 0 | - | - | - | 0 | 0 | 1 | - | - |
| 0 | - | - | - | 0 | 1 | 0 | 1 | - | - | - | 0 | 1 | 0 | - | - |
| 0 | - | - | - | 0 | 1 | 1 | 0 | - | - | - | 0 | 1 | 1 | - | - |
| 0 | - | - | - | 0 | 1 | 1 | 1 | - | - | - | 1 | 0 | 0 | - | - |
| 0 | - | - | - | 1 | 0 | 0 | 0 | - | - | - | 0 | 1 | 0 | - | - |
| 0 | - | - | - | 1 | 0 | 0 | 1 | - | - | - | 0 | 1 | 1 | - | - |
| 0 | - | - | - | 1 | 0 | 1 | 0 | - | - | - | 1 | 0 | 0 | - | - |
| 0 | - | - | - | 1 | 0 | 1 | 1 | - | - | - | 1 | 0 | 1 | - | - |
| 0 | - | - | - | 1 | 1 | 0 | 0 | - | - | - | 0 | 1 | 1 | - | - |
| 0 | - | - | - | 1 | 1 | 0 | 1 | - | - | - | 1 | 0 | 0 | - | - |
| 0 | - | - | - | 1 | 1 | 1 | 0 | - | - | - | 1 | 0 | 1 | - | - |
| 0 | - | - | - | 1 | 1 | 1 | 1 | - | - | - | 1 | 1 | 0 | - | - |

| Address | | | | | | | | Memory value | | | | | | | |
|---|---|---|---|---|---|---|---|---|---|---|---|---|---|---|---|
| $i_0$ | $i_1$ | $i_2$ | $i_3$ | $i_4$ | $i_5$ | $i_6$ | $i_7$ | $o_7$ | $o_6$ | $o_5$ | $o_4$ | $o_3$ | $o_2$ | $o_1$ | $o_0$ |
| 1 | - | - | - | 0 | 0 | 0 | 0 | - | - | - | 0 | 0 | 1 | - | - |
| 1 | - | - | - | 0 | 0 | 0 | 1 | - | - | - | 0 | 1 | 0 | - | - |
| 1 | - | - | - | 0 | 0 | 1 | 0 | - | - | - | 0 | 1 | 1 | - | - |
| 1 | - | - | - | 0 | 0 | 1 | 1 | - | - | - | 1 | 0 | 0 | - | - |
| 1 | - | - | - | 0 | 1 | 0 | 0 | - | - | - | 0 | 1 | 0 | - | - |
| 1 | - | - | - | 0 | 1 | 0 | 1 | - | - | - | 0 | 1 | 1 | - | - |
| 1 | - | - | - | 0 | 1 | 1 | 0 | - | - | - | 1 | 0 | 0 | - | - |
| 1 | - | - | - | 0 | 1 | 1 | 1 | - | - | - | 1 | 0 | 1 | - | - |
| 1 | - | - | - | 1 | 0 | 0 | 0 | - | - | - | 0 | 1 | 1 | - | - |
| 1 | - | - | - | 1 | 0 | 0 | 1 | - | - | - | 1 | 0 | 0 | - | - |
| 1 | - | - | - | 1 | 0 | 1 | 0 | - | - | - | 1 | 0 | 1 | - | - |
| 1 | - | - | - | 1 | 0 | 1 | 1 | - | - | - | 1 | 1 | 0 | - | - |
| 1 | - | - | - | 1 | 1 | 0 | 0 | - | - | - | 1 | 0 | 0 | - | - |
| 1 | - | - | - | 1 | 1 | 0 | 1 | - | - | - | 1 | 0 | 1 | - | - |
| 1 | - | - | - | 1 | 1 | 1 | 0 | - | - | - | 1 | 1 | 0 | - | - |
| 1 | - | - | - | 1 | 1 | 1 | 1 | - | - | - | 1 | 1 | 1 | - | - |

FIG. 34

| $s_0$ | 1 | 0 | 1 | 0 | 0 | 1 | 0 | 1 | 1 | 0 | 1 | 0 | 0 | 1 | 0 | 1 |
|---|---|---|---|---|---|---|---|---|---|---|---|---|---|---|---|---|
| $s_1$ | 0 | 1 | 1 | 0 | 1 | 1 | 0 | 0 | 1 | 0 | 0 | 1 | 0 | 0 | 1 | 1 |
| $c_{out}$ | 0 | 0 | 0 | 1 | 0 | 0 | 1 | 1 | 0 | 1 | 1 | 1 | 1 | 1 | 1 | 1 |
| $b_0$ | 0 | 1 | 0 | 1 | 0 | 1 | 0 | 1 | 0 | 1 | 0 | 1 | 0 | 1 | 0 | 1 |
| $b_1$ | 0 | 0 | 1 | 1 | 0 | 0 | 1 | 1 | 0 | 0 | 1 | 1 | 0 | 0 | 1 | 1 |
| $a_0$ | 0 | 0 | 0 | 0 | 1 | 1 | 1 | 1 | 0 | 0 | 0 | 0 | 1 | 1 | 1 | 1 |
| $a_1$ | 0 | 0 | 0 | 0 | 0 | 0 | 0 | 0 | 1 | 1 | 1 | 1 | 1 | 1 | 1 | 1 |
| $c_{in}$ | 1 | 1 | 1 | 1 | 1 | 1 | 1 | 1 | 1 | 1 | 1 | 1 | 1 | 1 | 1 | 1 |

| $s_0$ | 0 | 1 | 0 | 1 | 1 | 0 | 1 | 0 | 0 | 1 | 0 | 1 | 1 | 0 | 1 | 0 |
|---|---|---|---|---|---|---|---|---|---|---|---|---|---|---|---|---|
| $s_1$ | 0 | 0 | 1 | 1 | 0 | 1 | 1 | 0 | 1 | 1 | 0 | 0 | 1 | 0 | 0 | 1 |
| $c_{out}$ | 0 | 0 | 0 | 0 | 0 | 0 | 0 | 1 | 0 | 0 | 1 | 1 | 0 | 1 | 1 | 1 |
| $b_0$ | 0 | 1 | 0 | 1 | 0 | 1 | 0 | 1 | 0 | 1 | 0 | 1 | 0 | 1 | 0 | 1 |
| $b_1$ | 0 | 0 | 1 | 1 | 0 | 0 | 1 | 1 | 0 | 0 | 1 | 1 | 0 | 0 | 1 | 1 |
| $a_0$ | 0 | 0 | 0 | 0 | 1 | 1 | 1 | 1 | 0 | 0 | 0 | 0 | 1 | 1 | 1 | 1 |
| $a_1$ | 0 | 0 | 0 | 0 | 0 | 0 | 0 | 0 | 1 | 1 | 1 | 1 | 1 | 1 | 1 | 1 |
| $c_{in}$ | 0 | 0 | 0 | 0 | 0 | 0 | 0 | 0 | 0 | 0 | 0 | 0 | 0 | 0 | 0 | 0 |

(a) 1st cell (b) 2nd cell (c) 3rd cell (d) 4th cell (a) $f = ((x_1 \vee x_2)x_3 \vee x_4)x_5 \vee x_6$ $(x1, x2, x3, x4, x5, x6)$ is the optimal ordering for this function.

(b) $g = ((x_4 x_5 \vee x_6)x_1 \vee x_2)x_3$ $(x4, x5, x6, x1, x2, x3)$ is the optimal ordering for this function.

$f = (((x_1 \lor x_2)x_3 \lor x_4)x_5 \lor x_6$ $g = (((x_4 x_5 \lor x_6)x_1 \lor x_2)x_3$ By using the LUT ring, the ordering can be optimal for two functions.

LUT cascade with $p$ memory cells

PROGRAMMABLE LOGIC DEVICE

TECHNICAL FIELD

This invention is related to the programmable logic device (PLD). More particularly, this invention is related to the architecture, operation and design of PLD that utilizes lookup table cascade (LUT cascade), where each LUT corresponds to the decomposed function of the objective logic function.

BACKGROUND ART

Field programmable gate arrays (FPGAs) are widely used in the design of the logic circuits, recently (reference 1). An FPGA is a PLD that can change interconnections among logic cells (Configurable Logic Block: CLB) arranged in a two-dimensional matrix by rewriting the memory. FPGAs work as hardware, and are different from microprocessors (MPUs) that operate software programs. Thus, a feature of FPGAs is their fast manipulation of logic functions.

On the other hand, in FPGAs, we can change physical interconnections between CLBs by programming. Therefore, the physical design to reduce interconnection delay is necessary, and such work is a time-consuming work. Moreover, since the delay depends on interconnections between CLBs, the interconnections delay is hard to predict without finishing the layout. Therefore, the performance estimation of the logic circuits is difficult during logic design.

Moreover, the fraction of the area for interconnections on the chip will be very large, since in FPGAs, the free interconnections among CLBs arranged in two-dimensional array are necessary. Moreover, since pass transistors are used for the interconnections, the delay of the interconnection part is fairly large.

Thus, LUT cascade has been proposed as a PLD that resolves above-mentioned demerits of FPGAs (reference 2 and 3). An LUT cascade is obtained by a series connection of LUTs. The LUT cascade can be represented as a series connection of LUTs that represent the decomposed functions of the object logic function. The LUT cascade is different from the FPGA, since the FPGA realizes logic functions by the networks of CLBs arranged in two-dimensional array, while the LUT cascade realizes logic functions arranged in a one-dimensional network of LUTs.

Each CLB used in an FPGA realizes a basic logic gate. The basic design concept of FPGA is to realize a complex logic circuit by connecting these basic logic gates. Therefore, in FPGA, the interconnection circuit to connect CLBs arranged in two-dimensional array is inevitable. An FPGA requires a large area for interconnections in addition to the area for logic. Thus, the chip area of FPGA tends to be large.

On the other hand, the basic design concept of an LUT cascade is to realize complex logic function by a series connection (one-dimensional array) of LUTs that realize complex multiple-output logic functions. Therefore, each LUT has, in general, many inputs and many outputs. Since two-dimensional interconnection circuit is unnecessary, the area for interconnections is fairly small, and the most of the chip area is spent for the memory area to store LUTs.

Moreover, in an LUT cascade, the chip area for the interconnections, and the delay time for the interconnections are smaller than that of FPGAs.

From here, we will explain a design method of the LUT cascade. FIG. 52 shows the principle of the LUT cascade. For simplicity, we use an example of an LUT cascade without intermediate outputs.

To design a LUT cascade for a given logic function, first, we decompose the objective function $f(X)$ into s subfunctions $\{f_i(X_i); i=0, \ldots, s-1\}$ ($s \geq 2$). Here, $X=(\chi_0, \ldots, \chi_{n-1})$ denotes an ordered set of the input variables. The unordered set of input variables is denoted by $\{X\}$. Here, $\{X\}=\{X_0\} \cup \ldots \cup \{X_{s-1}\}\{X_i\} \cap \{X_j\}=\phi(i \neq j; i, j \in \{0, \ldots, s-1\})$. The output variables of each decomposition function $f_i$ (in general, vector) are denoted by $Y_{i+1}$. Hereafter, the number of variables in X and Y are denoted by $|X|$ and $|Y|$, respectively. Especially, $|X|=n$, $|X_i|=n_i$, and $|Y_i|=u_i$.

Let k be the number of input variables of decomposition functions $F_0$. We consider to decompose the objective logic function $f(X)$ into s subfunctions, $f_0(X_0), f_1(X_1), \ldots, f_{s-1}(X_{s-1})$, where $n_0=k$ and $n_i=k-u_i$ ($0<i<s-1$) and $n_{s-1}=k-u_{s-1}-t$ ($0 \leq t \leq k-2$) (references 2 and 3). In this case, the objective logic function $f(X)$ is decomposed into (s-1) subfunctions $f_j(j \in \{0, \ldots, s-2\})$ of k variables, and one subfunction $f_{s-1}$ of (k-t) variables. Then, we represent these subfunctions $f_r(r \in \{0, \ldots, s-1\})$ by truth tables and implement them by LUTs (look up tables). Decomposition can be found by using decomposition chart. The decomposition chart of objective logic function $f(X_1, X_2)$ has $2^{|X_2|}$ rows and $2^{|X_1|}$ columns, with distinct labels of a binary code in the each row and the each column of the table, and the corresponding element of the table shows the truth value of the function $f(X_1, X_2)$.

In FIG. 52, s copies of LUTs ($LUT_0$ through $LUT_{s-1}$) represent decomposition functions $\{f_i; i=0, \ldots, s-1\}$. Each LUT ($LUT_r$) can be implemented by a memory with k input and $u_{r+1}$ output. Such memory is denoted by "Memory for logic." By connecting memories for logic in cascade, we have the LUT cascade shown in FIG. 52.

In the LUT cascade, when the number of inputs and outputs of the objective logic function $f(X)$ is large, we need many LUTs to implement $f(X)$. Therefore, the operation speed of an LUT cascade can be slower than an optimally designed FPGA. However, the operation of each subfunction is done in high speed by a table lookup of a memory in the LUT cascade. Thus, the operation speed of LUT cascade can be faster than software that runs on an MPU.

The operation speed of the cascade is easily estimated by the number of levels of an LUT. Therefore, we can accurately estimate the performance of the cascade during the logic design. Moreover, the interconnections are only between adjacent memories for logic in the LUT cascade. Thus, the influence of the interconnection delays need not be considered at the design of the logic circuit. Therefore, the design of LUT cascade is easier than FPGA.

However, when we implement an objective logic function by an LUT cascade shown in FIG. 52, the number of input and the number of rail outputs (number of lines between adjacent LUTs) of a memory for logic, depends on the function to be realized. Thus, to implement a wide range of functions, we have to prepare different LUT cascades having cells with different number of inputs, and different number of rail outputs. But, this is not so convenient.

To make a PLD to realize wider range of functions, one could use memories with enough number of inputs. However, the size of the memory will be double when the number of inputs is increased by one. Therefore, such strategy will increase unused memory. Moreover, the chip area for the memory increases as the memory increases. And, the compact implementation will be difficult, and the power consumption increase, too.

The purpose of the present invention is to provide a PLD that can change the number of input lines and the number of rails of memory for logic according to the objective function to make the size of memory minimum.

REFERENCES

1. Ross G, Freeman, U.S. Reissued Pat. RE34363.
2. Tsutomu Sasao, Munehiro Matsuura, and Yukihiro Iguchi, "Cascade realization of multiple-output functions and its application to reconfigurable hardware", The Institute of Electronics, Information and Communication Engineers, Mie University, FTS2001-8, pp. 57-64, April 2000.
3. Tsutomu Sasao, Munehiro Matsuura, and Yukihiro Iguchi "Cascade realization of multiple-output function and realization by reconfigurable hardware" International Workshop on Logic and Synthesis (IWLS01), Lake Tahoe, Calif. Jun. 12-15, 2001. pp. 225-230.

DISCLOSURE OF THE INVENTION

A first structure of the present invention provides a programmable logic device comprising:

memories for logic which are arranged in series to store LUTs (look up tables) of logic functions;

plural external input lines for input variables connecting to said memories for logic;

one or more memories for interconnection which store(s) information for connection how to select either output lines of said memory for logic of the preceding stage or said external input lines connecting to each input line of said memory for logic of the succeeding stage; and one or more reconfigurable interconnection circuits which connect(s) the output lines of said memory for logic of the preceding stage or the external input lines with the input lines of said memory for logic of the succeeding stage according to the output of said memory for interconnection.

Each memory for logic stores the logic function corresponding to an LUT, so that the LUT cascade realizes the objective logic function. Here, "memory" denotes the device where data is stored for each address, and by specifying the address, we can read the data corresponding to the address. Therefore, "memory" can consist of two or more physical devices. Each interconnection circuit makes a connection between output lines of the memory for logic of the preceding stage or external input lines with input lines of the succeeding stage, according to the information of the memory for interconnections. In this way, we can realize the LUT cascade for the objective function.

The logic function in the memory for logic and the information for connection in the memory for interconnections are updated so that the LUT cascade realizes the objective function. In this case, we can change the number of rail outputs (that is, the number of lines that connect two adjacent memories for logic), and the number of external input lines that are connected to the memory for logic. In this way, we can compose the LUT cascade that realizes objective logic function. That is, we can adjust the number of rails and the number of external input variables that are connected to the memory for logic in the succeeding stage. In this way, with a single PLD, we can realize wide range of logic functions. As a result, we can reduce the number of input lines of the memory for logic. And, we can reduce the size of the circuit.

Moreover, we can modify the ratio to the number of the output lines from the preceding stage of LUT and external input variables to optimize the usage of the device. Therefore, we can utilize the input lines of the memory for logic and efficiently use the memory area.

The PLDs in this invention are definitely different from FPGAs, in the point that the memories for logic are arranged in series or in a one-dimensional array.

That is, in the case of FPGAs, the connections between CLB are not one-to-one, since each output line of a CLB in an FPGA may have more than two fan-outs. Therefore, we need the interconnection circuit having a high degree of freedom to establish the connection. Therefore, the interconnection circuit of the FPGA will be large, and the ratio of the interconnections on a chip is rather large.

On the other hand, in an LUT cascade, the PLD of this invention, the memory for logic is arranged in series. Therefore, for each output line of a memory for logic of the preceding stage, or for each external input line, we have only to connect to just one input line of a memory for logic.

Let $Y_1 = \{y_1\}$ be the set of the output lines of the memory for logic in the preceding stage. Let $X = \{\chi\}$ be the set of the external input lines, let $Z_{r+1} = \{z_{r+1}\}$ be the set of the input line of the memory for logic of the succeeding stage. In this case, the interconnection circuit makes connection such that $|Z_{r+1}|$ elements in the set $Y_1 \cup X$ are associated with the elements of $Z_{r+1} \subseteq Y_1 \cup X$, in one-to-one correspondence manner. That is, the interconnection circuit basically selects $|Z_{r+1}|$ lines out of $|Y_1 \cup X|$ lines. (Moreover, if necessary, it permutes the order of selected lines.)

Therefore, the interconnection circuit of the LUT cascade is much easier than that of an FPGA. Also, the area for interconnections on chip can be reduced drastically. Moreover, the connections are among adjacent memories for logic, and the placement and routing design are unnecessary. Therefore, the influence of physical interconnection delay need not be considered in the circuit design.

In addition, the area for interconnections in the chip is localized. Therefore, for high-speed applications, we can design the PLD so that it avoids the reflections, cross talks and parasitic effects. That is, this PLD can be used for high-speed applications. This is quite different from FPGAs, where a high-speed operation is difficult when the logic circuit is complex.

A second structure of the present invention provides a programmable logic device comprising:

memories for logic arranged in a circular shape to store LUTs of logic functions;

plural external input lines for input variables connecting to said memories for logic;

one or more memories for interconnection which store(s) information for connection how to select either output lines of said memory for logic of the preceding stage or said external input lines connecting to each input line of said memory for logic of the succeeding stage; and one or more reconfigurable interconnection circuits which connect(s) the output lines of said memory for logic of the preceding stage or the external input lines with the input lines of said memory for logic of the succeeding stage according to the output of said memory for interconnection.

By connecting the memory for logic in a circular way, we can realize multiple-output logic function by a programmable logic element for an LUT ring, the detail will be described in later. (Refer Example 3 of Embodiment 11)

By adding the latches that store the address of the memory for logic, as will be described later, by synchronizing with the clock pulse, and by connecting the memories for logic in a circular way, we can simulate the LUT cascade of an arbitrary number of levels. In this case, the efficiency of memory usage for logic can be improved.

In the PLD in this invention, memories for logic are arranged in a circular shape, which is quite different from FPGA. Therefore, the interconnection circuits have only to connect either the output lines of one memory for logic or the external input line to an input line of a one memory for logic.

Therefore, similar to the first structure, the interconnection circuit of the PLD is very simple compared with that of FPGAs, and the area for interconnections can be reduced. Moreover, the physical design is unnecessary because only the connections between adjacent cells must be considered. Therefore, during the logic design, we need not consider the influence of a physical interconnection delay.

A third structure of the present invention provides the programmable logic device according to the first or second structure comprising external output lines which send out the result of logic operation to the external circuit; and wherein said memory for interconnection stores information for connection how to select output lines of said memory for logic of the preceding stage that connect to said external output lines;

said interconnection circuit connects the output lines of said memory for logic of the preceding stage with said external output lines according to the output of said memory for interconnection.

With this structure, we can take out the output signals from an arbitrary stage of the series connected memories for logic. Thus, when the required number of stage of the cascade is smaller than the number of stages in the PLD, we can make the circuit faster by taking the signals from the middle of the stages.

Moreover, when we realize a multiple-output logic function, for the output functions that are completed in the middle of the cascade, we can take out the output signals without propagating the succeeding stage of memories. With this, we can reduce the number of inputs of LUTs of the succeeding stages. Moreover, we can make the circuit faster by producing the output signals that are completed in the middle of cascade. Furthermore, we can reduce the amount of memory in the LUTs of the succeeding stages, since the number of inputs to the LUTs is reduced.

A fourth structure of the present invention provides the programmable logic device according to any of the first to third structures comprising means to store the designator for block which stores the variable for designating block to specify the block in the memory for logic; and wherein said interconnection circuit connects the output lines of said memory for logic of the preceding stage, the external input lines, and the output lines of means to store the designator for block with the input lines of said memory for logic of the succeeding stage, according to the output of said means to store the designator for block, so that input variables from outputs of said memory for logic of the preceding stage and said external input lines, are sent to the memory area of said memory for logic of the succeeding stage which is specified by variable for designating block, or so that input variables from output of the memory block of said memory for logic of the preceding stage which is specified by variable for designating block and said external input lines, are sent to said memory for logic of the succeeding stage.

In this structure, the whole memory is partitioned into blocks (such as page), and each block store one or more LUTs. The means to store the designator for block stores the values that specify the memory area, where the logic function of LUT is stored. The memory for interconnections stores the information for connection so that the output lines of the means to store the designator for block are connected to the input lines of the memory for logic of the succeeding stage.

To read the LUT containing desired logic function, first read the variable for designating block from the means to store the designator for block corresponding to the logic function; read the connection information from the memory for interconnections; and switch the interconnection circuit to read the desired data. Then, read the LUT corresponding to the memory area specified by the variable for designating block. As a result, we can select one function out of many functions.

A fifth structure of the present invention provides the programmable logic device according to any of the first to fourth structures comprising:

an intermediate variable register which stores outputs of said memories for logic and sends them to the inputs to succeeding said memory for logic activated by the external data strobe signal.

As a result, the outputs of the memory for logic in each stage are temporarily stored in the intermediate variable register. Therefore, the flow of the operation data is temporarily blocked by the intermediate variable register. That is, the operation is done in the LUT step by step, synchronized with the data strobe signal. Therefore, the operation of LUTs of the each logic function can be synchronized to an external circuit, when the data strobe signal is synchronized with the clock of an external circuit.

Moreover, the operation is done in step-by-step in each memory for logic. Therefore, multiple jobs can be processed in pipeline operation.

When the memory for logic is connected in a circular way, we can increase the degree of freedom on the number of input variables. That is, when the number of input variables of the objective logic function is larger than the sum of the numbers of input lines of memory for function; by using clock pulse, we can use the LUT ring more than once to realize an LUT cascade with more cells. And, we can do the logic operation sequentially by changing the active area of the memory. Therefore, we can change the number of levels of cascade according to the objective logic function or the amount of available memory. In this way, we can increase the degree of freedom for design.

Furthermore, when the memory for logic is connected in a circular way, we can increase the number of levels of LUT cascade using clock pulse. With this, we can reduce the size of each LUT. This enables us to use smaller memories for logic in each stage. And, the power consumption of the each logic for memory can be reduced. Also, only a part of the memories performs read operation at a time, and only such memories dissipate substantial power. Therefore, this PLD dissipates lower power than MPU and an FPGA. Moreover, since the memories that are not performing read operation can be set to the low power mode (sleep mode), further reduction of power consumption is possible.

Here, the clock pulse can be used as a data strobe signal.

A sixth structure of the present invention provides the programmable logic device according to any of the first to fifth structures comprising:

bypass lines to connect inputs with outputs of said intermediate variable register; and bypass selection circuits that select either the output lines of said intermediate variable register or said bypass lines, and produce the signal of the selected lines.

If all the bypass selection circuits select the output lines of the intermediate variable register, then a synchronous operation using the data strobe signal can be done. On the other hand, if the bypass selection circuits select the bypass lines, then the outputs of the memory for logic of the preceding stage are sent to the memory for logic in the succeeding stage directly without latched by the intermediate variable register. In this case, the LUT cascade computes the objective logic function in a high speed asynchronous mode.

A seventh structure of the present invention provides the programmable logic device according to the fifth or sixth structure comprising: means to designate the memory for logic which specifies the index of said memory for logic to perform the operation by counting the number of said data strobe signals.

Thus, by using the means to designate the memory for logic, we can specify the position of the memory for logic where the job exists. Here, "job" is a work that generates the data by executing the operation to the input variables by each LUT in the LUT cascade.

A eighth structure of the present invention provides the programmable logic device according to any of the fifth to seventh structures comprising: means for power control that set said memories for logic performing the operations to the normal mode and other memories for logic to the low power mode.

In this structure, the operation in the memory for logic is executed one-by-one, synchronized with the data strobe signal; and temporarily stopped by the intermediate variable register. In this case, the means for power control makes the memories for logic that are not performing operation into low power state (sleep state), and the memories for logic that are performing operation into the normal state (wake-up state). In this way, we can reduce the power consumption of the PLD.

A ninth structure of the present invention provides the programmable logic device according to any of the first to eighth structures wherein the input lines of part of said memory for logic are directly connected to said external input lines without passing through said interconnection circuit.

For the first stage of the memory for logic, external input variables are connected to the all inputs of the memory for logic. On the other hand, for other stages of the memory for logic, both output signals of the preceding stage and external input variables are connected to the inputs of the memory for logic.

In many of practical LUT cascades, at least one external input variable is connected to the input of each memory for logic. Thus, we can implement a general-purpose PLD, where in the memory for logic other than the first stage, at least one external input variable is directly connected to the input of the memory for logic, without passing the interconnection circuit. With this design, the number of input lines of the interconnection circuit can be decreased. Moreover, we can reduce the size of the circuit further, because we can reduce the interconnection circuit and the number of wiring in the memory for interconnections.

A tenth structure of the present invention provides the programmable logic device according to any of the first to ninth structures wherein the output lines of part of said memory for logic are directly connected to the input line of part of the memory for logic in the succeeding stage, without passing through said interconnection circuit.

To the input lines of each memory for logic other than the first stage, output lines of the memory for logic in the preceding stage are connected in part, and external input variables are connected in part.

In many of practical LUT cascades, to at least one input line of the memory for logic, the output of the memory for logic in the preceding stage is connected. Thus, we can implement a general-purpose PLD, where in the memory for logic other than the first stage, at least one of the outputs of the memory for logic in the preceding stage is directly connected to the input of the memory for logic of the succeeding stage without passing through the interconnection circuit. With this design, the number of input lines of the interconnection circuit can be reduced. Moreover, we can reduce the size of the circuit further, because we can reduce the interconnection circuit and the number of wiring in the memory for interconnections.

An eleventh structure of the present invention provides the programmable logic device according to any of the first to tenth structures wherein
said interconnection circuit comprises selectors; and
each said selector selects
either an output line of said memory for logic in the preceding stage or an external input line, or
either an output line of said memory for logic in the preceding stage, said external input line, or an output line of the mean to store the designator for block, and
connects to the input line of memory for logic in the succeeding stage, according to the output values of said memory for interconnection.

A twelfth structure of the present invention provides the programmable logic device according to any of the first to eleventh structures wherein
said interconnection circuit comprises a shifter where output lines of said memory for logic in the preceding stage are shifted to connect to the input line of said memory for logic in the succeeding stage, according to the output values of said memory for interconnection.

A thirteenth structure of the present invention provides the programmable logic device according to any of the first to twelfth structures wherein
said interconnection circuit comprises multiplexers; and
said each multiplexer selects one line out of the plural output lines of said memory for logic in the preceding stage and the plural external input lines, and connects it to an input line of said memory for logic in the succeeding stage, according to the output values of said memory for interconnection.

BRIEF DESCRIPTION OF THE DRAWINGS

FIG. 14 is a truth table of subfunctions that are derived by decomposing the eight-bit adder into four;

FIG. 15 shows truth values stored to the 0-th page of memory for logic 4-0 in example 1;

FIG. 16 is a truth value stored to the 0-th page of memory for logic (4-1)-(4-3) in example 1;

FIG. 34 is a truth table for decomposition function $f_i$;

FIG. 35 shows truth values stored in the first page of memory for logic 4-0;

FIG. 36 is the truth table stored in the 0-th page of memory for logic (4-0)-(4-3);

FIGS. 46(*a*) and 46(*b*) are views explaining the concept of the memory packing;

BEST MODE FOR CARRYING OUT THE INVENTION

I. Definition

Figure 1:
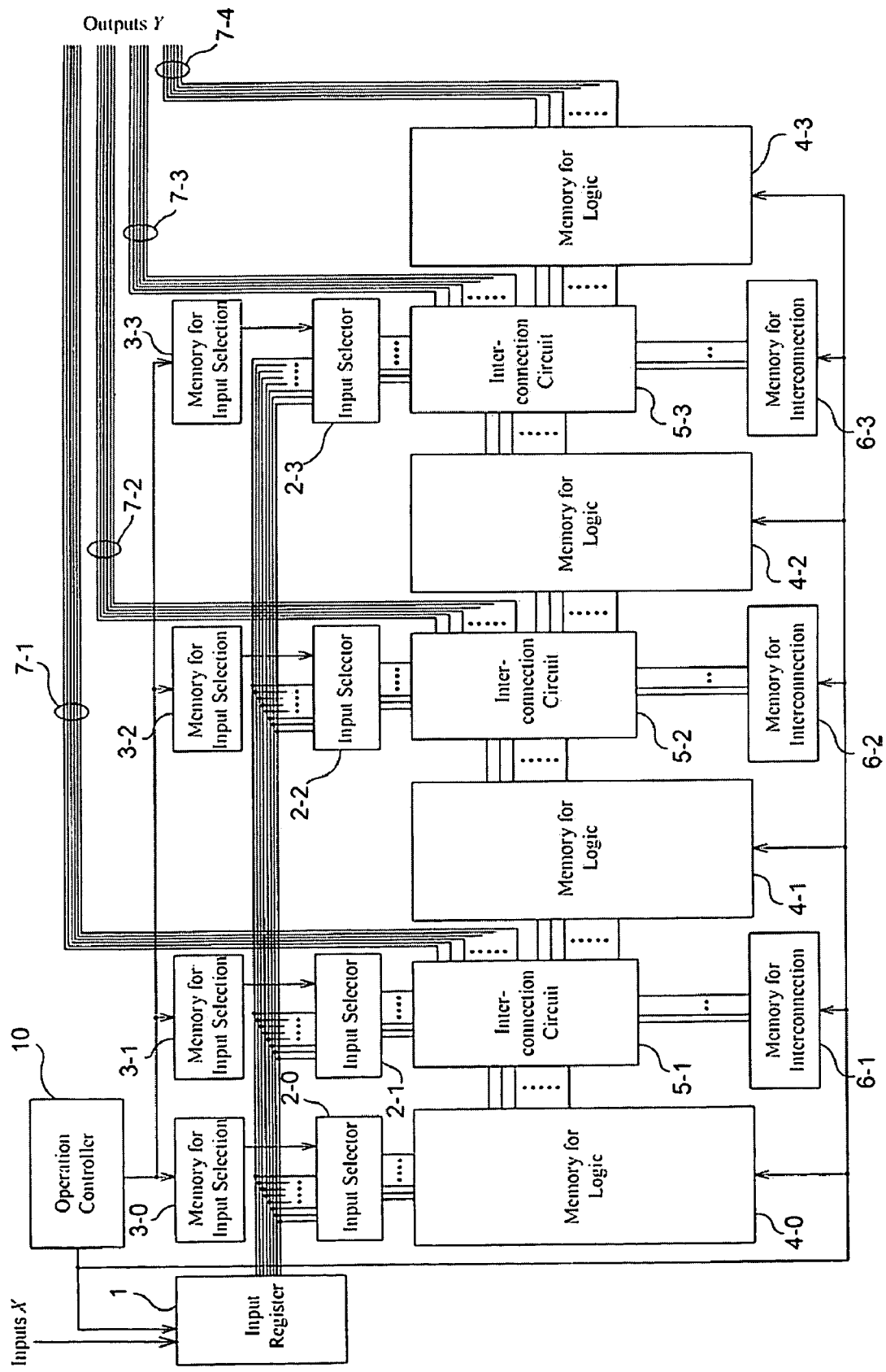
FIG. 1 is a simplified block diagram of the PLD in accordance with EMBODIMENT 1 of the present invention.

The symbols and the terminology used in this patent are defined as follows:

(Definition 1) The symbols "{ }" denote an unordered set. The symbols "( )" denote an ordered set. For a set of variables $\{x_1, x_2, \ldots, x_n\}$, when the order of the elements is important, the set is denoted by $(x_1, x_2, \ldots, x_n)=X$. On the other hand, when the order is not important, it is denoted by $\{x_1, x_2, \ldots, x_n\}=\{X\}$. The number of variables in X is denoted by $|X|$.

(Definition 2) The logic function for which we realize a LUT cascade by a PLD is the "objective logic function," and it is denoted by f. The set of the input variables of the objective logic function is denoted by $X=(x_1, x_2, \ldots, x_n)$, where n is a natural number.

(Definition 3) Let the objective logic function $f(X)$ be represented by a composite logic function: $f(X)=f_{s-1}(X_{s-1}, f_{s-2}(X_{s-2}, f_{s-3}(\ldots f_1(X_1, f_0(X_0))\ldots)))$, where $\{X_i\} \subseteq \{X\}$ and $\{X\}=\{X_0\} \cup \{X_1\} \cup \ldots \cup \{X_{s-1}\}$. "Functional decomposition" is to decompose the objective logic function $f(X)$ to the ordered set of subfunctions $(f_0, f_1, \ldots, f_{s-1})$. Each function $f_i$ is called "decomposition function," where $i \in \{0, 1, 2, \ldots, s-1\}$.

(Definition 4) "Multiple-output logic function" is a logic function whose number of outputs is two or more.

In the following, the best modes of the implementation of the invention are described referring to the drawings.

II. Embodiment 1

The simplified block diagram of the PLD in accordance with EMBODIMENT 1 of the present invention is illustrated in FIG. 1.

The PLD for EMBODIMENT 1 of the present invention consist of an input variable register (1); input selectors (2-0)-(2-3); memories for input selection (3-0)-(3-3); memories for logic (4-0)-(4-3); interconnection circuits (5-1)-(5-3); memories for interconnections (6-1)-(6-3); and an operation control part (10).

The input variable register (1) stores the inputs $X=(x_1, \ldots, x_n)$: where X has n variables, and is used for the operation of objective logic function $f(X)$, where n is a natural number. Input variables X are sent through the external input lines to the input variable register (1). Memories for logic (4-0)-(4-3) store the truth tables of decomposition functions $\{f_i; i\in\{0, 1, 2, 3\}\}$: where they are obtained by decomposing the objective logic function f, and are stored as LUTs. In this embodiment, the number of stages of the memories for logic (4-$i$) ($i\in\{0, 1, 2, 3\}$) is four, however the number of stages of the memories can be, in general, arbitrarily number. These memories for logic (4-0)-(4-3) are connected in series by the interconnection circuits (5-1)-(5-3).

Input selectors (2-0)-(2-3) select inputs $X_i$ (i∈{0, 1, 2, 3}) from n input variables $X=(x_1, \ldots, x_n)$ stored in the input variable register 1: where $X_i$ are used for the truth tables of decomposition functions {$f_i$; i∈{0, 1, 2, 3}} stored in memories for logic (4-0)-(4-3); and send the inputs $X_i$ either to the memories for logic (4-0)-(4-3), or to the interconnection circuits (5-1)-(5-3). The memories for input selection (3-0)-(3-3) store the information to select input variables for the input selectors (2-0)-(2-3): where this information is stored as LUTs. Hereafter, this information is referred to as "information for input selection." Input selectors (2-0)-(2-3) select the input variables using the input selection signal produced by memories for input selection (3-0)-(3-3).

Each interconnection circuit (5-i) (i∈{1, 2, 3}) selects signals from the intermediate variables $Y_i$ and the input variables $X_i$, that are produced by the memory for logic (4-(i−1)) and the input selector (2-i), respectively; and reorder them appropriately. Then the interconnection circuit (5-i) sends the reordered variables to the memory for logic (4-i) of the succeeding stage or to the external output line (7-i). Each memory for connection (6-i) stores the "connection information" of each connection circuit (5-i). The connection circuit (5-i) implements the connection according to the information stored in the memory for interconnections (6-i).

The operation control part (10) controls the operation of the whole PLD.

Figure 2:
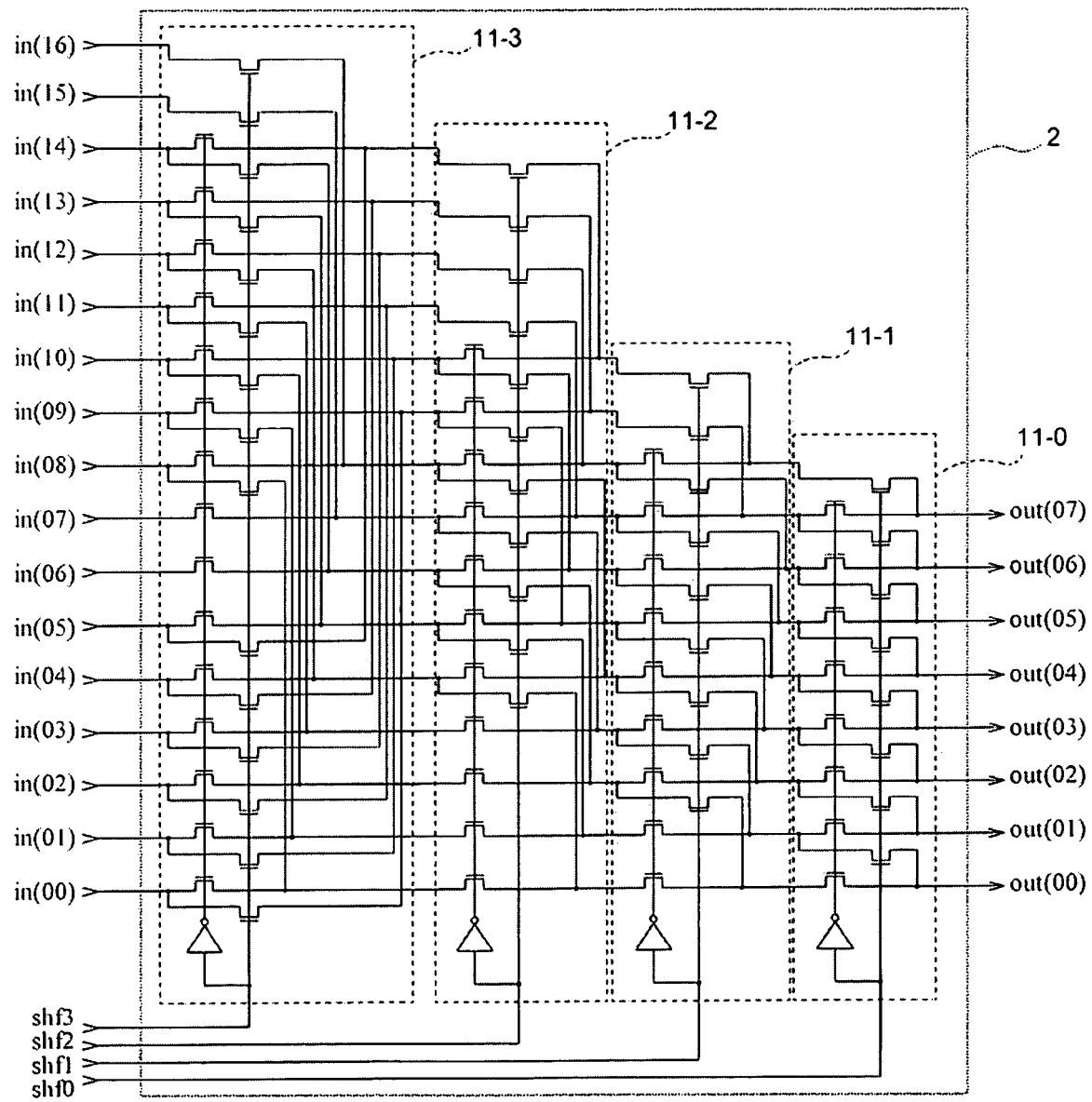
FIG. 2 is a schematic diagram of the input selector in FIG. 1.

FIG. 2 shows a schematic diagram of the input selector (2-i) (i∈{0, 1, 2, 3}) in FIG. 1. Hereafter, when (2-0)-(2-3) are treated together, we denote them as (2). This diagram is simplified to show the principle of operation and details are omitted.

The input selector (2-i) (i∈{0, 1, 2, 3}) of this embodiment consists of the shifter illustrated in FIG. 2. It shows an example of a 17-input 8-output input selector; however, the numbers of I/O can be different values.

In the input selector (2-i) (i∈{0, 1, 2, 3}), the input terminals (in(00)-in(16)) are connected with the output terminal of input variable register (1). Therefore, input variables $X=(x_1, \ldots, x_n)$ are supplied from in(00)-in(16). Moreover, output terminals (out(00)-out(07)) of the input selector (2-0) is connected to the inputs of the memory for logic (4-0). The output terminals (out(00)-out(07)) of input selector (2-i) (i∈{1, 2, 3}) are connected to a part of input terminals of the interconnection circuit (5-i).

In the input selector (2-i) (i∈{0, 1, 2, 3}), a 8-bit shifter (11-3), a 4-bit shifter (11-2), a 2-bit shifter (11-1), and a 1-bit shifter (11-0) are connected in series from the input to the output. With this, the input selector (2-i) (i∈{0, 1, 2, 3}) can shift the data in(00)-in(16) by 0 through 15 bits; and send the consecutive 8-bit data to the output terminals out(00)-out(07).

To each shifter (11-0)-(11-3), control lines (shf0-shf3) of 1-bit are connected. When the control line (shf j) (j∈{0, 1, 2, 3}) is '0', the shifter (11-i) does not shift the connection, while when the control line (shf j) (j∈{0, 1, 2, 3}) is '1', the shifter (11-i) do the shift operation. In an input selector (2-i) (i∈{0, 1, 2, 3}), each control line (shf0-shf3) is connected to the output of a memory for input selection (3-i). Therefore, the 4-bit signals produced by the memory for input selection (3-0), that is, information for input selection, are directly connected to the control lines (shf0-shf3) as the selection control signals, to specify the amount of shift in the input selector (2-i).

In FIG. 2, the amplitude of the signal of input variable X decays by each passing transistor in shifter (11-0)-(11-3). Therefore, in practice, we have to insert amplifier (buffer) every several stages of the shifter to compensate the decay of the signal of input variable X. However, we omitted them in the figure for simplicity.

Figure 7:
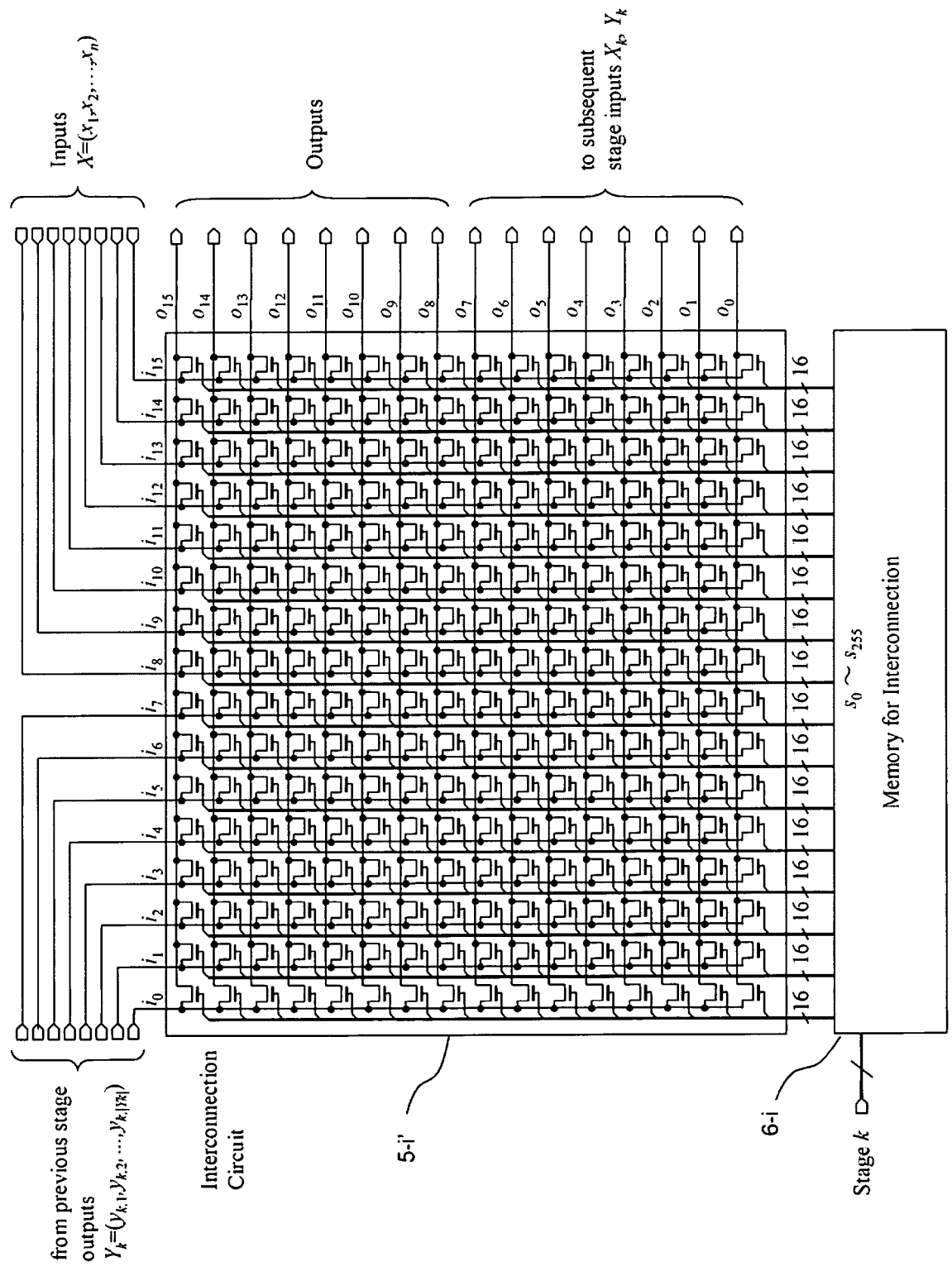
FIG. 7 is a block diagram when the crossbar switches are used for the interconnection circuit in FIG. 1.
Figure 8:
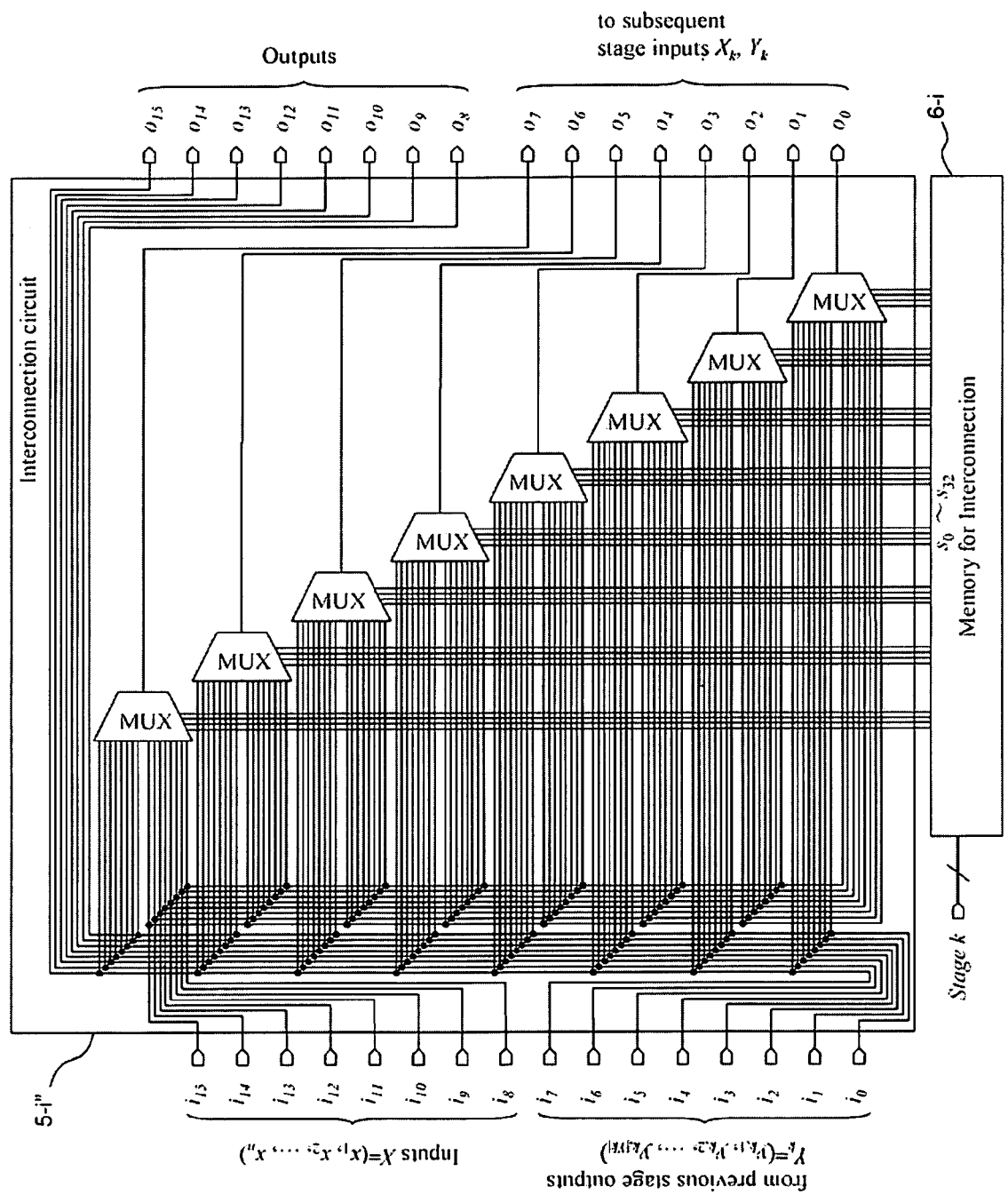
FIG. 8 is a block diagram when the multiplexer array is used for the interconnection circuit in FIG. 1.

When the outputs of a multiple-output function is partitioned into sets, and each set of outputs is realized independently, we may not use the shifter (2-i) (i∈{0, 1, 2, 3}). In such a case, we may use crossbar switch such as shown in FIG. 7, or multiplexer array such as shown in FIG. 8 (details will be explained later).

Figure 3:
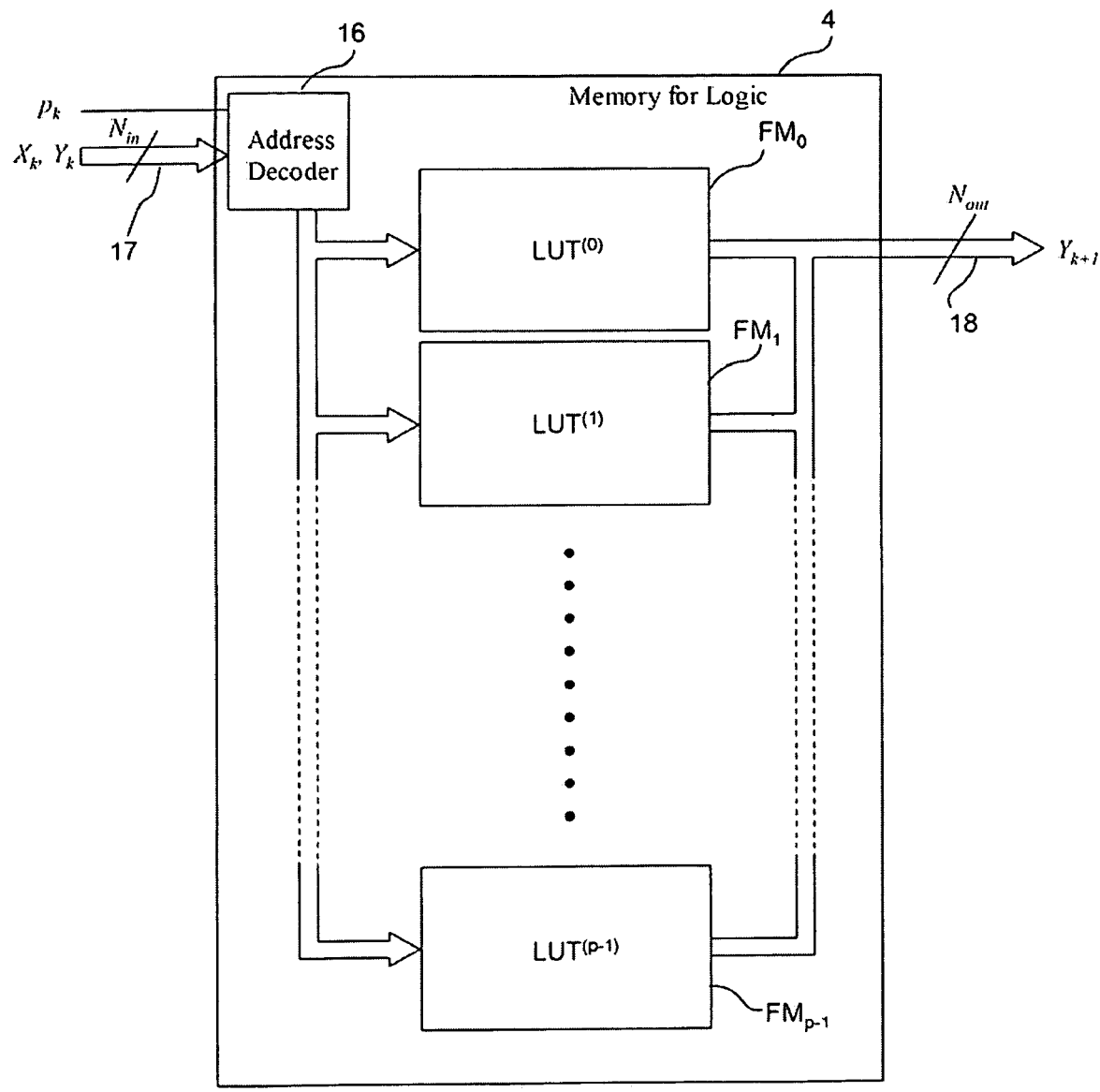
FIG. 3 is a block diagram of the memory for logic in FIG. 1.

FIG. 3 shows a block diagram of the memory for logic (4-i) (i∈{0, 1, 2, 3}) in FIG. 1. Hereafter, when plural indices (4-0)-(4-3) are treated together, we denote them by index (4).

The memory for logic (4) has p blocks of memory area ($FM_0$-$FM_{p-1}$). Thereafter, we call each memory area a "page". Truth tables of decomposition functions ($f_i^{(j)}$, i∈{0, 1, 2, 3}, j∈{0, ..., p−1}) are stored in these memory areas as LUT (denoted by $LUI^{(j)}$ in FIG. 3). Hereafter, the memory area where $LUT^{(j)}$ is stored is denoted by $FM_j$.

The subscript "(j)" (j∈{0, ..., p−1}) denotes the j-th objective logic functions $f^{(j)}$. In the PLD in this embodiment, decomposition functions {$f_i^{(j)}$} for the objective logic functions $f^{(j)}$ are stored in the j-th page of the memory for logic (4). And, according to the target, the page is switched to realize desired objective logic function.

The memory for logic (4-i) (i∈{0, 1, 2, 3}) has an address decoder (16). The address decoder (16) selects the memory area $FM_r$, using the page selection number $p_r$ that comes from the operation control part (10). Moreover, the address decoder (16) selects the address to read the content of the memory in memory area $FM_r$, based on the variable ($X_r$, $Y_r$) (r∈{0, 1, 2, 3}, where, $Y_r = \phi$ at r=0): these variables come from the interconnection circuit (2) through the input line (17) of the $N_{in}$ bit. The truth value $f_r^{(j)}$ ($X_r$, $Y_r$) of the decomposition function $f_r^{(j)}$ is stored in the memory cell of this selected address. Memory area $FM_r$, sends the data stored in the memory cell specified by address decoder (16) to the lines (18) as the intermediate variable $Y_{r+1} = (y_{r+1, 1}, \ldots, y_{r+1, |Y_{r+1}|})$.

Figure 4:
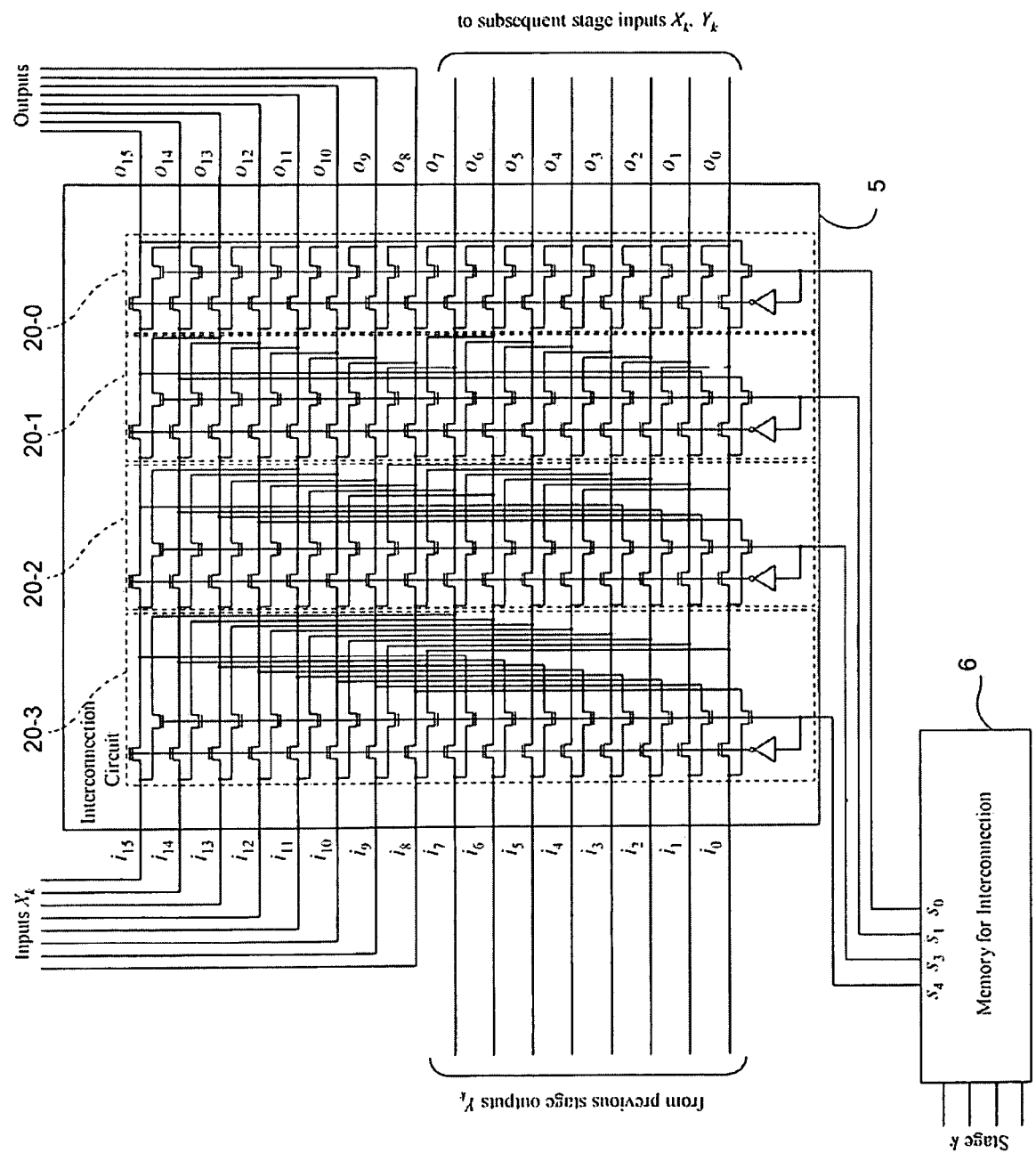
FIG. 4 is a schematic diagram of the peripheral of the interconnection circuit in FIG. 1.

FIG. 4 shows a schematic diagram of the interconnection circuit (5-i) (i∈{1, 2, 3}) in FIG. 1. Hereafter, when (5-1)-(5-3) are treated together, we denote by (5). To explain the principle of the operation, this diagram is simplified and the details are omitted.

The interconnection circuit (5) in this embodiment consists of a cyclic shifter that shifts the input signals from the input lines ($i_0$-$i_{15}$) by an arbitrary number of bits, to send the signals to the shifter output lines ($o_1$-$o_{15}$). In FIG. 4, for a convenience and an example of the explanation, the interconnection circuit has 16 inputs, and 16 outputs; however, the number of bits of I/O need not be limited to these numbers.

The interconnection circuit (5) consists of a series connected shifters: an 8-bit shifter (20-3), a 4-bit shifter (20-2), a 2-bit shifter (20-1), and a 1-bit shifter (20-0) are connected from the input lines ($i_0$-$i_{15}$) to the output lines ($o_0$-$o_{15}$). Each shifter (20-i) (i∈{0, 1, 2, 3}) is controlled by the control lines ($s_j$, j∈{0, 1, 2, 3}) connected with the memory for interconnections (6). (When (6-1)-(6-3) are treated together, we denote them by (6). Hereafter, we will use similar notation.)

In the connection circuit (5-r) (r∈{1, 2, 3}), the input lines ($i_0$-$i_7$) are connected to the outputs of the memory for logic (4-(r−1)) in the preceding stage, and the input lines ($i_8$-$i_{15}$) are connected to the outputs of the input selector (2-r). The output lines ($o_0$-$o_7$) are connected to the inputs of the memory for logic in the succeeding stage (4-r), and the output lines ($o_8$-$o_{15}$) are connected to the external output lines (7-r).

When each shifter (20-0)-(20-3) does not shift, input lines ($i_0$-$i_{15}$) are connected to the output lines ($o_0$-$o_{15}$). As a result, the intermediate variables $Y_r$ that are outputs of memory for logic ($4$-($r$−$1$)) in the preceding stage, are connected to the inputs of the memory for logic of succeeding stage ($4$-$r$).

On the other hand, when only the shifter ($20$-$3$) shift the data by eight bits, the input lines ($i_0$-$i_7$) are connected to the output lines ($o_8$-$o_{15}$); and the input lines ($i_8$-$i_{15}$) are connected to the output lines ($o_0$-$o_7$). As a result, intermediate variables $Y_r$ that are the outputs of memory for logic ($4$-($r$−$1$)) in the preceding stage, are sent to the external output lines ($7$-$r$). Also, all the input variable $X_r$, that comes from the input selector ($2$-$r$), are sent to the inputs of the memory for logic of succeeding stage ($4$-$r$).

Moreover, when only j bit ($1 \leq j \leq 7$) is shifted by the shifters ($20$-$0$)-($20$-$2$), the input lines ($i_{15-j+1}$-$i_{15}$) and ($i_0$-$i_{j-1}$) are connected to the output lines ($o_8$-$o_{15}$); and the input lines ($i_j$-$i_{7+j}$) are connected to the output lines ($o_0$-$o_7$). As a result, the j input variables $X_r$ that are sent to the input lines ($i_8$-$i_{7+j}$), are connected to the memory for logic of succeeding stage ($4$-$r$); simultaneously, ($8$-$j$) intermediate variables that are sent to the input lines ($i_j$-$i_7$) are also connected to the memory for logic of succeeding stage ($4$-$r$). Therefore, we can change the numbers of input variables $|X_r|=n_r$ of $X_r$, and the number of intermediate variables $|Y_r|=u_r$ of $Y_r$, that are connected to the memory for logic of the succeeding stage ($4$-$r$), under the condition of $k=n_r+u_r=8$.

Figure 5:
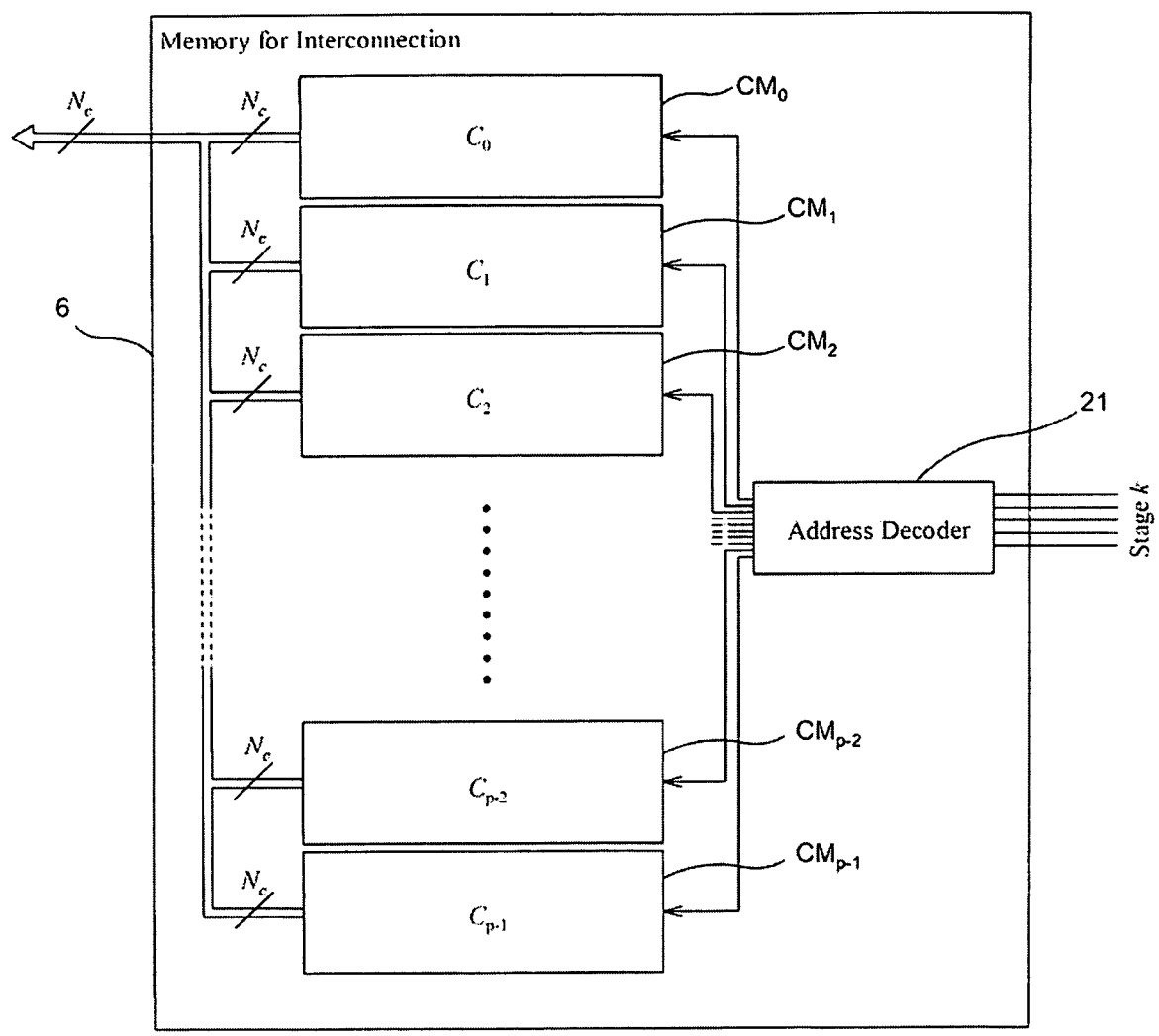
FIG. 5 is a block diagram of the memory for interconnections in FIG. 1.

FIG. 5 is a block diagram of the memory for interconnections ($6$) in FIG. 1. The memory for interconnections ($6$-$i$) ($i \in \{1, 2, 3\}$) has p blocks of memory area ($CM_0$-$CM_{p-1}$). The memory area ($CM_0$-$CM_{p-1}$) stores the information for connection ($s_{Nc-1}^{(j)}, \ldots, s_0^{(j)}$) ($j \in \{0, \ldots, p-1\}$): the shift information of shifters ($20$-($N_c$−$1$))-($20$-$0$) of interconnection circuit ($5$-$i$). Here, $N_c$ shows the number of stages of the shifter in the interconnection circuit ($5$-$i$), and $N_c=4$ in FIG. 4. The subscript "(j)" ($j \in \{0, \ldots, p-1\}$) denotes the information for connection corresponding to the j-th objective logic function $f^{(j)}$.

The $N_c$ bit output lines ($s_0$-$s_{Nc-1}$) of these memory areas ($CM_0$-$CM_{p-1}$) are control lines of shifters ($20$-$0$)-($20$-($N_c$−$1$)) of the interconnection circuit ($5$-$i$).

Moreover, each memory for interconnections ($6$) has an address decoder ($21$). The address decoder ($21$) selects the r-th memory areas $CM_r$ according to the page selection number $p_r$ produced by the operation control part ($10$). The memory area $CM_r$ selected by address decoder ($21$) produces the connection control signals showing the information for connection ($s_{Nc-1}^{(r)}, \ldots, s_0^{(r)}$) of $N_c$ bit to the interconnection circuit ($5$).

Figure 6:
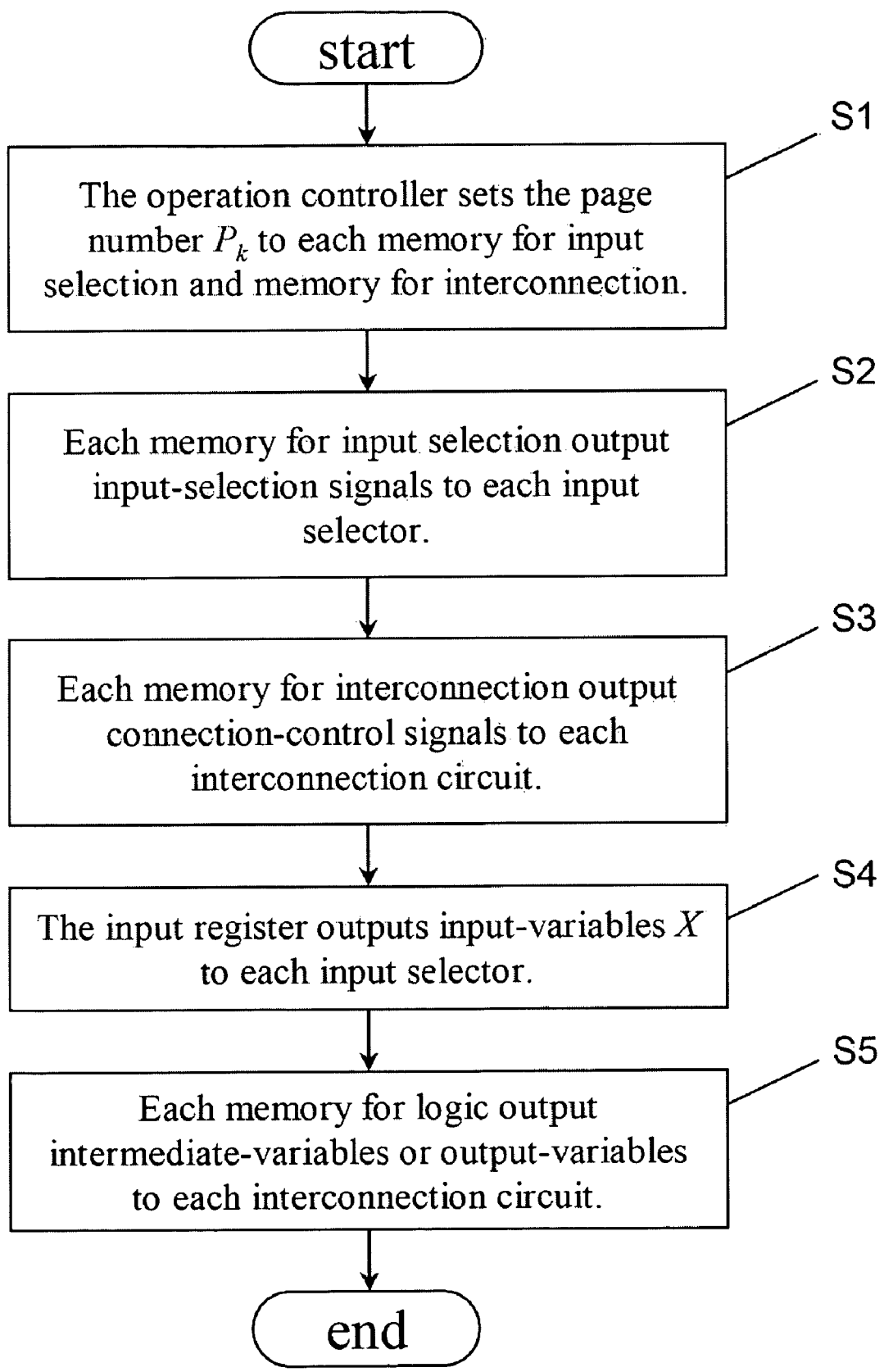
FIG. 6 is a flowchart showing the operation of the PLD in EMBODIMENT 1.

In the PLD in accordance with this EMBODIMENT as mentioned above, the operation is described as follows:

FIG. 6 is a flowchart of the operation of the PLD in EMBODIMENT 1.

First, write the decomposition function $\{f_0, \ldots, f_{s-1}\}$ ($2 \leq s \leq 4$) of the objective logic function $f(X)$ into the r-th page of the memories for logic ($4$-$0$)-($4$-$3$). Here, r denotes the page number. Moreover, write the information for input selection and the information for connection corresponding to above-mentioned decomposition function $\{f_0, f_1, \ldots, f_{s-1}\}$ in the r-th page of the memories for input selection ($3$-$0$)-($3$-$3$) and the memories for interconnections ($6$-$1$)-($6$-$3$). To write the information into the memory, we use an ordinary method; although such circuit is not shown in FIG. 1. In the following, we assume that s=4 in the example.

In the condition that the above-mentioned information is written in the memories, first, the operation control part ($10$) set up the page selection number $p_r$ to the memories for input selection ($3$-$0$)-($3$-$3$), and the memories for interconnections ($6$-$1$)-($6$-$3$) (S1).

As a result, memories for input selection ($3$-$0$)-($3$-$3$) produce the information for input selection written in the r-th page to control the lines (shf0-shf3) of the input selectors ($2$-$0$)-($2$-$3$) (S2). Moreover, memories for interconnections ($6$-$1$)-($6$-$3$) produce information for connection ($s_3^{(r)}, \ldots, s_0^{(r)}$) written in the r-th page to the control lines of the interconnection circuits ($5$-$1$)-($5$-$3$) (S3).

According to the information for input selection in the input to control lines (shf0-shf3), input selectors ($2$-$0$)-($2$-$3$) connect a part of input terminals (in($00$)-in($16$)) to the output terminals (out($00$)-out($07$)) electrically. The interconnection circuits ($5$-$1$)-($5$-$3$) connect input lines ($i_8$-$i_{15}$) with the output lines ($00$-$07$) according to the information for connection ($s_3^{(r)}, \ldots, s_0^{(r)}$) produced by the control lines.

Next, the operation control part ($10$) produces the input variable X in the input variable register ($1$) (S4). As a result, input variable $X_0$, $X_1$, $X_2$, and $X_3$ are sent to the memory for logic ($4$-$0$) and the interconnection circuits ($5$-$1$)-($5$-$3$), respectively.

Thus, the memory for logic ($4$-$0$) first produces the truth values $f_0(X_0)$ of decomposition function $f_0$ of the input variable $X_0$ as the intermediate variable $Y_1$. These intermediate variables $Y_1$ are transmitted to the input of the memory for logic ($4$-$1$) through the interconnection circuit ($5$-$1$). Moreover, a part of intermediate variable $Y_1$ is transmitted to the external output lines ($7$-$1$) in some cases.

To the memory for logic ($4$-$1$), the following two kinds of signals are transmitted: the intermediate variables $Y_1$ produced by the memory for logic ($4$-$0$); and the input variables $X_1$ transmitted from the input variable register ($1$) through the input selector ($2$-$1$) and the interconnection circuit ($5$-$1$). The memory for logic ($4$-$1$) produces the truth value $f_1(X_1, Y_1)$ of decomposition function $f_1$ as the intermediate variable $Y_2$, using the input variable $X_1$ and intermediate variable $Y_1$. This intermediate variable $Y_2$ is transmitted to the input of memory for logic ($4$-$2$) through the interconnection circuit ($5$-$2$). Moreover, in some cases, a part of the intermediate variable $Y_2$ is transmitted to the external output line ($7$-$2$).

To the memory for logic ($4$-$2$), the following two kinds of signals are transmitted: the intermediate variables $Y_2$ produced by the memory for logic ($4$-$1$); and the input variables $X_2$ transmitted from the input variable register ($1$) through input selector ($2$-$2$) and the interconnection circuit ($5$-$2$). The memory for logic ($4$-$2$) produces truth value $f_2(X_2, Y_2)$ of the decomposition function $f_2$ as the intermediate variable $Y_3$ based on the input variable $X_2$ and the intermediate variable $Y_2$. This intermediate variable $Y_3$ is transmitted to the input of memory for logic ($4$-$3$) through the interconnection circuit ($5$-$3$). Moreover, in some cases, a part of intermediate variable $Y_3$ is transmitted to the external output lines ($7$-$3$).

To the memory for logic ($4$-$3$), the following two kinds of signals are transmitted: the intermediate variables $Y_3$ produced by the memory for logic ($4$-$2$); and the input variables $X_3$ transmitted from the input variable register ($1$) through the input selector ($2$-$3$), and the interconnection circuit ($5$-$3$). The memory for logic ($4$-$3$) produces the truth values $f_3(X_3, Y_3)$ of decomposition function $f_3$ as the output variables f based on the input variable $X_3$ and the intermediate variable $Y_3$. This outputs f are transmitted to the external output lines ($7$-$4$) (S5). The above-mentioned process is done by the pipelining while transmitting from the preceding stage to the succeeding stage. And, the operation results of the objective logic function $f$ are taken from the external output lines ($7$-$1$)-($7$-$4$).

In this EMBODIMENT, we used the shifter shown in FIG. 4, as the interconnection circuits ($5$-$1$)-($5$-$3$); however, as the interconnection circuits, we can use crossbar switches shown in FIG. 7, or the multiplexer array shown in FIG. 8. In short, the interconnection circuit (5-$i$) should have the following property: Let $Y_{i-1}$ be the set of output lines of the memory for logic in the preceding stage, $X_i$ be the set of external input lines, and $Z_i$ be set of the input lines of the memory for logic of succeeding stage; then the interconnection circuit (5-$i$) should select $|Z_i|$ elements out of $Y_{i-1} \cup X_i$. Or, the interconnection circuit (5-$i$) should have the function that changes the order of the element of $Z_i$ if necessary according to the external instruction.

The interconnection circuit (5-$i'$) by the above-mentioned crossbar switch can make the operation faster, since we can reduce the number of stages of pass transistors; although the circuit will be larger with the increases of the control lines than the shifters.

Figure 9:
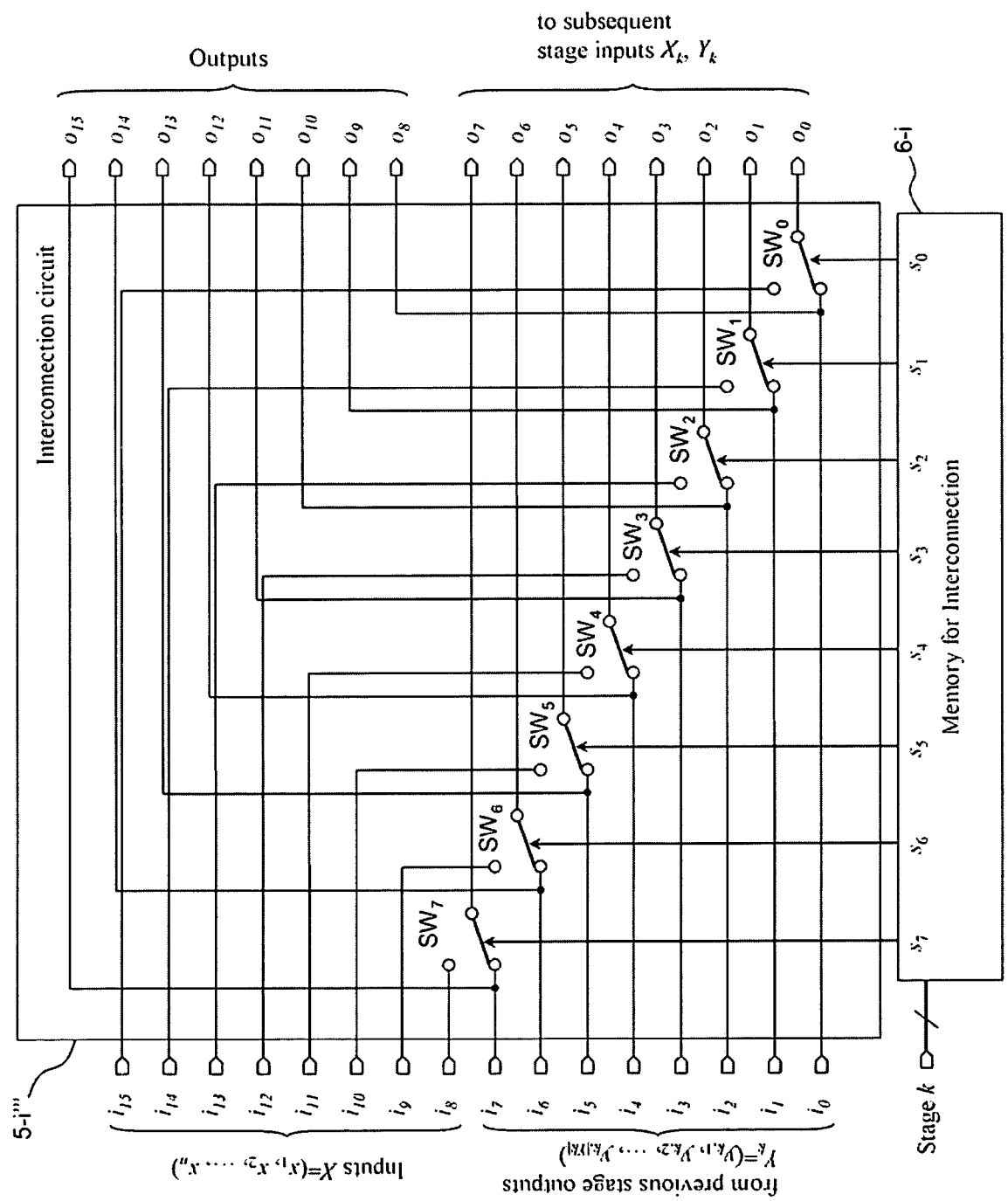
FIG. 9 is a block diagram when the selector array is used for the interconnection circuit in FIG. 1.

Moreover, when the permutation of the variables is not necessary instead of the interconnection circuits (5-1)-(5-3), we can use the interconnection circuit (5-$i'''$) by the selector array shown in FIG. 9. The interconnection circuit (5-$i'''$) by the selector array can be realized by a very simple circuit. The interconnection circuit (5-$i'''$) requires a small layout area, and therefore fast and dissipate low power.

In this embodiment, we showed an example, where the memories for logic (4-0)-(4-3) are operated in asynchronous mode. However, the memories for logic (4-0)-(4-3) can be synchronized by the clock.

Next, to show the concrete operation of the PLD of this embodiment, we will illustrate by using an example.

EXAMPLE 1

We will show the operation of the 8-bit adder of two binary numbers A=($a_7, a_6, a_5, a_4, a_3, a_2, a_1, a_0$) and B=($b_7, b_6, b_5, b_4, b_3, b_2, b_1, b_0$), in the above-mentioned PLD. We assume that the adder has $c_{in}$ as the carry input bit from the lower bit position. The operation executed by this adder is as follows:

$$\begin{array}{ccccccccc} & a_7 & a_6 & a_5 & a_4 & a_3 & a_2 & a_1 & a_0 \\ & b_7 & b_6 & b_5 & b_4 & b_3 & b_2 & b_1 & b_0 \\ +) & & & & & & & & c_{in} \\ \hline c_{out} & S_7 & S_6 & S_5 & S_4 & S_3 & S_2 & S_1 & S_0 \end{array} \quad (1)$$

Here, the carry input bit $c_{in}$ is the carry propagation from the adder of the lower rank when adders are connected in series to perform additions of more than 8 bits. The carry output bit $c_{out}$ is the carry propagation to the high-ranking adder.

Figure 10:
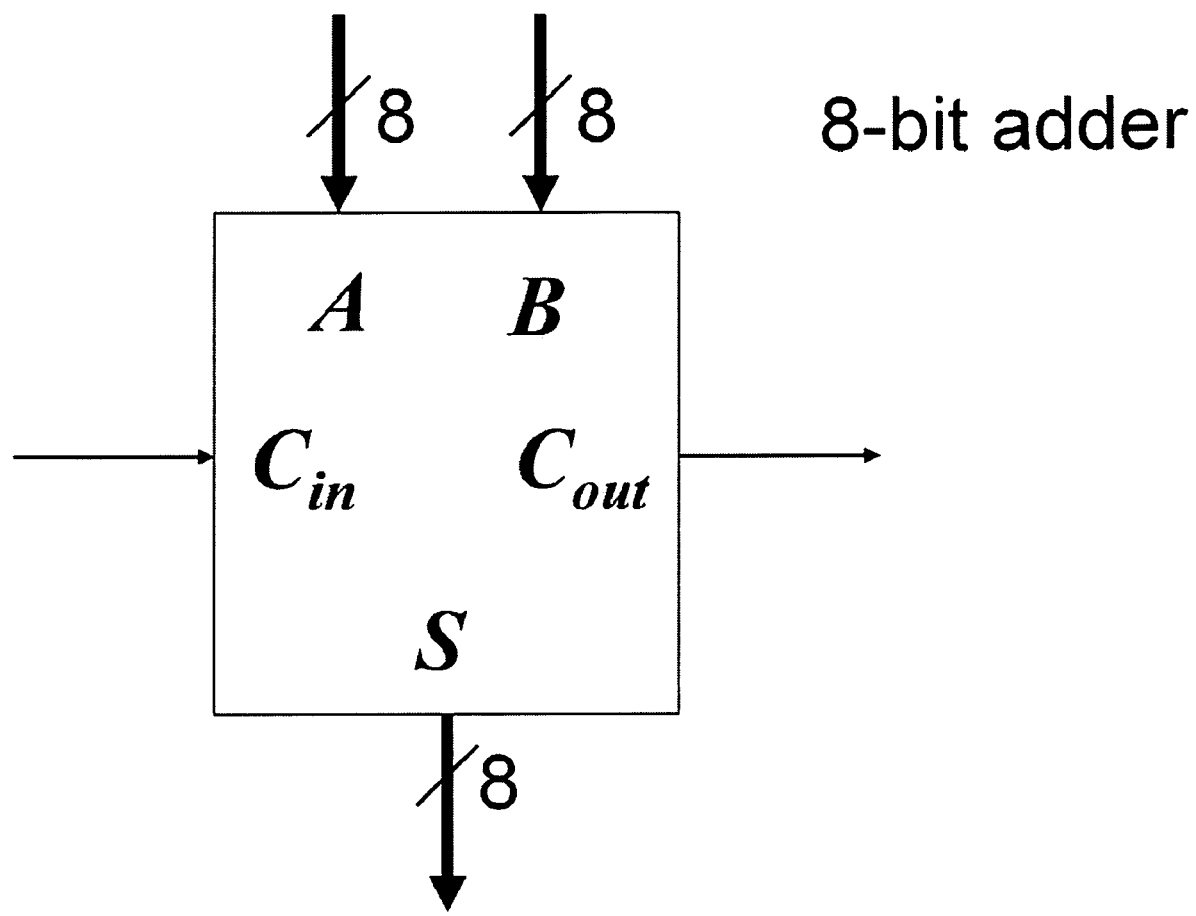
FIG. 10 illustrates the eight-bit adder.
Figure 11:
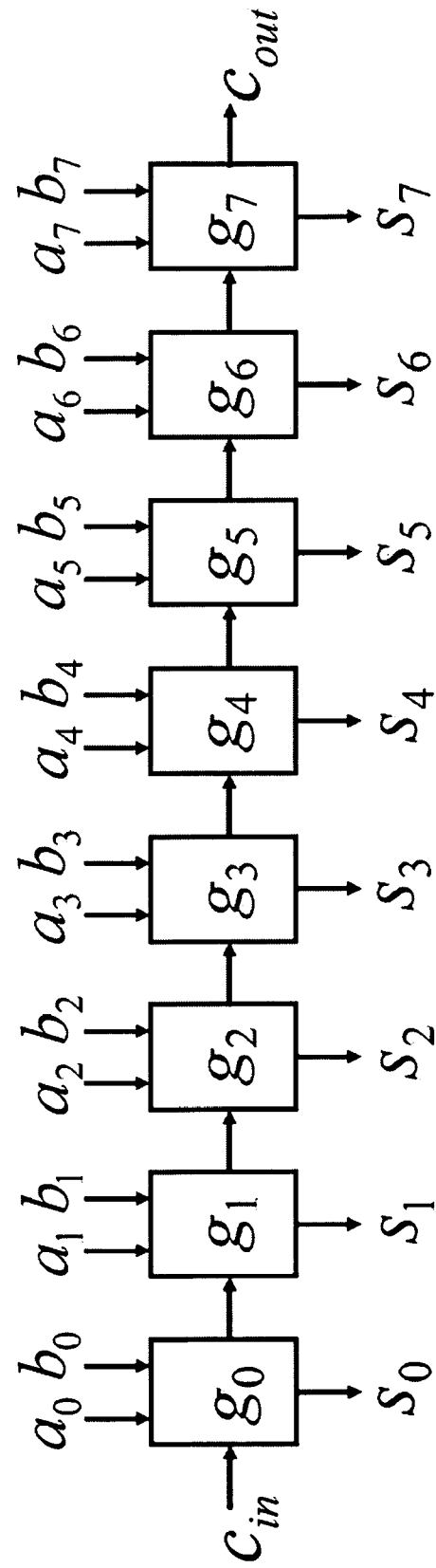
FIG. 11 illustrates the eight-bit adder that is decomposed into eight subfunctions.

Let the logic function that adds two binary numbers A and B of 8-bits be $f=f(X)$, where X=(A, B). Then the logic function $f$ is shown by FIG. 10. This function can be decomposed into eight functions $\{g_0, g_1, g_2, g_3, g_4, g_5, g_6, g_7\}$ as shown in FIG. 11. Here, each decomposition function can be represented by Eq. (2) or Eq. (3).

$$g_0 = [c_{out}^{(0)}, S_0] \quad (2)$$
$$= [a_0 b_0 \vee a_0 c_{in} \vee b_0 c_{in}, a_0 \oplus b_0 \oplus c_{in}]$$

$$g_i = [c_{out}^{(i)}, S_i] \quad (3)$$
$$= [a_i b_i \vee a_i c_{out}^{(i-1)} \vee b_i c_{out}^{(i-1)}, a_i \oplus b_i \oplus c_{out}^{(i-1)}]$$
$$(i = 1, 2, 3, 4, 5, 6, 7)$$

That is, one decomposition function realizes $S_i$: the modulo 2 sum of input variables $a_i$ and $b_i$, and the intermediate variable input $c_{out}(i-1)$ that represents the carry input; and the other decomposition function realizes carry intermediate variable $c_{out}(i)$.

Figure 12:
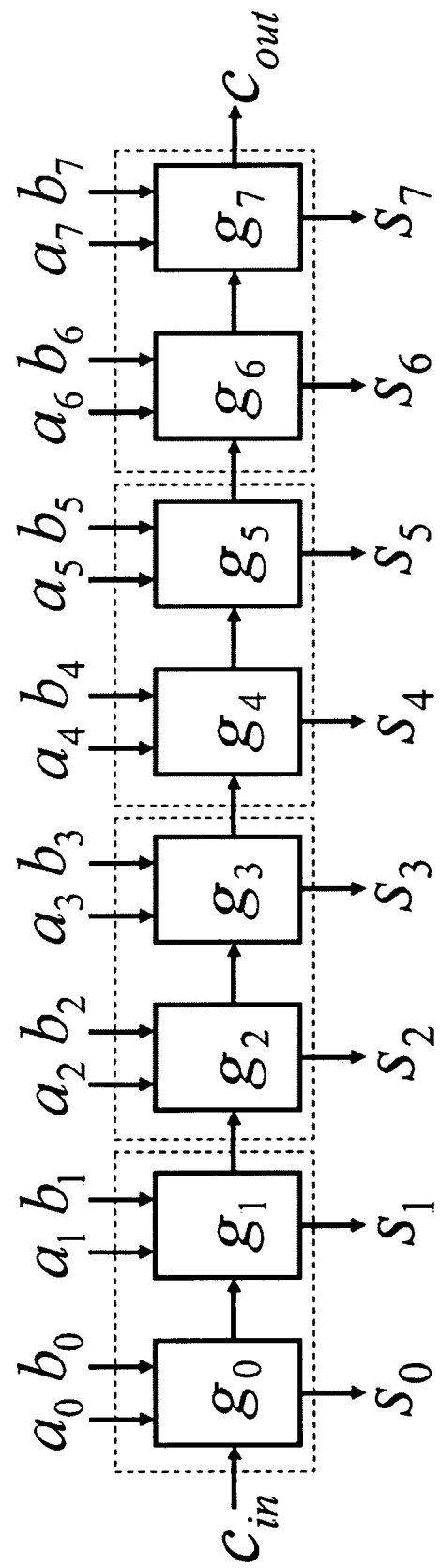
FIG. 12 illustrates the eight-bit adder that is decomposed into eight subfunctions.
Figure 13:
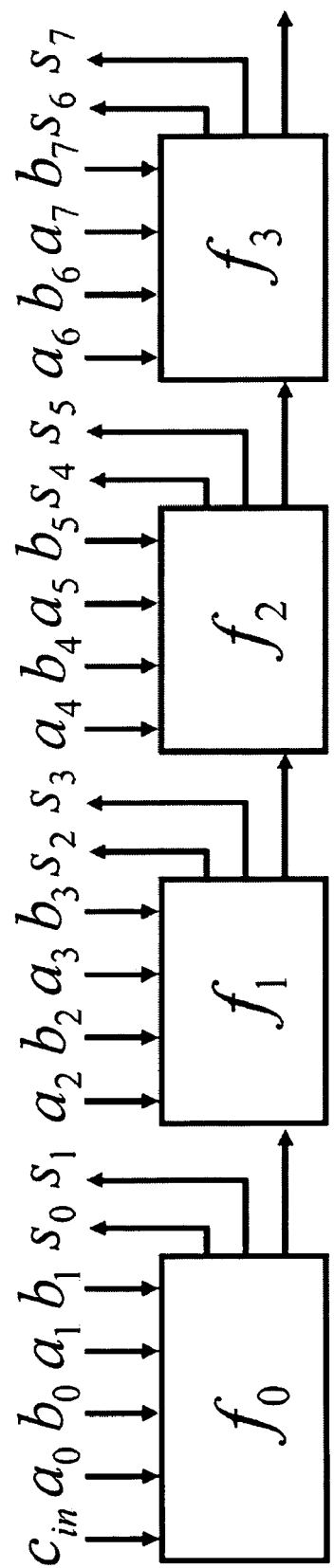
FIG. 13 illustrates the eight-bit adder that is decomposed into four subfunctions.

Let us realize this adder with the PLD consisting of four-stage memories for logic (4-0)-(4-3) as shown in FIG. 1. In this case, decomposition functions $\{g_0, g_1, g_2, g_3, g_4, g_5, g_6, g_7\}$ are divided into four groups of decomposition functions: $\{g_0, g_1\}$ and $\{g_2, g_3\}$, $\{g_4, g_5\}$, and $\{g_6, g_7\}$ as shown in FIG. 12. And, each group of decomposition function is realized as shown in FIG. 13 by 4 decomposition functions $f_0, f_1, f_2$, and $f_3$. Here, each decomposition function has 5-input and 3-output, and denoted by the logical expression in Eq. (4) and Eq. (5).

$$f_0 = [c_{out}^{(0)}, S_1, S_0] \quad (4)$$
$$= [a_1 b_1 \vee (a_1 \vee b_1)(a_0 b_0 \vee a_0 c_{in} \vee b_0 c_{in}),$$
$$a_1 \oplus b_1 \oplus (a_0 b_0 \vee a_0 c_{in} \vee b_0 c_{in}), a_0 \oplus b_0 \oplus c_{in}]$$

$$f_i = [c_{out}^{(i)}, S_{2i+1}, S_{2i}] \quad (5)$$
$$= [a_{2i+1} b_{2i+1} \vee (a_{2i+1} \vee b_{2i+1})(a_{2i} b_{2i} \vee a_{2i} c_{out}^{(i-1)} \vee b_{2i} c_{out}^{(i-1)}),$$
$$a_{2i+1} \oplus b_{2i+1} \oplus (a_{2i} b_{2i} \vee a_{2i} c_{out}^{(i-1)} \vee b_{2i} c_{out}^{(i-1)}), a_{2i} \oplus b_{2i} \oplus c_{out}^{(i-1)}]$$
$$(i = 1, 2, 3)$$

The truth table of each decomposition function $f$ is shown in FIG. 14. Then, the truth table in FIG. 15 is stored in the 0-th page of memory for logic (4-0). Truth tables (LUTs) in FIG. 16 are stored in the 0-th page of memories for logic (4-1)-(4-3). For $S_{2i}$, $S_{2i+1}$, and $c_{out}(i)$ ($i \in \{1, 2, 3\}$), we allocate the output bits of the memories for logic so as to correspond to the input lines $i_2, i_3,$ and $i_4$ of the interconnection circuit (5-($i$+1)).

For the 0-th page of each memory for input selection (3-0)-(3-3), we store the information of 0-bit shift, 5-bit shift, 9-bit shift, and 13-bit shift. That is, (0, 0, 0, 0), (0, 1, 0, 1), (1, 0, 0, 1), and (1, 1, 0, 1) are stored as the information for input selection (shf0, shf1, shf2, shf3) of each memory for input selection (3-0)-(3-3).

The shift information (4-bit) is stored in the 0-th page of each memory for interconnections (6-1)-(6-3) as the information for connection. That is, ($s_3, s_2, s_1, s_0$)=(0, 1, 0, 0) is stored as the information for connection.

Assume that the memories are programmed as mentioned above. Hereafter, we will explain the operation of the PLD.

First, variables A, B, and $c_{in}$ are sent to the input-variable register 1. The input variable register 1 stores these variables. The operation control part 10 sets the 0-th page to the memories for input selection (3-0)-(3-3); the memories for logic (4-0)-(4-3); and the memories for interconnections (6-1)-(6-3); as the page selection number $p_r$.

As a result, the memories for input selection (3-0)-(3-3) produce the information for input selection (shf0, shf1, shf2, shf3)=(0, 0, 0, 0), (0, 1, 0, 1), (1, 0, 0, 1), and (1, 1, 0, 1) that are written in the 0-th page; and send them to the control lines (shf0-shf3) of the input selectors (2-0)-(2-3). The input selectors (2-0)-(2-3) connects a part of the input terminals (in(00)-in(16)) with the output terminals (out(00)-out(07)) electrically, according to the information for input selection sent to control lines (shf0-shf3).

More precisely, the memory for input selection (3-0) has the value (shf0, shf1, shf2, shf3)=(0, 0, 0, 0): do not shift and connect (in(00)-in(07)) with (out(00)-out(07)). The memory for input selection (3-1) has the value (shf0, shf1, shf2, shf3) =(0, 1, 0, 1): shift by five bits and connect (in(05)-in(12)) with (out(00)-out(07)). The memory for input selection (3-2) has the value (shf0, shf1, shf2, shf3)=(1, 0, 0, 1): shifts by 9 bits and connect (in(09)-in(16)) with (out(00)-out(07)). The memory for input selection (3-3) has the value (shf0, shf1, shf2, shf3)=(1, 1, 0, 1): shift by 13 bits and connect (in(13))-in(16)) with (out(00)-out(03)). In this case, the input variables are not transmitted to (out(04)-out(07)).

The memories for interconnections (6-1)-(6-3) produce the information for the connection $(s_3(0), \ldots, s_0(0))=(0, 1, 0, 0)$ written in the 0-th page; and send them to the control lines of the interconnection circuits (5-1)-(5-3). The interconnection circuits (5-1)-(5-3) connect the input lines $(i_8\text{-}i_{15})$ with the output lines $(o_0\text{-}o_7)$; according to the information for connection $(s_3(k), \ldots, s_0(k))$ that are supplied from the control lines. More precisely, memories for interconnections (6-1)-(6-3) specify to shift by four bits to connect $(i_4\text{-}i_{11})$ with $(o_0\text{-}o_7)$; and connect $(i_{12}\text{-}i_{15})$ and $(i_0\text{-}i_3)$ with $(o_8\text{-}o_{15})$.

Next, the operation control part (10) moves the input variable X stored in the input variable register (1). At this time, the values of the input variables shown in Table 1 are sent to the input terminals of the input selectors (2-1)-(2-3).

TABLE 1

| i(00) | i(01) | i(02) | i(03) | i(04) | i(05) | i(06) | i(07) | i(08) |
|---|---|---|---|---|---|---|---|---|
| $c_{in}$ | $a_1$ | $a_0$ | $b_1$ | $b_0$ | $a_3$ | $a_2$ | $b_3$ | $b_2$ |
| | i(09) | i(10) | i(11) | i(12) | i(13) | i(14) | i(15) | i(16) |
| | $a_5$ | $a_4$ | $b_5$ | $b_4$ | $a_7$ | $a_6$ | $b_7$ | $b_6$ |

The input selector (2-0) produces the signals: (out(00), out(01), out(02), out(03), out(04))=$(c_{in}, a_1, a_0, b_1, b_0)$, and sends them to the memory for logic (4-0). Here, since the outputs (out(05)-out(07)) are not used, they are omitted.

The memory for logic (4-0) produces the values $(o_0, o_1, o_2, o_3, o_4, o_5, o_6, o_7) = (-, -, S_0, S_1, c_{out}(0), -, -, -)$ of $f_0(c_{in}, a_1, a_0, b_1, b_0)$ stored in the address $(i_0, i_1, i_2, i_3, i_4, i_5, i_6, i_7)=(c_{in}, a_1, a_0, b_1, b_0, -, -, -)$: LUT($LUT_0$) in the 0-th page; and sends them to the interconnection circuit (5-1). Here, "-" denotes the don't care (It can be either 0 or 1). At this time, $(-, -, S_0, S_1, c_{out}(0), -, -, -)$ is sent to the input lines $(i_0, i_1, i_2, i_3, i_4, i_5, i_6, i_7)$ of the interconnection circuit (5-1).

On the other hand, the input selector (2-1) produces (out(00), out(01), out(02), out(03))=$(a_3, a_2, b_3, b_2)$, and send them to the input lines $(i_8, i_9, i_{10}, i_{11})$ of the interconnection circuit (5-1).

From interconnection circuit (5-1), the values of (Table 2) are produced.

TABLE 2

| $o_0$ | $o_1$ | $o_2$ | $o_3$ | $o_4$ | $o_5$ | $o_6$ | $o_7$ |
|---|---|---|---|---|---|---|---|
| $c_{out}^{(0)}$ | — | — | $a_3$ | $a_2$ | $b_3$ | $b_2$ | |
| $o_8$ | $o_9$ | $o_{10}$ | $o_{11}$ | $o_{12}$ | $o_{13}$ | $o_{14}$ | $o_{15}$ |
| — | — | — | — | — | — | $S_0$ | $S_1$ |

The output lines $(o_8\text{-}o_{15})$ of the interconnection circuit (5-1) are taken out as the external output lines (7-1). Thus, the operation result $S_0$ and $S_1$ are sent to the two external output lines of (7-1).

Next, the memory for logic (4-1) produces the values $(o_0, o_1, o_2, o_3, o_4, o_5, o_6, o_7)=(-, -, S_2, S_3, c_{out}^{(1)}, -, -, -)$ of $f_1(c_{out(o)}, a_3, a_2, b_3, b_2)$ stored in the address $(i_0, i_1, i_2, i_3, i_4, i_5, i_6, i_7)=(c_{out}^{(0)}, -, -, -, a_3, a_2, b_3, b_2)$: LUT($LUT_0$) in the 0-th page; and send them to the interconnection circuit (5-2). At this time, $(-, -, S_2, S_3, c_{out}^{(1)}, -, -, -)$ is sent to the input lines $(i_0, i_1, i_2, i_3, i_4, i_5, i_6, i_7)$ of the interconnection circuit (5-2).

On the other hand, the input selector (2-2) produces the outputs: (out(00), out(01), out(02), out(03))=$(a_5, a_4, b_5, b_4)$, and send them to the input lines $(i_8, i_9, i_{10}, i_{11})$ of the interconnection circuit (5-2).

From the interconnection circuit (5-2), the values in (Table 3) are produced.

TABLE 3

| $o_0$ | $o_1$ | $o_2$ | $o_3$ | $o_4$ | $o_5$ | $o_6$ | $o_7$ |
|---|---|---|---|---|---|---|---|
| $c_{out}^{(1)}$ | — | — | $a_5$ | $a_4$ | $b_5$ | $b_4$ | |
| $o_8$ | $o_9$ | $o_{10}$ | $o_{11}$ | $o_{12}$ | $o_{13}$ | $o_{14}$ | $o_{15}$ |
| — | — | — | — | — | — | $S_2$ | $S_3$ |

The output lines $(o_8\text{-}o_{15})$ of the interconnection circuit (5-2) are taken out as the external output lines (7-2). Thus, the operation result $S_2$ and $S_3$ are sent to two external output lines of (7-2).

Next, the memory for logic (4-2) produces values $(o_0, o_1, o_2, o_3, o_4, o_5, o_6, o_7)=(-, -, S_4, S_5, c_{out}^{(2)}, -, -, -)$ of $f_2(c_{out}^{(1)}, a_5, a_4, b_5, b_4)$ stored in the address $(i_0, i_1, i_2, i_3, i_4, i_5, i_6, i_7)=(c_{out}^{(1)}, -, -, -, a_5, a_4, b_5, b_4)$: LUT($LUT_0$) stored in the 0-th page; and send them to the interconnection circuit (5-3). At this time, $(-, -, S_4, S_5, c_{out}^{(2)}, -, -, -)$ are send to the input lines $(i_0, i_1, i_2, i_3, i_4, i_5, i_6, i_7)$ of the interconnection circuit (5-3).

On the other hand, the input selector (2-3) produces the outputs (out(00), out(01), out(02), out(03))=$(a_7, a_6, b_7, b_6)$, and sends them to the input lines $(i_8, i_9, i_{10}, i_{11})$ of the interconnection circuit (5-3).

From the interconnection circuit (5-3), the values in (Table 4) are produced.

TABLE 4

| $o_0$ | $o_1$ | $o_2$ | $o_3$ | $o_4$ | $o_5$ | $o_6$ | $o_7$ |
|---|---|---|---|---|---|---|---|
| $c_{out}^{(2)}$ | — | — | $a_7$ | $a_6$ | $b_7$ | $b_6$ | |
| $o_8$ | $o_9$ | $o_{10}$ | $o_{11}$ | $o_{12}$ | $o_{13}$ | $o_{14}$ | $o_{15}$ |
| — | — | — | — | — | — | $S_4$ | $S_5$ |

The output lines $(o_8\text{-}o_{15})$ of the interconnection circuit (5-3) are taken out as the external output lines (7-3). Thus, the operation result $S_4$ and $S_5$ are sent to two external output lines of (7-3).

Finally, the memory for logic (4-3) produces the values $(o_0, o_1, o_2, o_3, o_4, o_5, o_6, o_7)=(-, -, S_6, S_7, c_{out}^{(3)}, -, -, -)$ of $f_3(c_{out}^{(2)}, a_7, a_6, b_7, b_6)$ stored in address $(i_0, i_1, i_2, i_3, i_4, i_5, i_6, i_7)=(c_{out}^{(2)}, -, -, -, a_7, a_6, b_7, b_6)$: LUT($LUT_0$) stored in the 0-th page; and sends to the output lines (7-4). As a result, all the operation results are sent to the output lines (7-1)-(7-4) and the operation is completed.

(End of Example 1)

III. Embodiment 2

Figure 17:
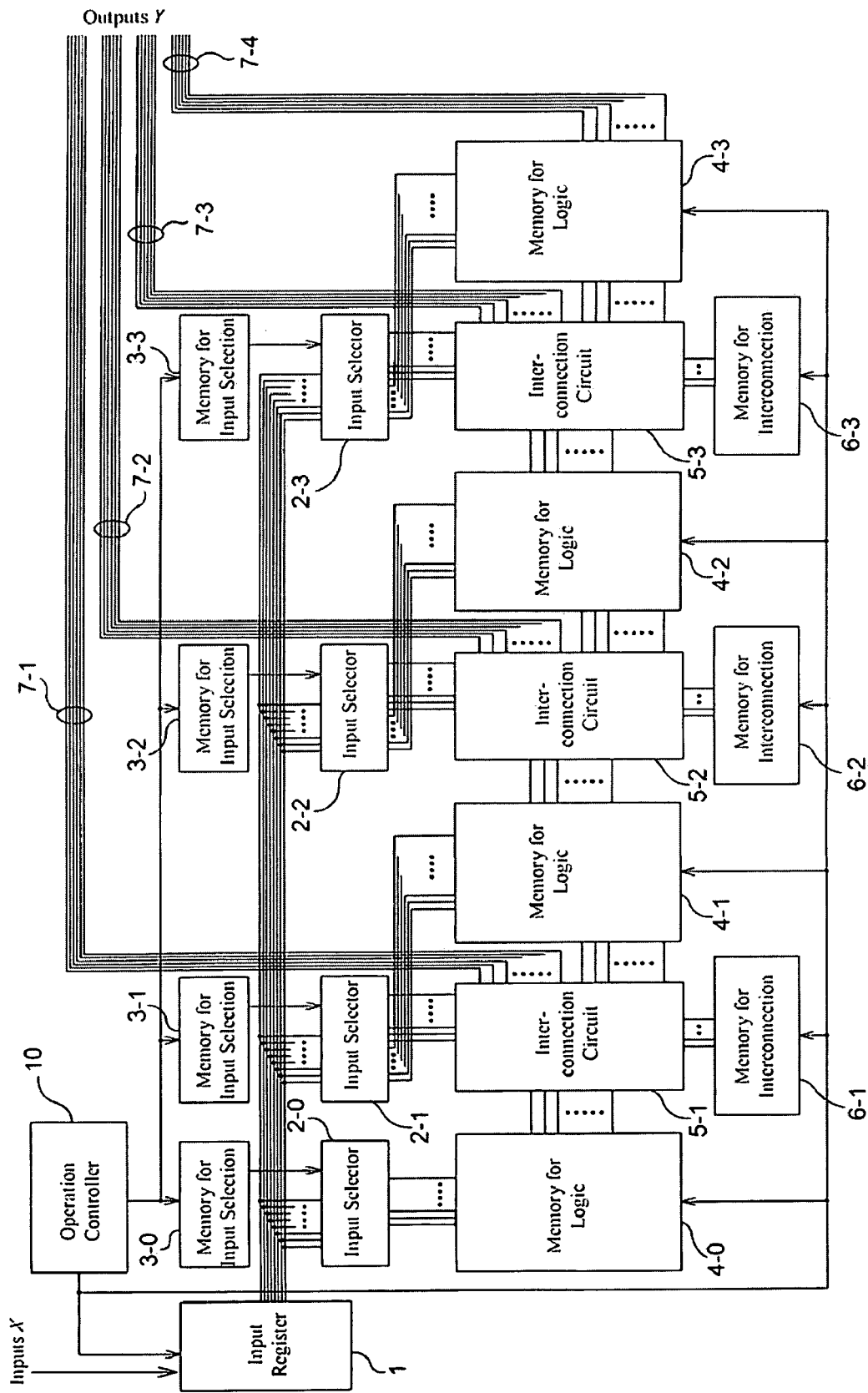
FIG. 17 is a simplified block diagram of the PLD in accordance with EMBODIMENT 2 of the this invention.

The simplified block diagram of the PLD in accordance with EMBODIMENT 2 of the present invention is illustrated in FIG. 17.

The feature of this EMBODIMENT is as follows: a part of the output lines of the input selectors (2-1)-(2-3) are directly connected to the inputs of memories for logic (4-1)-(4-3)

without using the interconnection circuits (5-1)-(5-3). In many practical logic functions, at least one external input variable is connected to an input of the memories for logic (4-1)-(4-3). That is, at least one output line of the input selectors (2-1)-(2-3) is often connected to the input of the memories for logic (4-1)-(4-3). Therefore, in a PLD used in practice, if a part of the output lines of input selectors (2-1)-(2-3) is connected directly to the input of memories for logic (4-1)-(4-3) without using the interconnection circuits (5-1)-(5-3), then we can decrease the number of the input lines of the interconnection circuits (5-1)-(5-3). As a result, interconnection circuits (5-1)-(5-3) can be reduced. Also, when the interconnection circuits (5-1)-(5-3) are realized by the shifters shown in FIG. 4, we can reduce the number of stages, and can make the circuit faster, and reduce the power dissipation.

IV. Embodiment 3

Figure 18:
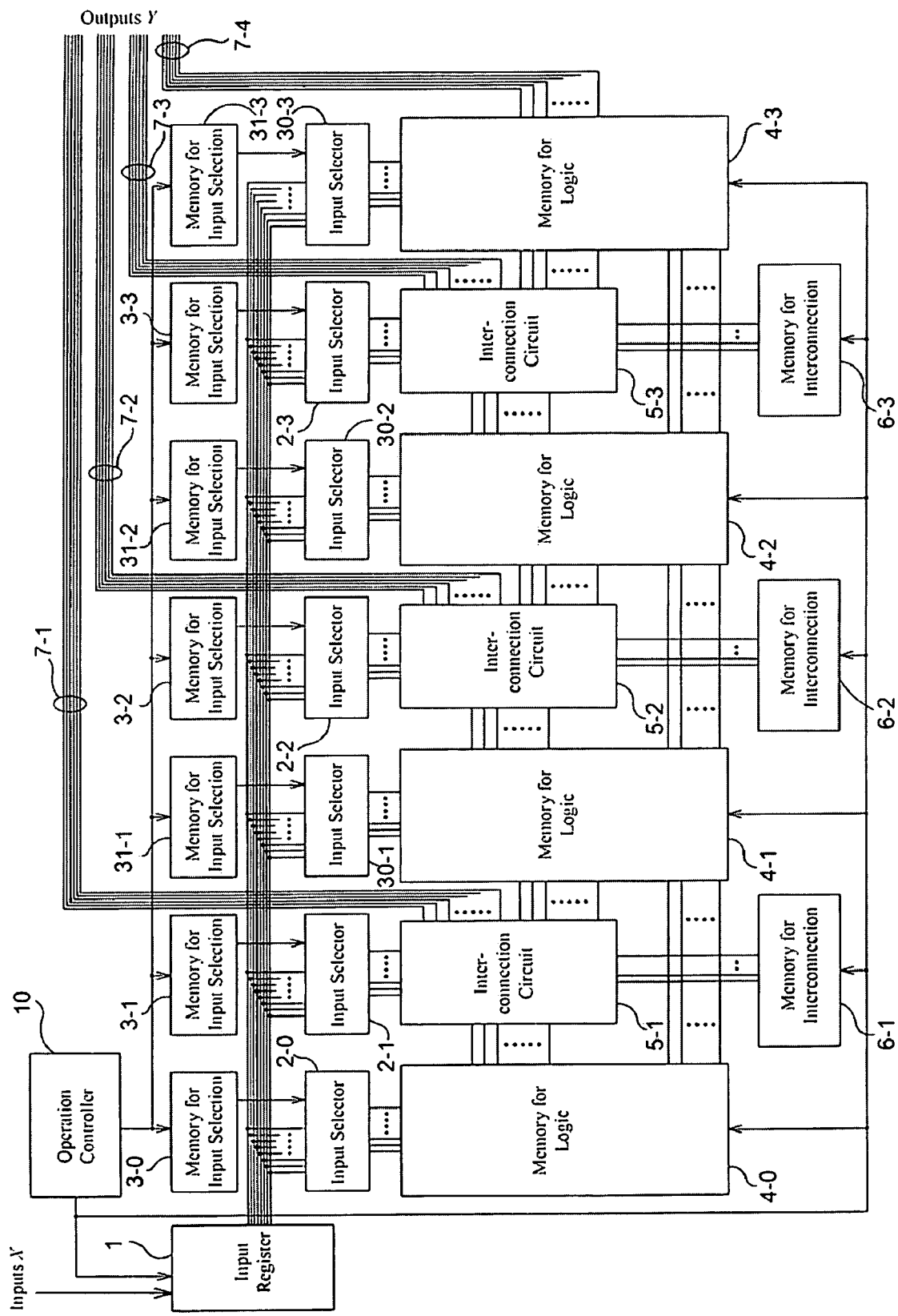
FIG. 18 is a simplified block diagram of the PLD in accordance with EMBODIMENT 3 of the this invention.

The simplified block diagram of the PLD in accordance with EMBODIMENT 3 of the present invention is illustrated in FIG. 18.

The first feature of this EMBODIMENT is that the PLD has; the input selectors (30-1)-(30-3) that select the input variables, and send them directly into the memories for logic (4-1)-(4-3) without using the interconnection circuits (5-1)-(5-3) and the memories for input selection (31-1)-(31-3) that stores the information for the connection of the input selectors (30-1)-(30-3); in addition to the input selectors (2-1)-(2-3) that select the input variables and send them to the interconnection circuits (5-1)-(5-3). Moreover, the second feature of this EMBODIMENT is that in this PLD, a part of the intermediate variables is directly connected from the output of the memory for logic (4-(i−1)) (i∈{1, 2, 3}) in the preceding stage, to the memory for logic (4-$i$) of succeeding stage, without using the interconnection circuits (5-1)-(5-3).

By this structure, we can reduce the number of the input lines of the interconnection circuits (5-1)-(5-3). As a result, we can reduce the interconnection circuits (5-1)-(5-3). Moreover, we can reduce the number of levels of shifters, when the interconnection circuits (5-1)-(5-3) are realized by the shifters like FIG. 4. Thus, we can make the PLD faster.

V. Embodiment 4

Figure 19:
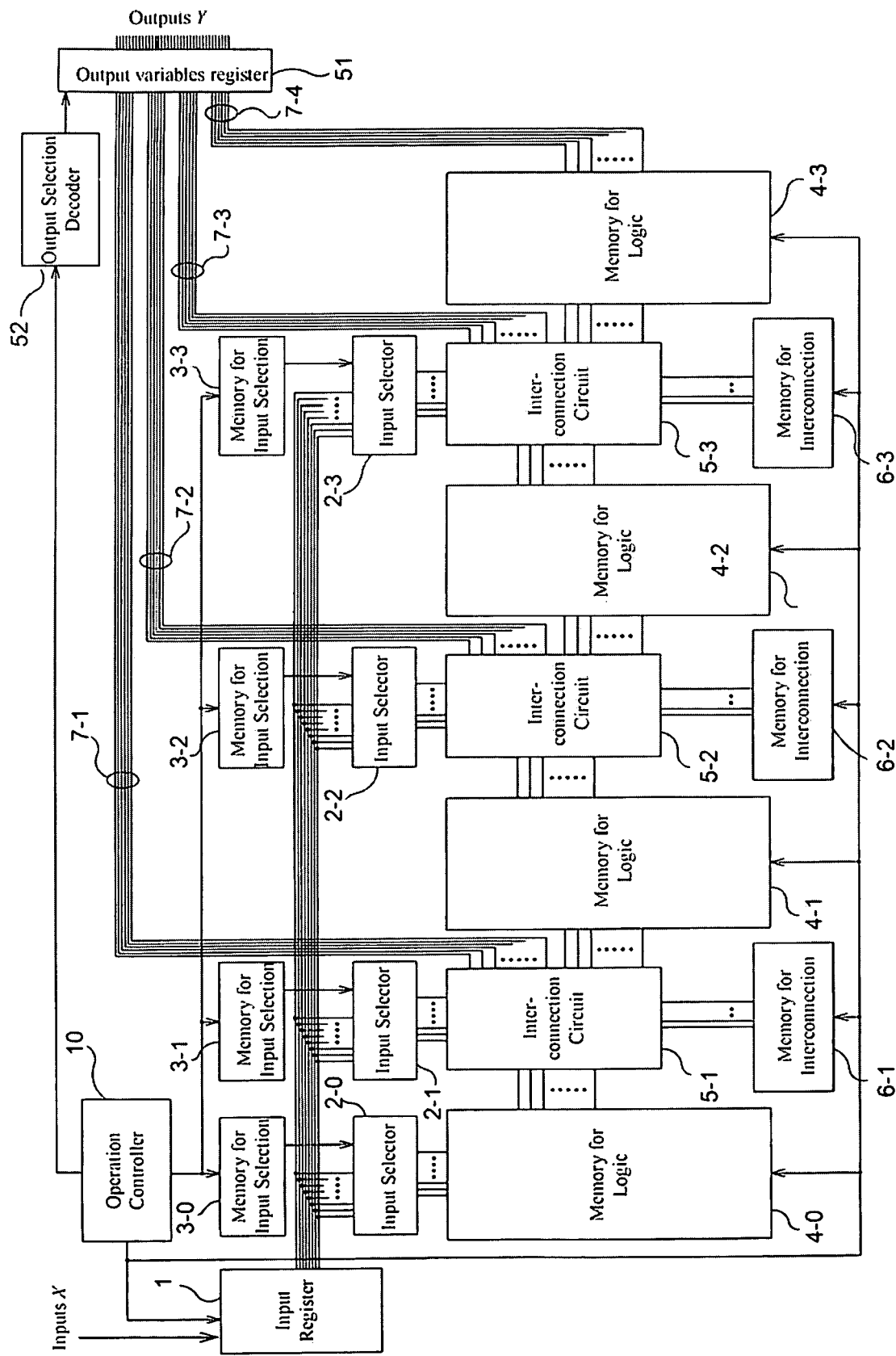
FIG. 19 is a simplified block diagram of the PLD in accordance with EMBODIMENT 4 of the this invention.
Figure 20:
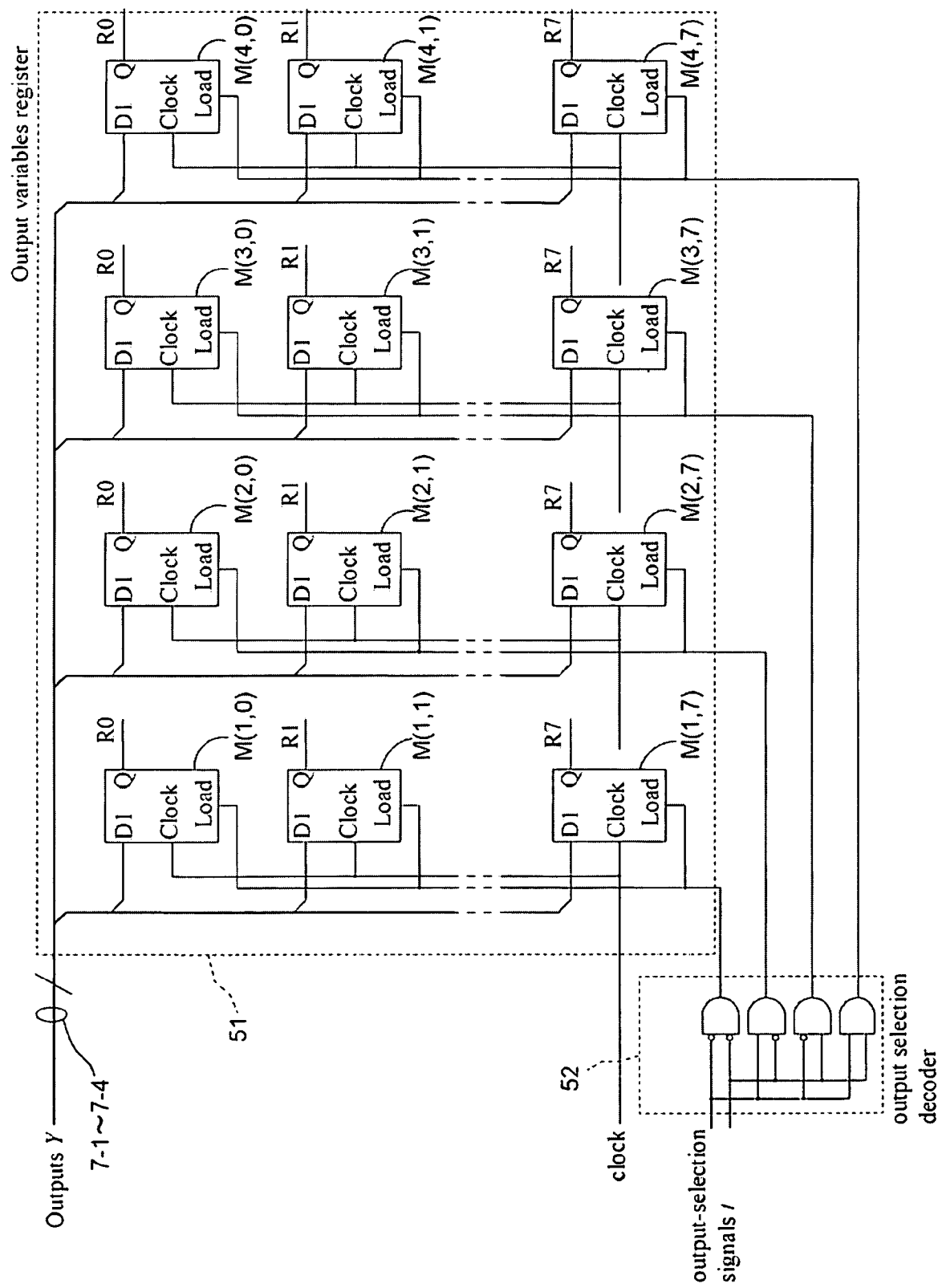
FIG. 20 is a schematic diagram showing the structure of the output register and the output decoder in FIG. 19.
Figure 21:
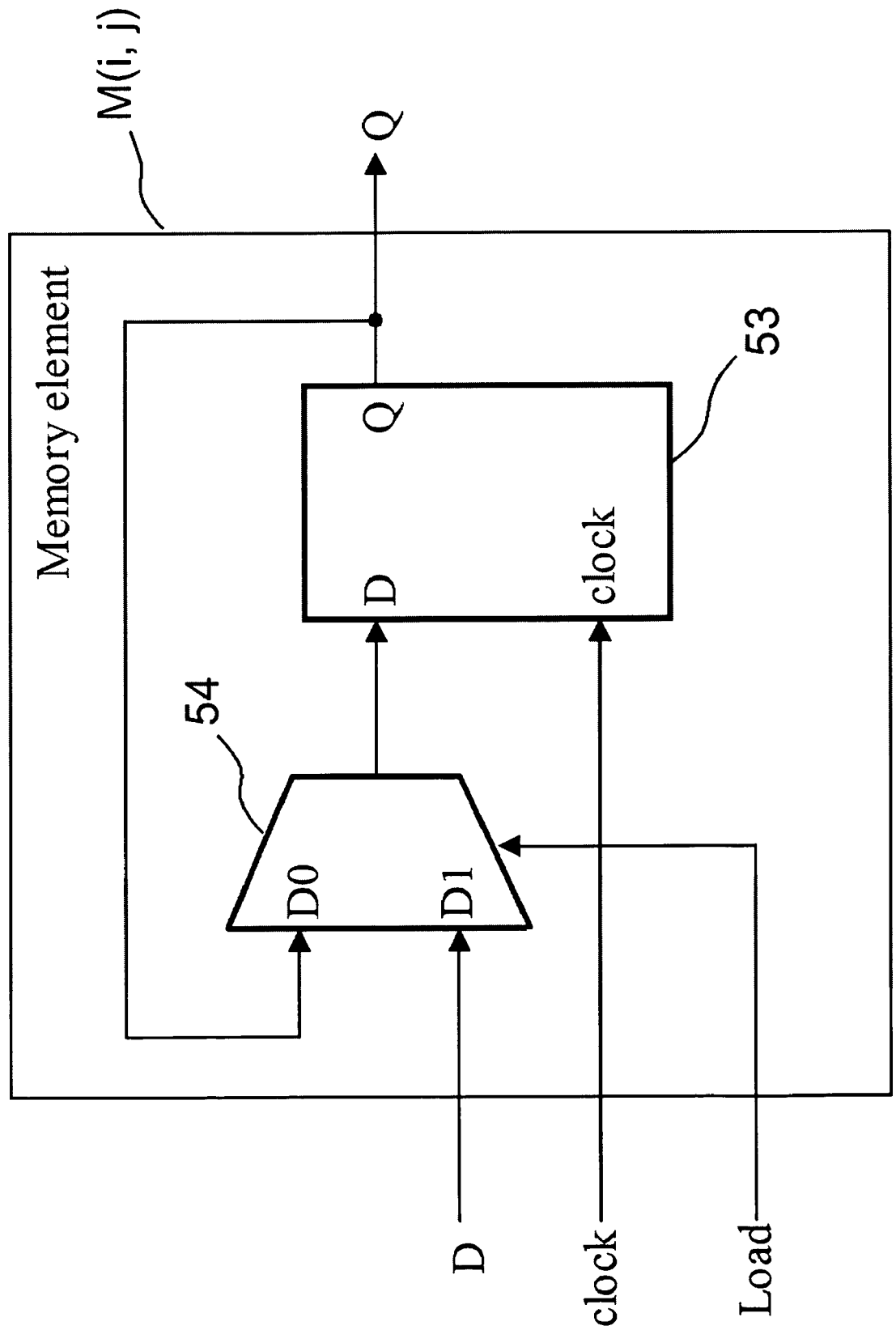
FIG. 21 is a schematic diagram showing the structure of the memory elements in FIG. 20.

FIG. 19 is a simplified block diagram of the PLD in accordance with EMBODIMENT 4 of the present invention. FIG. 20 is a schematic diagram showing the structure of the output register and the output decoder in FIG. 19. FIG. 21 is a schematic diagram showing the structure of the memory elements in FIG. 20. The feature of this EMBODIMENT is that the PLD has the following components: the output variables register (51) that stores values sent to the external output lines (7-1)-(7-4); and the output selection decoder (52) that produces loading signals into the output variables register (51). For other components, they are similar to the case of FIG. 1, so we omit the explanation. In this EMBODIMENT, memories for logic (4-0)-(4-3) have address latches (not shown in the figure) internally, and they operate synchronously by the clock.

The output variables register (51) has 32 memory elements M(i, j) (i∈{1, 2, 3, 4}, j∈{0, 1, 2, 3, 4, 5, 6, 7}). Each memory element M(i, j) consists of a D flip-flop (denoted by DFF) (53) that maintains the data; and two-input one-output multiplexer (54) (denoted by MUX). A common clock signal Clock is sent to the DFFs (53). When Clock is one, DFF (53) latches the value of the data input D. The output of MUX (54) is connected to the data input D of DFF (53). Moreover, output Q of DFF (53) is connected to the input D0: 0 side of MUX (54). Input D1, 1 side of MUX (54) is connected to the line of the j-th external output line (7-$i$). MAX (54) is controlled by Load signal, and it selects the input in 0-side when Load=0, and selects the input in one-side when Load=1.

To the output selection decoder (52), the operation control part (10) sends the output selection signal t of two bits. And, the output selection decoder (52) produces four output selection signals $(T_1)$-$(T_4)$. At t=(0, 0), (T1, T2, T3, T4)=(1, 0, 0, 0) is produced. At t=(0, 1), (T1, T2, T3, T4)=(0, 1, 0, 0) is produced. At t=(1, 0), (T1, T2, T3, T4)=(0, 0, 1, 0) is produced. At t=(1, 1), (T1, T2, T3, T4)=(0, 0, 0, 1) is produced. Each output selection signal $T_i$(i∈{1, 2, 3, 4}) is sent to each memory element M(i, j) as the loading signal.

The Operation control part (10) sends output selection signal t to latch the result into the output variables register (51) as follows: in the beginning, set t=(00); after the memory for logic (4-0) produce the operation result, set t=(01); after the memory for logic (4-1) produce the operation result, set t=(10); and after the memory for logic (4-2) produce the operation result, set t=(11). When the operation finish, the operation results can be obtained by reading the output variables stored in the output variables register (51).

VI. Embodiment 5

Figure 22:
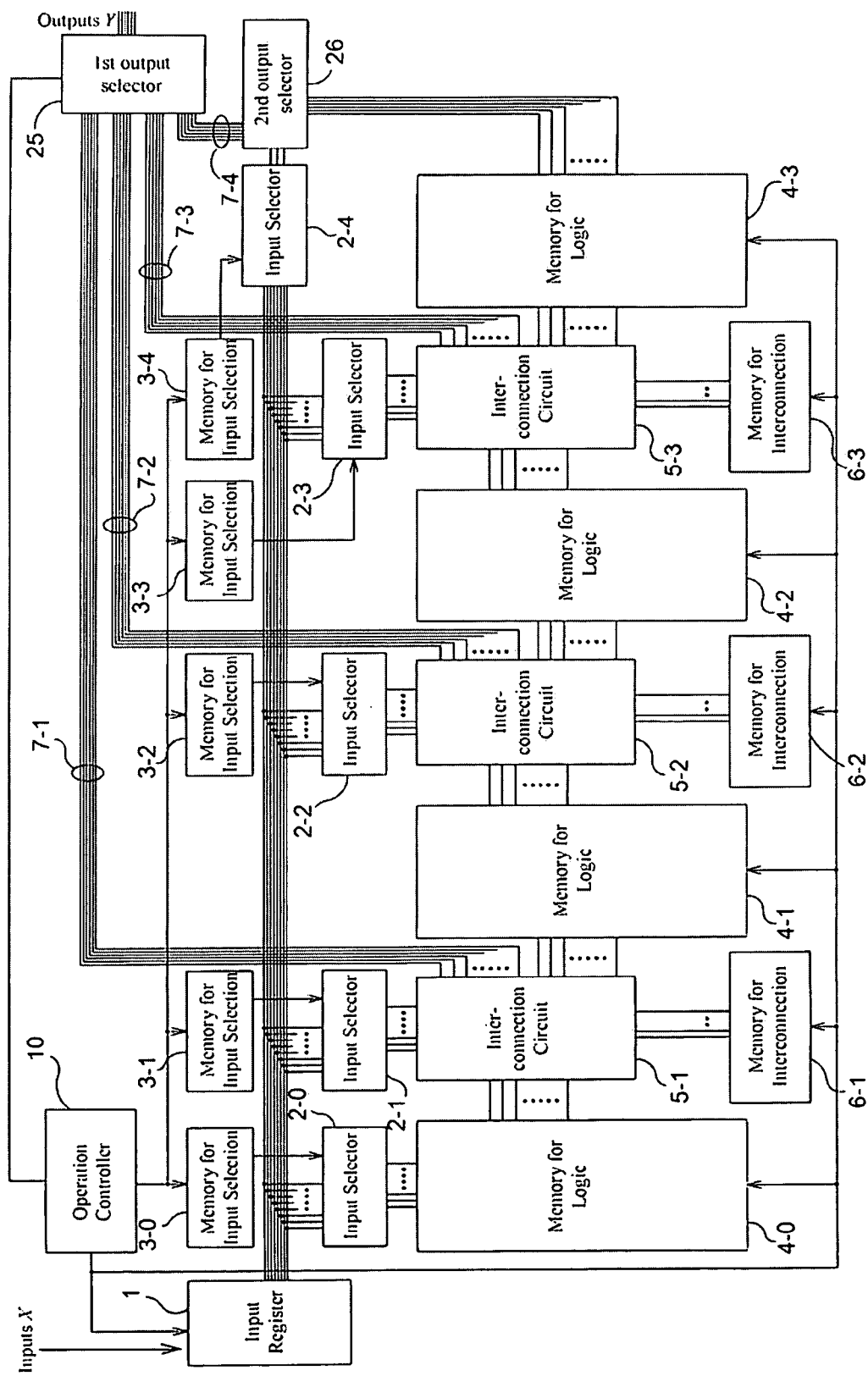
FIG. 22 is a simplified block diagram of the PLD in accordance with EMBODIMENT 5 of the present invention.

FIG. 22 is a simplified block diagram of the PLD in accordance with EMBODIMENT 5 of the present invention.

The feature of this EMBODIMENT is that the PLD has; the first output selection circuit (25); the second output selection circuit (26); the memory for input selection (3-4); and the input selector (2-4). For other components, they are similar to FIG. 1, so the explanations are omitted.

The second output selection circuit (26) selects the entire or a part of the output the memory for logic (4-3) of the final stage; according to the values of the input variables that comes from the input selector (2-4). The input selector (2-4) is realized by the shifter similar to one shown in FIG. 2. Note that, in this EMBODIMENT, because the number of the outputs of the memory for logic (4-3) of the final stage is eight, the shifter for the input variable selection circuit (2-4) requires the outputs with three bits. Let N be the number of the output bits of the memory for logic (4-3) of the final stage, then the number of outputs for the input selector (2-4) is given, in general, by:

$$\lceil \log_2 N \rceil \qquad (6)$$

Hereafter, let the outputs of the input selector (2-4) (out(00)-out(02)) (See FIG. 2) be $F_0$, $F_1$, and $F_2$.

The first output selection circuit (25) consists of the multiplexer: it select either the output variables produced by the memories for logic (4-0)-(4-2) or the output variables produced by the second output selection circuit (26); and produce it as the output; according to the output selection signal t generated by the operation control part (10).

Here, the output selection signal t (t∈{(00), (01), (10), (11)}) is a two-bit signal represented by the bundle of the output lines: it shows the first output selection circuit (25). The first output selection circuit (25) selects the bundle of output lines of as follows: When t=(00), it selects the bundle of output lines of the interconnection circuit (5-1) ($o_8$-$o_{15}$ in FIG. 4); when t=(01), it selects the bundle of output lines of the interconnection circuit (5-2); when t=(10), it selects the bundle of output lines of the interconnection circuit (5-3); and when t=(11), it selects the bundle of output lines of the 2nd output selection circuit (26).

Figure 23:
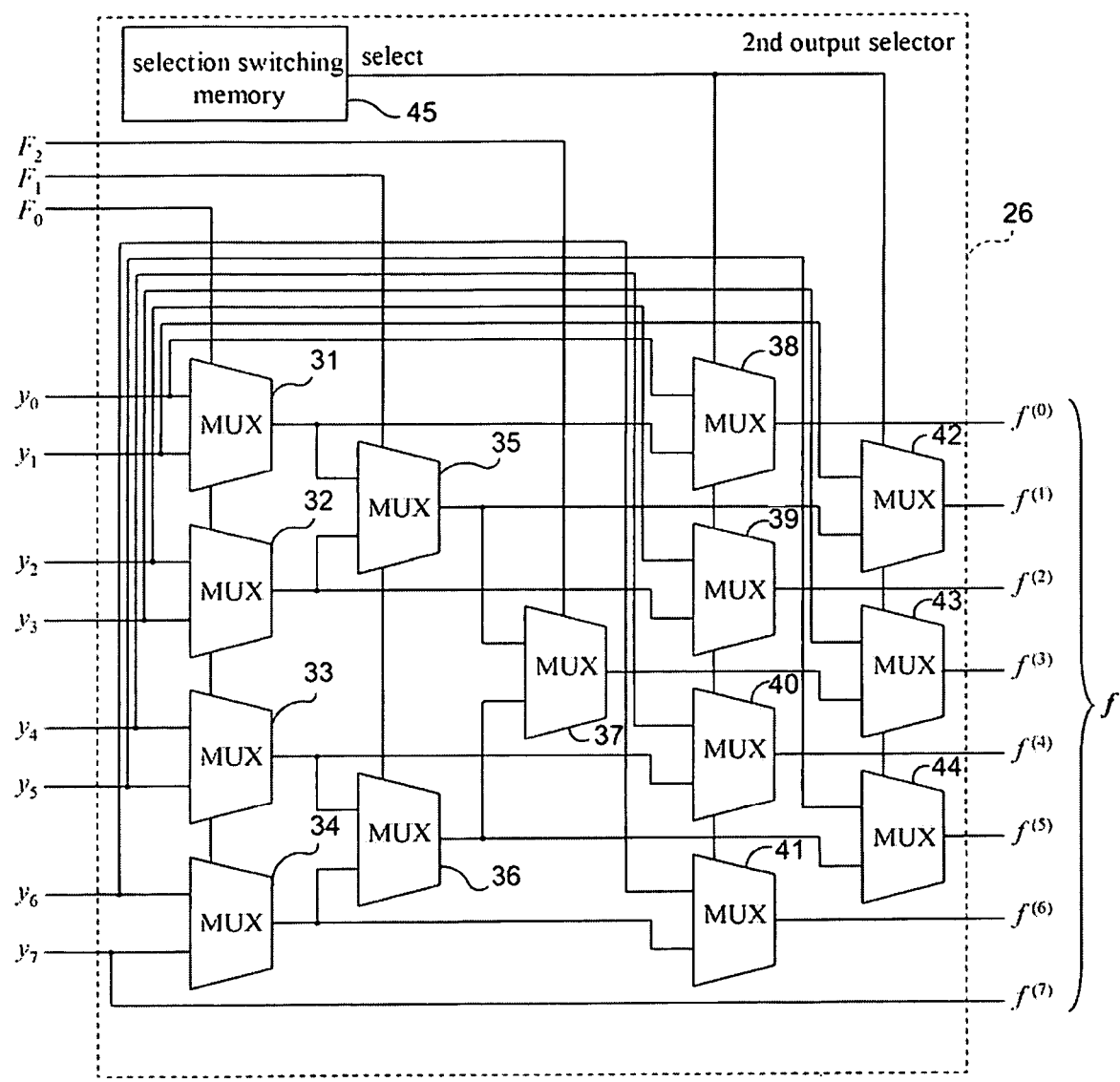
FIG. 23 is a schematic diagram showing the structure of the second output selection circuit in FIG. 22.

FIG. 23 is a schematic diagram showing the structure of the second output selection circuit (26) in FIG. 22. This diagram is simplified to explain the principle of operation and the details are omitted.

The second output selection circuit (26) is realized as shown in FIG. 23: two-input one-output multiplexers (31)-(37) (denoted by "MUX") are connected like a tree, and from the each stage, outputs can be taken out by way of (MUX38)-(MUX44). In FIG. 23, an example where $N_c$, the number of the output lines, is equal to 8 is shown for the convenience of the explanation. However, $N_c$ can be other values.

In FIG. 23, the input lines ($y_0$-$y_7$) of the second output selection circuit (26) are connected to the outputs of the memory for logic (4-3). Values of the output variables Y are supplied from these input lines ($y_0$-$y_7$). Moreover, from the output lines ($f^{(0)}$-$f^{(7)}$) of the output selection circuit (26), values ($y_0, \ldots, y_{|Y|-1}$) of the selected output variables Y of the input lines ($y_0$-$y_7$) are produced.

Input lines $y_0$, $y_1$ are connected to the inputs of MUX31; Input lines $y_2$, $y_3$ are connected to the inputs of MUX32; Input lines $y_4$, $y_5$ are connected to the inputs of MUX33; and Input lines $y_6$, $y_7$ are connected to the inputs of MUX34. The outputs of MUX31 and MUX32 are connected to the inputs of MUX35; the outputs of MUX33 and MUX34 are connected to the inputs of MUX36; and the outputs of MUX35 and MUX36 are connected to the inputs of MUX37.

On the other hand, (the input line $y_0$ and the output line of MUX31) are connected to the inputs of MUX38; (the input line $y_2$ and the output line of MUX32) are connected to the inputs of MUX39; (the input line $y_4$ and the output line of MUX33) are connected to the inputs of MUX40; (the input line $y_6$ and the output line of MUX34) are connected to the inputs of MUX41; (the input line $y_1$ and the output line of MUX35) are connected to the inputs of MUX42; (the input line $y_3$ and the output line of MUX37) are connected to the inputs of MUX43; and (the input line $y_5$ and the output line of MUX36) are connected to the inputs of MUX44.

For (MUX31)-(MUX34), the input variable $F_0$ is the common control signal: When $F_0$=0, MUX31, MUX32, MUX33, and MUX34 select the input lines $y_0$, $y_2$, $y_4$, and $y_6$, respectively. When $F_0$=1, MUX31, MUX32, MUX33, and MUX34 select the input lines $y_1$, $y_3$, $y_5$, and $y_7$, respectively.

For MUX35 and MUX36, the input variable $F_1$ is the common control signal: When $F_1$=0, MUX35 and MUX36 select MUX31 and MUX33, respectively. When $F_1$=1, MUX35 and MUX36 select MUX32 and MUX34, respectively.

For MUX37, the input variable $F_2$ is the control signal: When $F_2$=0, MUX37 selects MUX35. When $F_2$=1, MUX37 selects MUX36.

(MUX31)-(MUX34) select four lines out of the eight input lines ($y_0$-$y_7$). (MUX31)-(MUX36) select two lines out of eight input lines ($y_0$-$y_7$). (MUX31)-(MUX37) select one line out of eight input lines ($y_0$-$y_7$). In other words, when m, the number of output variables of the objective logic function $f(X)=(f_1(X), f_2(X), \ldots, f_m(X))$, is four or less than four, we can do the logic operation with the input variables ($F_0, F_1, F_2$) and the intermediate variable Y produced by the memory for logic (4-3). With this, we can reduce the number of input variables in the memories for logic (4-0)-(4-3).

Let the objective logic function $f(x_0, x_1, \ldots, x_{n-2}, x_{n-1})$ be expanded as follows:

$$x_{n-1} f'(x_0, x_1, \ldots, x_{n-2}) \vee \bar{x}_{n-1} f'(x_0, x_1, \ldots, x_{n-2}) \quad (7)$$

Let the subfunction $f'(x_0, x_1, \ldots, x_{n-2})$ be decomposed into four subfunctions $f_0(X_0)$, $f_1(X_1, Y_1)$, $f_2(X_2, Y_2)$, and $f_3(X_3, Y_3)$, where, $X_0 \cup X_1 \cup X_2 \cup X_3 = \{x_0, x_1, \ldots, x_{n-2}\}$. And, let the number of outputs of the subfunction $f_3(X_3, Y_3)$ of the final stage be four or less than four. Then, we can reduce the numbers of input variables of the memories for logic (4-0)-(4-3) by one. In this case, the input variable $x_{n-1}$ will be connected to the input variable $F_0$ of the second output variable selection circuit (26).

Similarly, when the objective logic function $f(x_0, x_1, \ldots, x_{n-2}, x_{n-1})$ is expanded as follows:

$$x_{n-1} x_{n-2} f''(x_0, x_1, \ldots, x_{n-3}) \vee x_{n-1} \bar{x}_{n-2} f''(x_0, x_1, \ldots, x_{n-3}) \quad (8)$$
$$\vee \bar{x}_{n-1} x_{n-2} f''(x_0, x_1, \ldots, x_{n-3}) \vee \bar{x}_{n-1} \bar{x}_{n-2} f''(x_0, x_1, \ldots, x_{n-3})$$

We can reduce the numbers of the input to the memory for logic (4-0)-(4-3) by two.

If we expand the function as follows, then we can reduce the number of the inputs to the memory for logic (4-0)-(4-3) by three.

$$x_{n-1} x_{n-2} x_{n-3} f'''(x_0, x_1, \ldots, x_{n-4}) \vee \quad (9)$$
$$x_{n-1} x_{n-2} \bar{x}_{n-3} f'''(x_0 x_1, \ldots, x_{n-4})$$
$$\vee x_{n-1} \bar{x}_{n-2} x_{n-3} f'''(x_0, x_1, \ldots, x_{n-4}) \vee$$
$$x_{n-1} \bar{x}_{n-2} \bar{x}_{n-3} f'''(x_0, x_1, \ldots, x_{n-4})$$
$$\vee \bar{x}_{n-1} x_{n-2} x_{n-3} f'''(x_0, x_1, \ldots, x_{n-4}) \vee$$
$$\bar{x}_{n-1} x_{n-2} \bar{x}_{n-3} f'''(x_0, x_1, \ldots, x_{n-4})$$
$$\vee \bar{x}_{n-1} \bar{x}_{n-2} x_{n-3} f'''(x_0, x_1, \ldots, x_{n-4}) \vee$$
$$\bar{x}_{n-1} \bar{x}_{n-2} \bar{x}_{n-3} f'''(x_0, x_1, \ldots, x_{n-4})$$

The outputs signals of eight bits, four bits, two bits or 1-bits selected by (MUX31)-(MUX37) must be sent to the first output selection circuit (25) through the common eight output lines. Thus, in FIG. 23, the output signals selected by (MUX38)-(MUX 44) are taken out by way of the common output lines ($f^{(0)}$-$f^{(7)}$). As for (MUX38)-(MUX44), a common output selection variable (Select) controls the operation. The value of the output selection variable (Select) is stored in the output selection memory (45) according to m, the number of the output variables $f(x)=(f_1(X), f_2(X), \ldots, f_m(X))$. The operation control part (10) produces the (Select) signal.

MUX38 selects the input line $y_0$ when Select=0, and the output of MUX31 when Select=1; and send the selected signal to the output line $f^{(0)}$. MUX39 selects the input line $y_2$ when Select=0, and the output of MUX32 when Select=1; and send the selected signal to the output line j(2). MUX40 selects the input line $y_4$ when Select=0, and the output of MUX33 when Select=1; and send the selected signal to the output line $f^{(4)}$. MUX41 selects the input line $y_6$ when Select=0, and the output of MUX34 when Select=1; and send the selected signal to the output line $f^{(6)}$.

MUX42 selects the input line $y_1$ when Select=0, and the output of MUX35 when Select=1; and send the selected signal to the output line $f^{(1)}$. MUX43 selects the input line $y_3$ when Select=0, and the output of MUX37 when Select=1; and send the selected signal to the output line $f^{(3)}$. MUX44 selects the input line $y_5$ when Select=0, and the output of MUX36 when Select=1; and send the selected signal to the output line $f^{(5)}$. Moreover, the output line $f^{(7)}$ is directly connected to the input line $y_7$.

When the number of the outputs, that is the number of the bits of the operation results $f(X)$ of the objective logic function $f$ is eight, set Select=0. As a result, the values of output variables $Y=(y_0, \ldots, y_7)$ in the input lines $(y_0-y_7)$ are sent to the output lines $(f^{(0)}-f^{(7)})$. When the number of the output is four, set the Select=1, and set the input variable $F_0$ to either 0 or 1. As a result, four outputs of the input lines $(y_0-y_7)$ are sent to the output lines $(f^{(0)}, f^{(2)}, f^{(4)}, f^{(6)})$ as follows: when $F_0=0$, four outputs $(y_0, y_2, y_4, y_6)$ are sent; and when $F_0=1$, four outputs $(y_1, y_3, y_5, y_7)$ are sent. When the number of the outputs is two, set Select=1 and set $F_0$ and $F_1$ to either 0 or 1. As a result, when $(F_0, F_1)=(0, 0)$, in the output lines $f^{(1)}$ and $f^{(5)}$, the values of two output variables $Y=(y_0, y_4)$ are sent to the output from the input lines $(y_0-y_7)$. When $(F_0, F_1)=(0, 1)$, $(y_1, y_5)$ are sent to the output. When $(F_0, F_1)=(1, 0)$, $(y_2, y_6)$ are sent to the output. When $(F_0, F_1)=(1, 1)$, $(y_3, y_7)$ are sent to the output. When the number of the output is one, set Select=1, and set $F_0$, $F_1$, and $F_2$ either 0 or 1. In this case, one signal in the input lines $(y_0-y_7)$ specified by $F_0$, $F_1$, and $F_2$ is sent to the output line $f^{(3)}$.

In this way, by using the second output selection circuit (26), we can do the selection operation, when the number of the output variables $f(X)$ is equal to a half or less than a half of the number of the output lines of the memory for logic (4-3) in the final stage. As a result, we can substantially increase the total number of inputs of the memories for logic (4-0)-(4-3), which implements the decomposition functions. Therefore, we can increase the number of the input variables in PLD.

In FIG. 23, we used two-input one-output MUXs. However, in general, we can use w-input one-output ($w\geq 2$) MUXs in the output selection circuit (26).

VII. Embodiment 6

Figure 24:
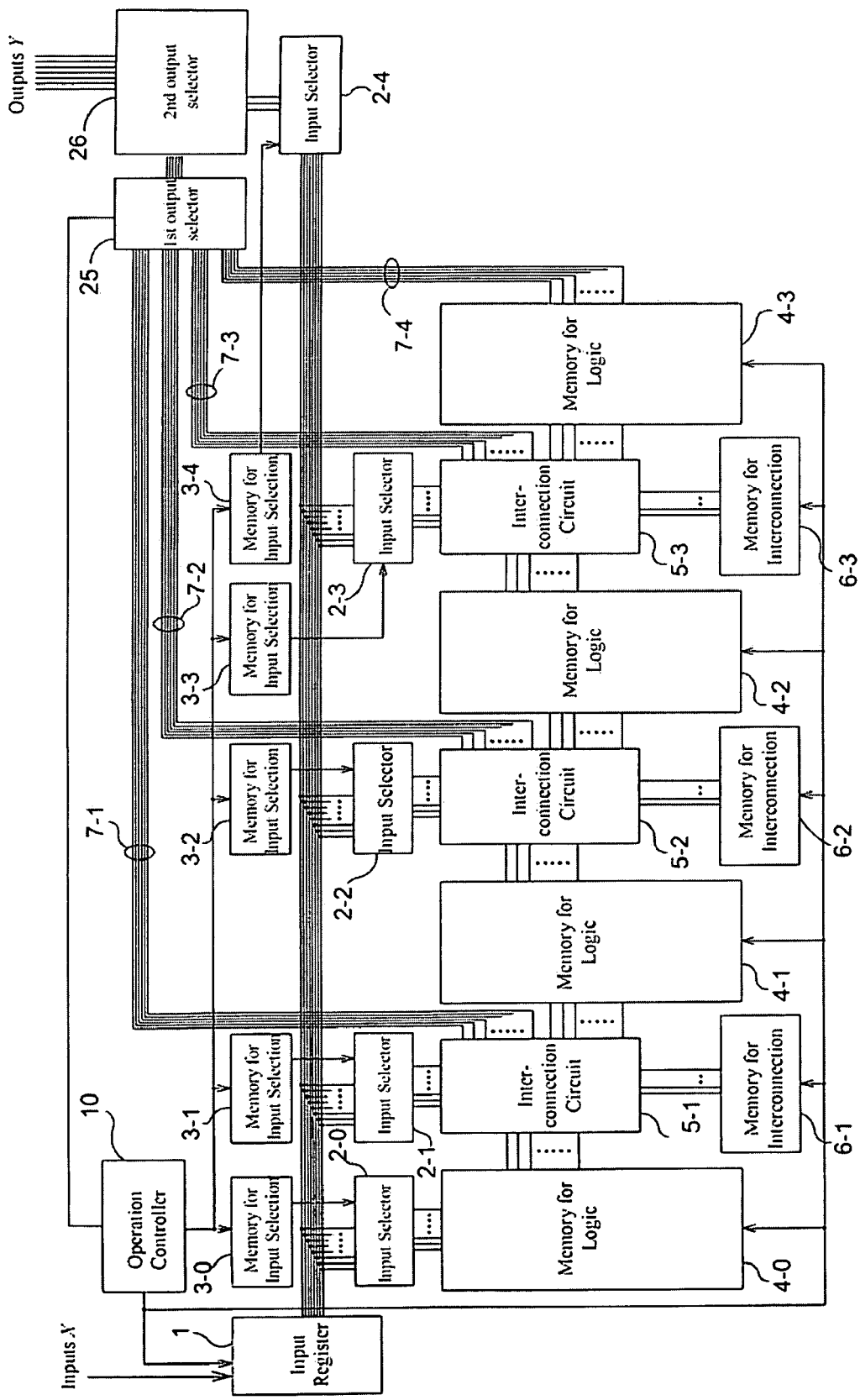
FIG. 24 is a simplified block diagram of the PLD in accordance with EMBODIMENT 6 of the present invention.

FIG. 24 is a simplified block diagram of the PLD in accordance with EMBODIMENT 6 of the present invention.

The feature of this EMBODIMENT is that the second output selection circuit (26) is connected to the output of the first output selection circuit (25). In the following, we will explain the first output selection circuit (25), and the second output selection circuit (26). The explanations for other parts are omitted, since this EMBODIMENT is similar to EMBODIMENT 5.

The first output selection circuit (25) selects a group of variables are sent from the interconnection circuits (5-1)-(5-3) and the memory for logic (4-3). The group of variables selected by the first selection circuit (25), are further selected by the second selection circuit (26) to produce the outputs, according to the values of input variable $(F_1, F_2, F_3)$ and the selection variable Select.

Here, an arbitrary n-variable logic function $f(x_0, x_1, \ldots, x_{n-1})$ can be represented as follows:

$$f(x_0, x_1, \ldots, x_{n-3}, x_{n-2}, x_{n-1}) = \quad (10)$$
$$x_{n-2}x_{n-1}f_0(x_0, x_1, \ldots, x_{n-3}) \vee x_{n-2}\bar{x}_{n-1}f_1(x_0, x_1, \ldots, x_{n-3}) \vee$$
$$\bar{x}_{n-2}x_{n-1}f_2(x_0, x_1, \ldots, x_{n-3}) \vee \bar{x}_{n-2}\bar{x}_{n-1}f_3(x_0, x_1, \ldots, x_{n-3})$$

Therefore, an n-variable logic function can be implemented by above-mentioned subfunctions $(f_0-f_3)$ stored in the memories for logic (4-0)-(4-3); by doing product operations with subfunctions $(f_0-f_3)$ and $x_{n-2}$ and $x_{n-1}$, in the second output selection circuit (26).

VIII. Embodiment 7

Figure 25:
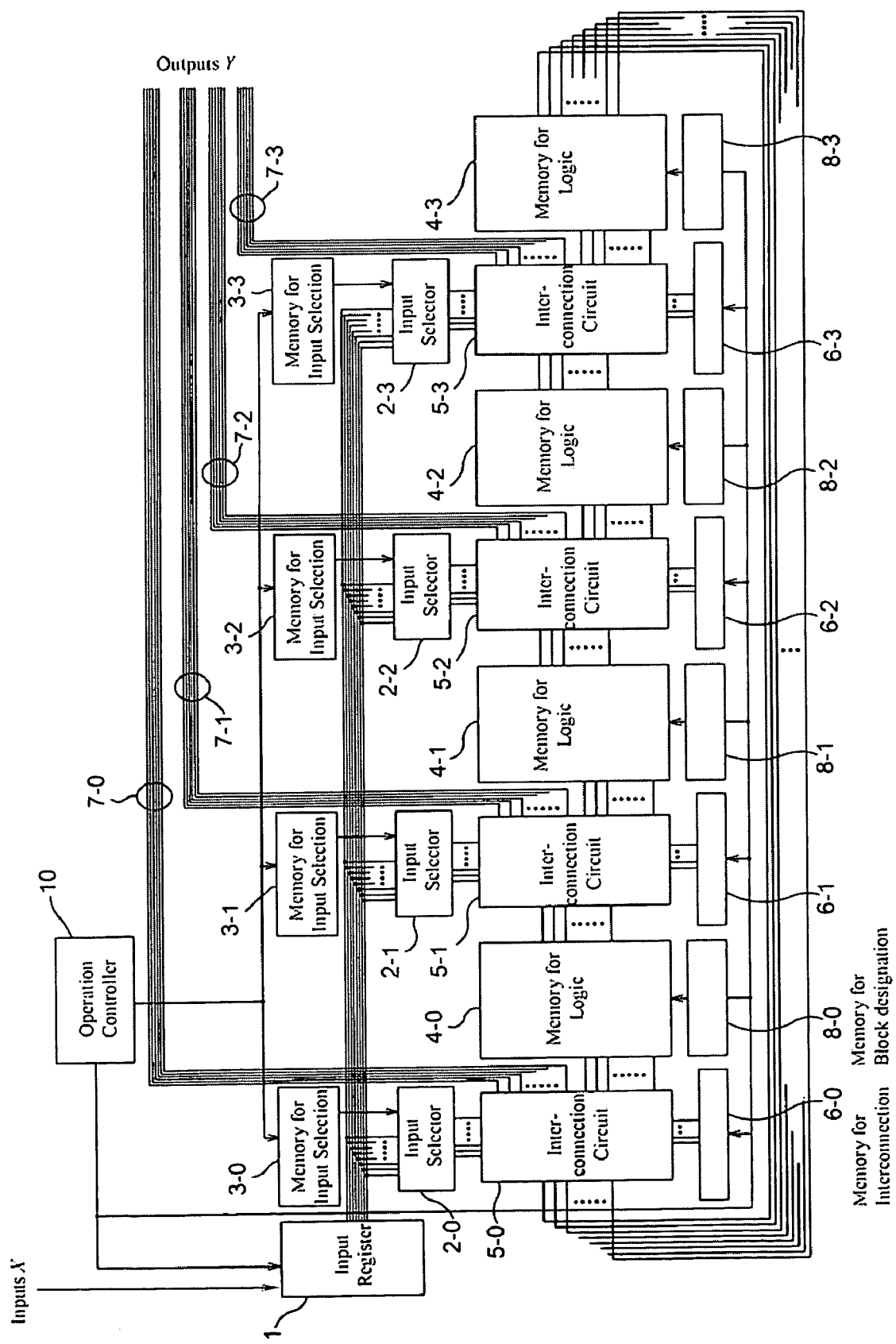
FIG. 25 is a simplified block diagram of the PLD in accordance with EMBODIMENT 7 of the present invention.

FIG. 25 is a simplified block diagram of the PLD in accordance with EMBODIMENT 7 of the present invention.

The PLD for EMBODIMENT 7 in this invention consists of the following components: the input variable register (1); input selectors (2-0)-(2-3); memories for input selection (3-0)-(3-3); memories for logic (4-0)-(4-3); interconnection circuits (5-0)-(5-3); memories for interconnections (6-0)-(6-3); memories for block designation (8-0)-(8-3); and the operation control part 10. In this EMBODIMENT, each circuit must operate synchronously by the common clock.

The input variable register (1) stores the input variable $X=(x_1, \ldots, x_n)$ used for the operation of objective logic function $f(X)$, where n is a natural number. The input variable X is supplied from the external input lines to the input variable register (1). Memories for logic (4-0)-(4-3) store the truth tables of decomposition functions $\{f_i; i\in\{0, 1, 2, 3\}\}$ obtained by decomposing the objective logic function $f$ to store as LUTs. In this EMBODIMENT, the number of levels of memories for logic ($4\text{-}i$, $i\in\{0, 1, 2, 3\}$) is four. However, in general, the number of levels can be different. These memories for logic (4-0)-(4-3) are connected to form a ring through the interconnection circuits (5-0)-(5-3).

The memories for logic (4-0)-(4-3) in this EMBODIMENT are similar to ones used in FIG. 3. The address decoder (16) specifies the memory area $FM_k$ according to the page selection number $p(p_r)$ produced by the memory for block designation ($8\text{-}i$).

Input selectors (2-0)-(2-3) select the input variable $X_i(i\in\{0, 1, 2, 3\})$ of the decomposition functions $\{f_i; i\in\{0, 1, 2, 3\}\}$ stored in the memories for logic (4-0)-(4-3), from the input variable $X=(x_1, \ldots, x_n)$ that come from the input variable register (1); and send the selected signals to the interconnection circuits (5-0)-(5-3). The memories for input selection (3-0)-(3-3) store the information for the input selectors (2-0)-(2-3). From here, such information is denoted by "Information for input selection." Input selectors (2-0)-(2-3) select the input variable according to the input selection signals given by memories for input selection (3-0)-(3-3).

In this EMBODIMENT, the input selectors (2-0)-(2-3) use the shifter shown in FIG. 2. In the input selectors ($2\text{-}i$, $i\in\{0, 1, 2, 3\}$) in FIG. 2, the input terminals (in(00)-in(16)) are connected with the output terminals of the input variable register (1). Therefore, input variables $X=(x_1, \ldots, x_n)$ are supplied from the input terminals (in(00)-in(16)). The output terminals (out(00)-out(07)) of the input selector ($2\text{-}i$, $i\in\{0, 1, 2, 3\}$) are connected to a part of the input terminals of the interconnection circuit ($5\text{-}i$).

Each interconnection circuit ($5\text{-}i$, $i\in\{0, 1, 2, 3\}$) connects and reorder the intermediate variable $Y_i$ that comes from the memory for logic (4-(i−1 mod 4)); and the input variable $X_i$ that comes from the input selector ($2\text{-}i$); and send them to the memory for logic ($4\text{-}i$) of succeeding stage and to the external output lines ($7\text{-}i$). Each memory for interconnections ($6\text{-}i$, $i\in\{0, 1, 2, 3\}$) stores the information concerning the connection of each interconnection circuit ($5\text{-}i$). Hereafter, such information is denoted by "Information for connection." Interconnection circuits ($5\text{-}i$) change the connection according to the information for connection signal produced by the memory for interconnections ($6\text{-}i$).

In this EMBODIMENT, interconnection circuits (5-0)-(5-3) use the cyclic shifter shown FIG. 4, for the convenience of the explanation. In the interconnection circuit ($5\text{-}j$, $j\in\{1, 2, 3\}$) shown in FIG. 4, among the input lines $(i_0-i_{15})$, $(i_0-i_7)$ are connected to the outputs of memories for logic (4-(j−1)) in the preceding stage, and $(i_8-i_{15})$ are connected to the outputs of the input selector ($2\text{-}j$). Moreover, among the input lines $(i_0-i_{15})$ of the interconnection circuit (5-0), $(i_0-i_7)$ are connected to the outputs of the memory for logic (4-3) in the preceding stage, and $(i_8-i_{15})$ are connected to the outputs of the input selector (2-0). In the interconnection circuit (5-*j*, *j*∈{0, 1, 2, 3}), among the output lines ($o_0$-$o_{15}$), ($o_0$-$o_7$) are connected to the inputs of memory for logic (4-*j*) of succeeding stage, and ($o_8$-$o_{15}$) are connected to the external output line (7-*j*).

In this EMBODIMENT, the memories for interconnections (6-*i*, *i*∈{0, 1, 2, 3}), are similar to ones used in FIG. 5.

Each memory for block designation (8-*i*, *i*∈{0, 1, 2, 3}) stores the page number, denoted by "variable for designating block": It shows the area of LUTs in the memory for logic (4-*i*), corresponding to the subfunctions to compute the objective logic function. Memory for logic (4-*i*) sets the page number according to the variable for designating block stored in the memory for block designation (8-*i*).

The operation control part (10) controls the whole operation process of the PLD.

Figure 26:
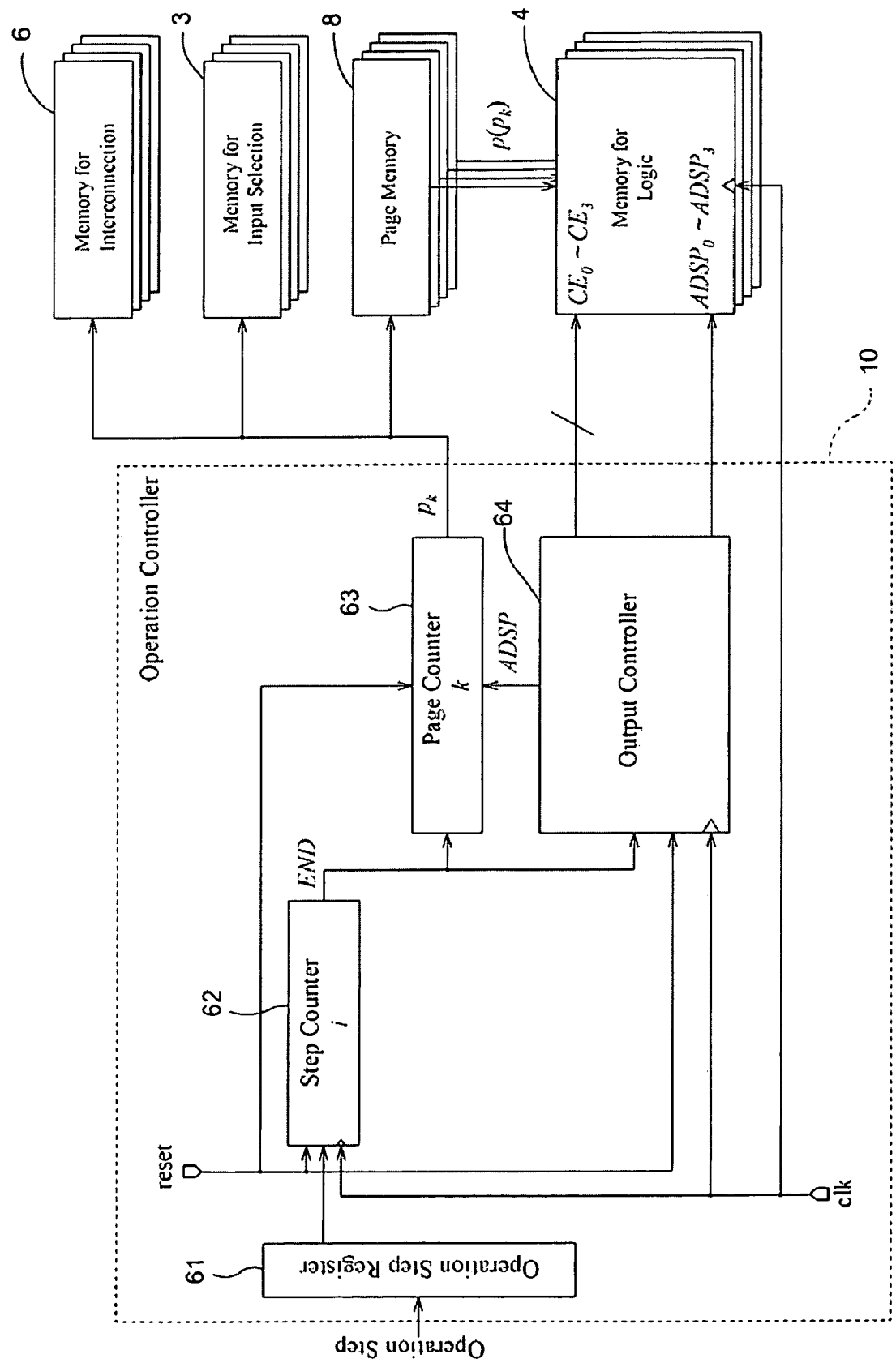
FIG. 26 is a block diagram of operation control part 10 in FIG. 25.

FIG. 26 is a block diagram of the operation control part (10) shown in FIG. 25.

The operation control part (10) consists of the following parts: the operation step register (61); the step counter (62); the page counter (63); and the output controller (64).

The operation step register (61) stores the number of operation steps, which is equal to the number of decomposed functions. The step counter (62) shows the decomposition function where the current operation is done. At the beginning, the value stored in the operation step register (61) is loaded to the step counter (62). For each step of the operation, the count is decremented by one, by the down counter. When i, the value of the counter becomes 0, the step counter (62) produces the termination signal END. Moreover, the value in the operation step register (61) is loaded to the step counter (62) when the reset signal reset is applied.

The page counter (63) stores the page number of each memory: It specifies the page numbers of the memories for input selection (3); the memories for interconnections (6); and the memories for block designation (8). It produces the value k as the count signal $p_k$. The page counter (63) is the up counter, and increments the count k when it detects the falling edge of the chip enable signal $CE_3$, or it receives the signal from the output controller (64). The page counter (63) is reset to the value k to 0, when it receives the reset signal reset or the termination signal END, from the step counter (62).

The output controller (64) controls the memories for logic (4-0)-(4-3) by sending the chip enable signals ($CE_0$-$CE_3$) and address strobe signals ($ADSP_0$-$ADSP_3$).

The chip enable signal $CE_i$ activates the i-th memory for logic (4-*i*). The memory for logic (4-*i*) can receive the input signal from the outside and produce the output when the chip enable signal $CE_i$ is 1 (high). The address strobe signal $ADSP_i$ controls the latches, which store the input address for the memory for logic (4-*i*). In the clock edge, when the address strobe signal $ADSP_i$ is 1, the memory for logic (4-*i*) sets the data in the input lines (i(00)-i(07)) to the internal address register. Moreover, latch stores the address in the internal address register when the address strobe signal $ADSP_i$ changes from 1 to 0. When the chip enable signal $CE_i$ is 0 (low), even if the value of $ADSP_i$ is 1, the data in the input lines (i(00)-i(07)) are not latched.

Figure 27:
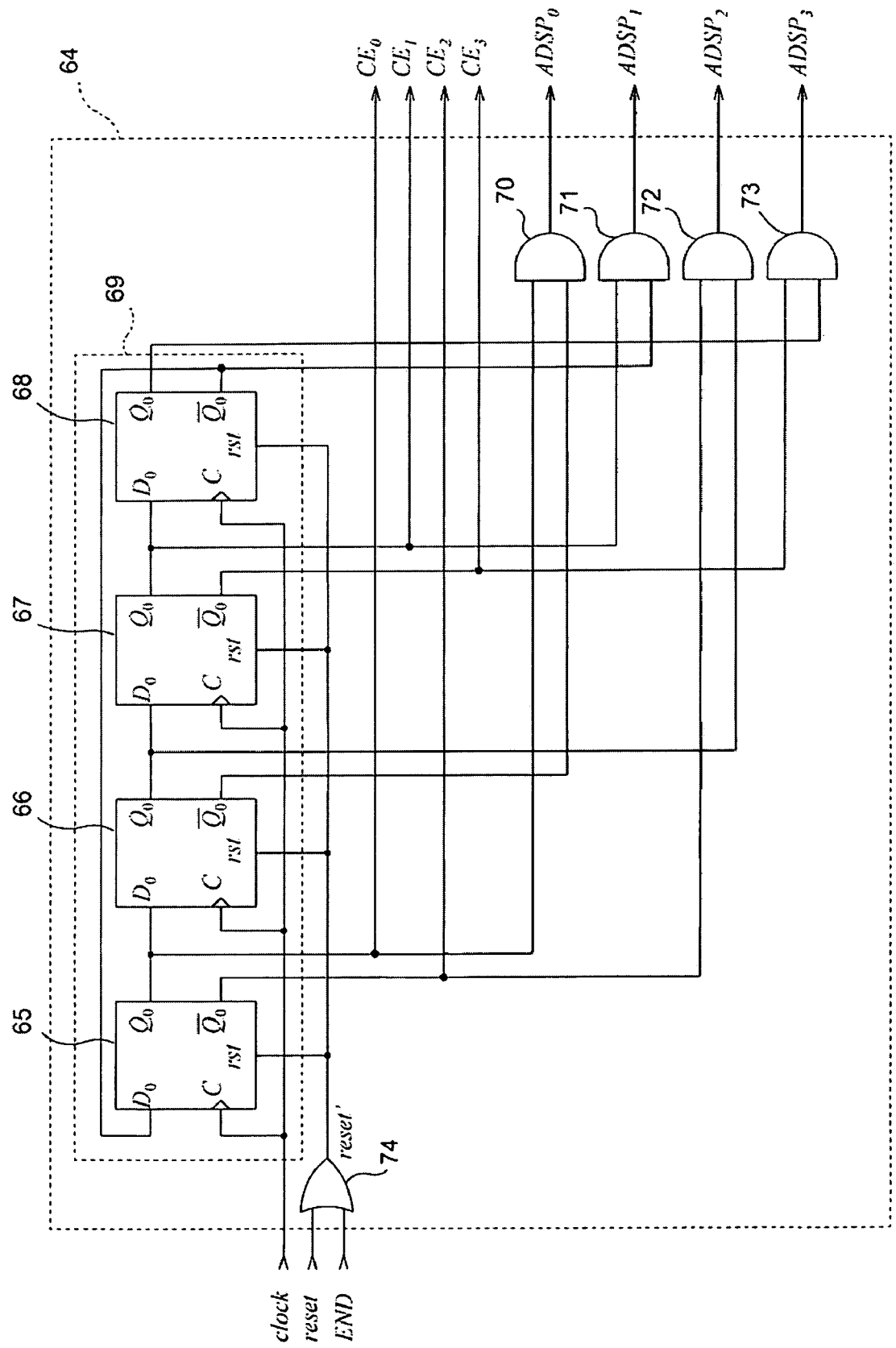
FIG. 27 is a schematic diagram showing the structure of the inside of output controller 64 in FIG. 26.

FIG. 27 is a schematic diagram showing the detail of the output controller (64) in FIG. 26.

The output controller (64) consists of the following components: the Johnson counter (69) that consists of four flip-flops (65)-(68), denoted by "FF"; four AND gates (70)-(73); and one OR gate (74).

To the clock terminals C of FFs (65)-(68), a common clock signal clock is supplied. Moreover, the outputs of FFs (65, 66, 67, 68): $Q_0$, $Q_1$, $Q_2$, and NOT($Q_3$), are connected to the data inputs ($D_1$, $D_2$, $D_3$, $D_0$) of FFs (65, 66, 67, 68). Moreover, the OR gate (74) produces reset signal reset', the logical OR of the reset signal reset and the termination signal END. The reset signal reset' is connected to the reset terminal rst of FFs (65)-(68).

By constructing the circuit in this way, the outputs ($Q_0$, $Q_1$, $Q_2$, $Q_3$) of Johnson counter (69) perform the cyclic transition as follows:

(0,0,0,0)
→(1,0,0,0)
→(1,1,0,0)
→(1,1,1,0)
→(1,1,1,1)
→(0,1,1,1)
→(0,0,1,1)
→(0,0,0,1)
→(0,0,0,0)

for each rising clock signal clock. That is, for each clock, the content of the register is shifted to the right by 1-bit, and the leftmost bit ($Q_3$) is reversed to make the rightmost bit ($Q_0$).

The outputs ($Q_0$, $Q_2$) of FFs (65, 67) are used as the chip enable signals ($CE_0$, $CE_1$). Moreover, the outputs (NOT($Q_0$), NOT($Q_2$)) of FFs (65, 67) are used as the chip enable signals ($CE_2$, $CE_3$). Here, NOT($Q_i$) denotes the complement of the output $Q_i$.

The AND gate (70) makes the logical product $Q_0$ and NOT($Q_1$), produced by FFs (65, 66), and generates the strobe signal $ADSP_0$. The AND gate (71) makes the logical product $Q_2$ and NOT($Q_3$), produced by FFs (67, 68), and generates the strobe signal $ADSP_1$. The AND gate (72) makes the logical product NOT($Q_0$) and $Q_1$, produced by FFs (65, 66), and generates the strobe signal $ADSP_2$. The AND gate (73) makes the logical product NOT($Q_2$) and $Q_3$, produced by FFs (67, 68), and generates the strobe signal ADSP3.

The memories for logic (4-0)-(4-3) are in the low power mode when the chip enable signals ($CE_0$-$CE_3$) are 0. As a result, the power dissipation of memories for logic (4) not used for the operation are reduced, and the whole PLD can be made to low power.

Figure 28A:
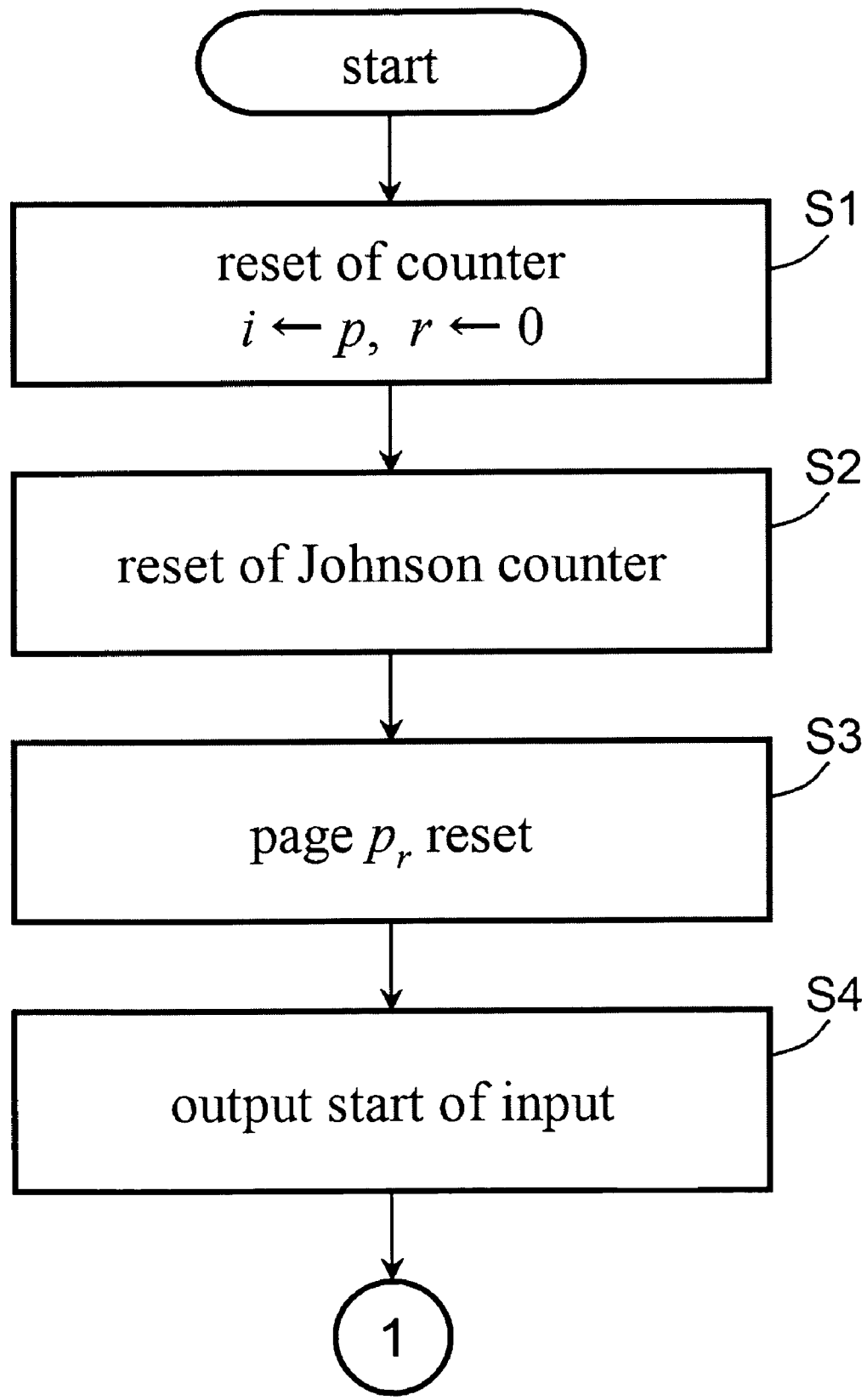
FIGS. 28(*a*) and 28(*b*) are a flowchart showing the operation of the PLD in accordance with EMBODIMENT 7.
Figure 28B:
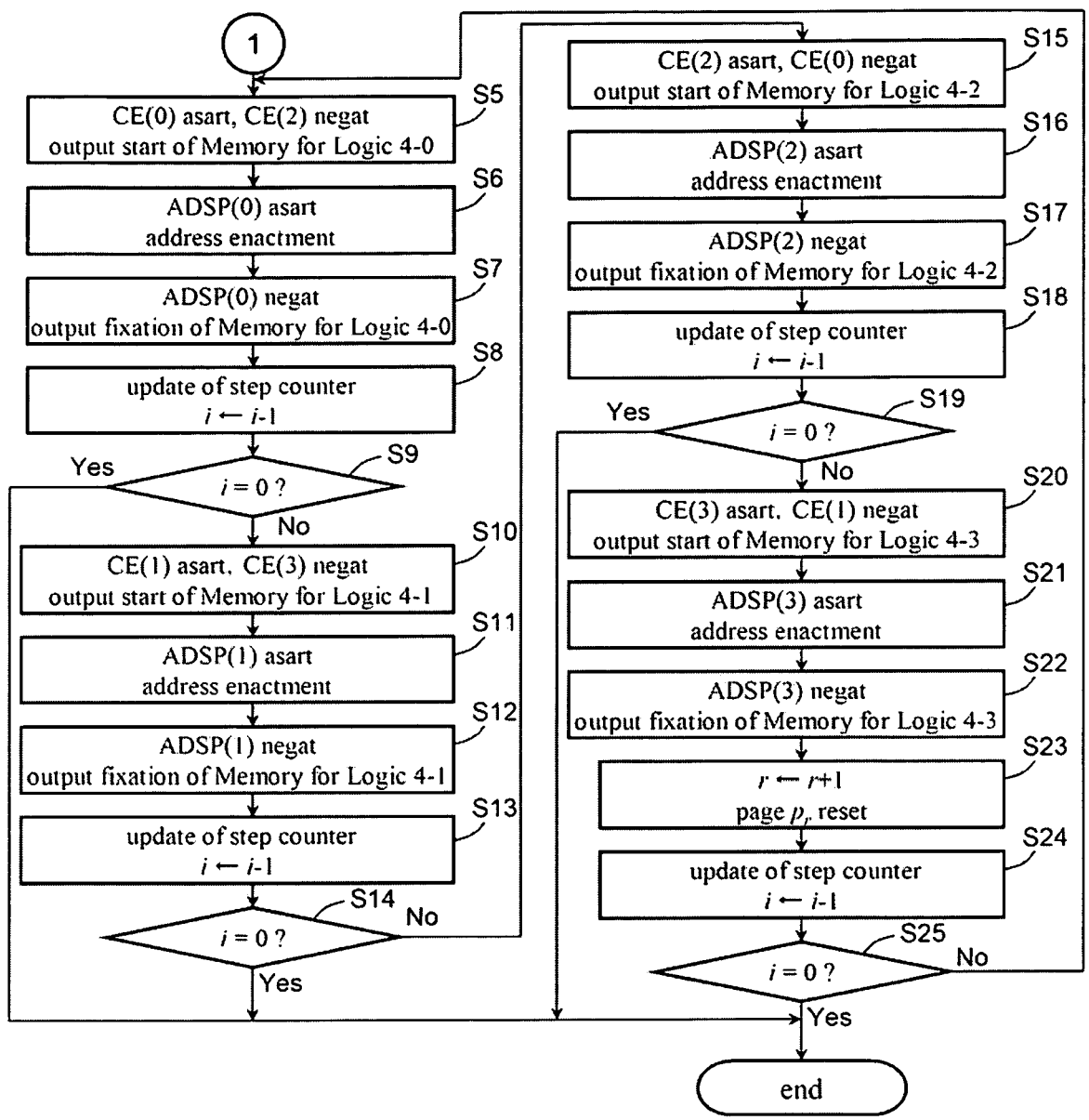
Figure 29:
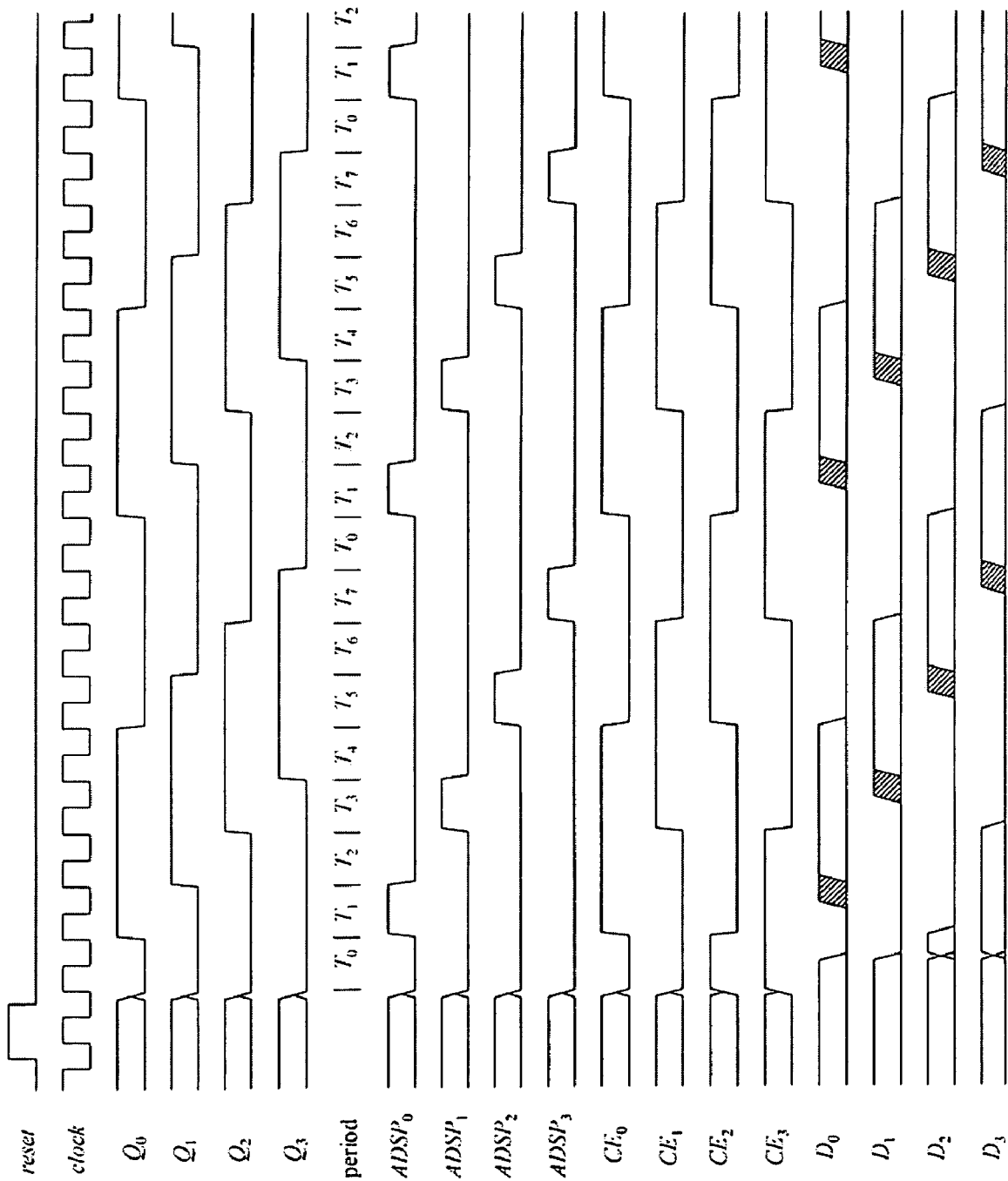
FIG. 29 is a timing chart for describing the change of each signal for the PLD in accordance with EMBODIMENT 7.

In the above-mentioned EMBODIMENT, the PLD operates as follows:

FIG. 28 is a flowchart showing the operation of the PLD in accordance with EMBODIMENT 7. FIG. 29 is a timing chart for describing the change of each signal for the PLD in accordance with EMBODIMENT 7.

At the beginning, the truth tables of subfunctions {$f_0$, ..., $f_{s-1}$} (1≦s) that are obtained by decomposing the objective logic function $f(X)$, are written on memories for logic (4-0)-(4-3) as LUTs. In this case, LUTs that show $f_i$ (i=0, 1, ..., s−1) are written in the int(i/4)-th page of the memory for logic (4-(i mod 4)). We need not write the same LUT data in different pages of the same memory for logic (4), but need to write only one LUT data in one of the pages. We can reduce the necessary amount of memory by the "multiple use of LUTs." In the memories for input selection (3-0)-(3-3), and the memories for interconnections (6-1)-(6-3), information for input selection and information for connection, corresponding to above-mentioned decomposition functions {$f_0$, ..., $f_{s-1}$} are written from the 0-th page. The j-th page of the memory for block designation (8-*i*, *i*∈{0, 1, 2, 3}), stores the page number p of the memory for logic (4-*i*): The memory for logic stores the LUT corresponding to the decomposition function $f_i*_{4+j}$ (where 0<=i*4+j<=s−1). The method to write the data into memories is an ordinary method: The writing mechanism is omitted in FIG. 25, for simplicity. In addition, the operation step register (61) in the operation control part (10), stores s, the number of levels of the decomposition functions. In the following explanation, we assume that s>4.

Assume that the above information is written in the memories. First of all, during the time period $T_0$, in the operation control part (10), by the reset signal supplied from the outside, the count value i of the step counter (62) is initialized; and the count value p of the page counter (63) are reset (S1). At this time, the count value i of step counter (62) is initialized to the value s stored in the operation step register (61); and the count value p in the page counter (63) is initialized to 0. Moreover, FFs (65)-(68) of the output controller (64) in the operation control part (10) is reset by reset signal reset(S2).

At this time, the Johnson counter (69) consisting of FFs (65)-(68) produces the output values: $(Q_0, Q_1, Q_2, Q_3)$=(0, 0, 0, 0), and $(NOT(Q_0), NOT(Q_1), NOT(Q_2), NOT(Q_3))$=(1, 1, 1, 1). Therefore, the output controller (64) produces the chip enable signal $(CE_0, CE_1, CE_2, CE_3)$=(0, 0, 1, 1) to memories for logic ((4-0), (4-1), (4-2), (4-3)). Moreover, the page counter (63) sends 0 to the memories for input selection (3-0)-(3-3); to memories for interconnections (6-0)-(6-3); and to the memories for block designation (8-0)-(8-3), as the count signal pk (S3).

The memories for input selection (3-i, i∈{0, 1, 2, 3}) send the information for input selection stored in the 0-th page, to the control lines (shf0-shf3) of the input selectors (2-i). The input selector (2-i) electrically connects a part of the input terminals (in(00)-in(16)) with the output terminals (out(00)-out(07)), according to the information for input selection in the input to control lines (shf0-shf3).

The memories for interconnections (6-i, i∈{0, 1, 2, 3}) produce information for connection $(s_{Nc-1}^{(0)}, \ldots, s_0^{(0)})$ stored in the 0-th page, and send it to the interconnection circuit (5-i). As a result, the interconnection circuit (5-i) connects input lines ($i_8$-$i_{15}$) with the output lines ($o_0$-$o_7$), according to the information for connection (s3(0), . . . , s0(0)) supplied by the control lines.

In addition, memories for block designation (8-i, i∈{0, 1, 2, 3}) produce the variable for designating block p(0) stored in the 0-th page, and send to the address decoder (16) in the memory for logic (4-i). As a result, in the memory for logic (4-i), the p(0)-th page is ready to be selected.

The input variable register (1) begins to produce the values of the input variables to the input selectors (2-0)-(2-3) (S4). As a result, input variables $X_0$, $X_1$, $X_2$, and $X_3$ are sent to the interconnection circuits (5-0)-(5-3). Input variables $X_0$, $X_1$, $X_2$, and $X_3$ sent to the interconnection circuit (5-i, i∈{0, 1, 2, 3}) are transferred to the inputs of the memory for logic (4-i), according to the predetermined connection order.

In the period $T_1$, the outputs $(Q_0, Q_1, Q_2, Q_3)$ of the Johnson counter (69) are changed into (1, 0, 0, 0) with the rising edge of the following clock signal clock. As a result, $CE_0$ becomes 1, and the memory for logic (4-0) becomes an accessible state, and $CE_2$ becomes 0. Therefore, the data $D_0$ begins to be sent from the memory for logic (4-0) (S5).

Almost at the same time with this, $ADSP_0$, the output of AND gate (70) becomes 1. When $ADSP_0$ becomes 1, in the memory for logic (4-0), the internal address register is set, based on the input variable $X_0$ supplied from the interconnection circuit (5-0) (S6). Then, the memory for logic (4-0) begins to send the values of LUT (intermediate variable $Y_{4p+(s-i)}$), corresponding to the address specified in the 0-th page, to the interconnection circuit (5-1). The intermediate variables $Y_{4p+(s-i)}$, that are sent to the interconnection circuit (5-1), are sent to the memory for logic (4-1), according to the specified connection relations. In some cases, a part of the intermediate variable $Y_{4p+(s-i)}$ is sent to the external output lines (7-1). At the end of the period $T_1$, the value of $ADSP_0$ falls from 1 to 0, and the data are latched in the address register in the memory for logic (4-0).

During the period $T_2$, when the following clock signal clock rise after $ADSP_0$ become 1, the outputs $(Q_0, Q_1, Q_2, Q_3)$ of the Johnson counter (69) will be (1, 1, 0, 0). As a result, $ADSP_0$ becomes 0 (S7). Thus, the value of output data $D_0$ of the memory for logic (4-0), is settled to the value of the intermediate variable $Y_{4p+(s-i)}$. On the other hand, because $Q_0$=1 at this time, $CE_0$ is set to 1.

During the period $T_3$, with the rise of the next clock signal clock, the step counter (62) decrement the value i of the counter (S8). Also, in this moment, the value of the Johnson counter (69) becomes $(Q_0, Q_1, Q_2, Q_3)$=(1, 1, 1, 0).

When the value i of the step counter (62) is non-zero (S9), with the transition of $Q_2$ into 1, the value of $CE_1$ becomes 1, and the value of $CE_3$ becomes 0. With this, the output data $D_1$ will be sent out from the output lines of the memory for logic (4-1) (S10).

Also, at the same time, $ADSP_1$, which is the output of AND gate (71), becomes 1 (S11). As a result, in the memory for logic (4-1), the address is set, based on the intermediate variables generated by the memory for logic (4-0) of the preceding stages through the interconnection circuit (5-1), and the new input variables. With the setting of this address value, the output data D1 of the memory for logic (4-1) changes, and the values of the LUT (the intermediate variables $Y_{4p+(s-i)}$), that correspond to the address stored in the pk-th page are sent to the interconnection circuit (5-2).

During the period $T_4$, with the rise of the following clock signal clock, the values of Johnson counter (69) becomes $(Q_0, Q_1, Q_2, Q_3)$=(1, 1, 1, 1). As the result, ADSP1, that is the output of AND gate (71) becomes 0, and the output data $D_1$ of the memory for logic (4-1) is used to settle the intermediate variable $Y_{4p+(s-i)}$ (S12). The intermediate variables $Y_{4p+(s-i)}$, that are sent to the interconnection circuit (5-2) are transferred to the memory for logic (4-2), according to the connection relationship. Moreover, in some cases, a part of the intermediate variables $Y_{4p+(s-i)}$ is transmitted to the external output lines (7-2).

Next, in the period $T_5$, with the rise of the following signal "clock" the step counter (62) decrement the count value i (S13). In this case, the value of the Johnson counter (69) becomes $(Q_0, Q_1, Q_2, Q_3)$=(0, 1, 1, 1).

In this case, when the value i of the step counter (62) is non-zero (S14), if the value of the output $Q_0$ changes to 0, then $CE_2$ becomes 1 and $CE_0$ becomes 0. With this, the memory for logic (4-0) stops to produce the outputs, but the memory for logic (4-2) produces the output data $D_2$ from the output lines (S15).

Almost at the same time with this, $ADSP_2$, that is the output of AND gate (72) becomes 1 (S16). As a result, in the memory for logic (4-2), address is set based on the intermediate variable that comes from the memory for logic (4-1) in the preceding stages through the interconnection circuit (5-2), and new input variables. With the setting of the address, the output data $D_2$ of the memory for logic (4-2) changes, and the values of the LUT (the intermediate variable $Y_{4p+(s-i)}$) corresponding to the address stored in the pk-th page are sent to the interconnection circuit (5-3).

During the period $T_6$, with the rise of the following clock signal "clock," the values of Johnson counter (69) become $(Q_0, Q_1, Q_2, Q_3)$=(0, 0, 1, 1). As a result, $ADSP_2$, that is the output of AND gate (72) becomes 0, and the output data $D_2$ of the memory for logic (4-2) is settled to the intermediate variable $Y_{4p+(s-i)}$ (S17). The intermediate variables $Y_{4p+(s-i)}$, that are sent to the interconnection circuit (5-3), are transferred to the memory for logic (4-3), according to the specified connection relationship. In some cases, a part of the intermediate variables $Y_{4p+(s-i)}$ is transmitted to the external output line (7-3).

In the next, during the period $T_7$, the step counter (62) decrement the count value i with the rise of the following clock signal clock in (S18). In this time, the value of the Johnson counter (69) becomes $(Q_0, Q_1, Q_2, Q_3)=(0, 0, 0, 1)$.

When the value i of the step counters (62) is non-zero (S19), if the value of the output $Q_2$ changes to 0, then $CE_3$ becomes 1, and $CE_1$ becomes 0. With this, the memory for logic (4-1) stops to produce the output, and the memory for logic (4-3) produces the output data $D_3$ from the output lines (S20).

Almost at the same time with this, $ADSP_3$, that is the output of AND gate (73) becomes 1 (S21). As a result, in the memory for logic (4-3), address is set based on the intermediate variable produced by the memory for logic (4-2) in the preceding stage, through the interconnection circuit (5-3), and the new input variables. Along with the setting of the address, the output data $D_3$ of the memory for logic (4-3) changes, and the values of LUT (intermediate variable $Y_{4p+(s-i)}$) corresponding to the address that are stored in the pk-th page begin to be sent to the interconnection circuit (5-0).

During the period $T_0$, with the rise of the following clock signal "clock" the value of the Johnson counter (69) becomes $(Q_0, Q_1, Q_2, Q_3)=(0, 0, 0, 0)$. As a result, $ADSP_3$, that is the output of AND gate (73) becomes 0, and the output data $D_3$ of the memory for logic (4-3) is settled to the intermediate variable $Y_{4p+(s-i)}$ (S22). The intermediate variables $Y_{4p+(s-i)}$ sent to the interconnection circuit (5-0) are transferred to the memory for logic (4-0), according to the specified connection relationship. In some cases, a part of the intermediate variable $Y_{4p+(s-i)}$ is sent to the external output lines (7-0).

In this time, the page counter (63) increments the count value p (S23). With this, the count signal $p_p$ is incremented by one, and the pages for the memories for input selection (3-0)-(3-3); the memories for interconnections (6-0)-(6-3); and the memories for block designation 8-0)-(8-3) are changed. With this, the connections in the input selectors (2-0)-(2-3) and in the interconnection circuits (5-0)-(5-3), also change. Even if the page that specifies the memories for block designation (8-0)-(8-3) changes, the actual page change occurs only when the each memory for logic can accepts the change of the address: In this state, both the chip enable signal $CE_i$ and the address strobe signal $ADSP_i$ must be 1.

During the period $T_1$, with the rise of the following clock signal "clock" the step counter (62) decrement the count value i (S24). Moreover, in this moment, the output value for $Q_0$ of the Johnson counter (69) becomes one.

Here, if the value i of the step counters (62) is non-zero (S25), the operation goes to step S5.

In the above steps S9, S14, S19, and S25, if the value of the step counter (62) is zero, then the step counter (62) produces the termination signal END. As a result, the operation control part (10) stops the operation, and the operation terminates.

As described above, the operation is done from the front stage to the rear stage in series. And, when the operation process in the memory for logic (4-3) in the final steps terminates, the intermediate variables produced from the memory for logic (4-3) are fed back to the memory for logic in the front stage: the operation process repeats until the operations to all the decomposition functions are finished. Finally, the results of objective logic function $f$ are taken out from the external output lines (7-1)-(7-4).

To explain the concrete operation of the PLD, by using the concrete illustration, we will explain the above-mentioned operation:

EXAMPLE 2

In this part, we explain an example of implementation of the adder for two binary numbers of 2n-bits ($n \geq 5$): $A=(a_{2n-1}, a_{2n-2}, \ldots, a_1, a_0)$ and $B=(b_{2n-1}, b_{2n-2}, \ldots, b_1, b_0)$. To implement the adder, we use the above-mentioned PLD. We assume that the adder accepts $c_{in}$, the carry propagation input bit from the lower bit position.

$$\begin{array}{rccccc}
 & a_{2n-1} & a_{2n-2} & \ldots & a_1 & a_0 \\
 & b_{2n-1} & b_{2n-2} & \ldots & b_1 & b_0 \\
+) & & & & & c_{in} \\
\hline
c_{out} & S_{2n-1} & S_{2n-2} & \ldots & S_1 & S_0
\end{array} \quad (11)$$

Here, the carry input bit $c_{in}$ is the bit showing the carry propagation from the adder of the lower bit position when we add larger numbers that require more than 2n bits. In such a case, we connected the adders in series to do the addition. The carry output bit $c_{out}$ is the bit showing the carry propagation output to the higher bit adder.

In this example, similar to FIG. 2, we assume that the input selectors (2-0)-(2-3) consist of (2n+1)-input eight-output shifters: The shifters are serially connected in $\log_2(2n+1)$ stages (when $\log_2(2n+1)$ is not an integer, it is rounded up).

Figure 30:
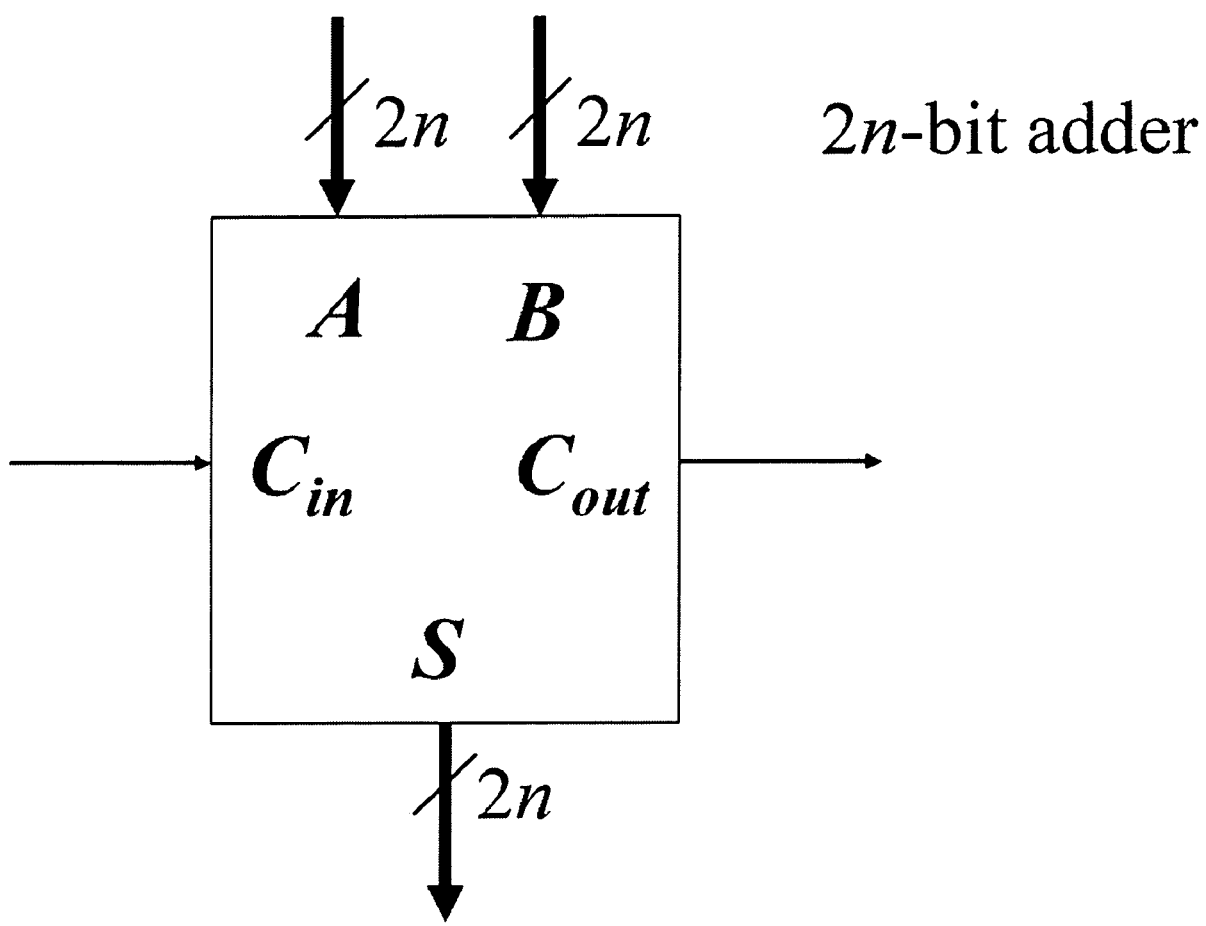
FIG. 30 illustrates the adder for two 2n-bit binary numbers A and B.
Figure 31:
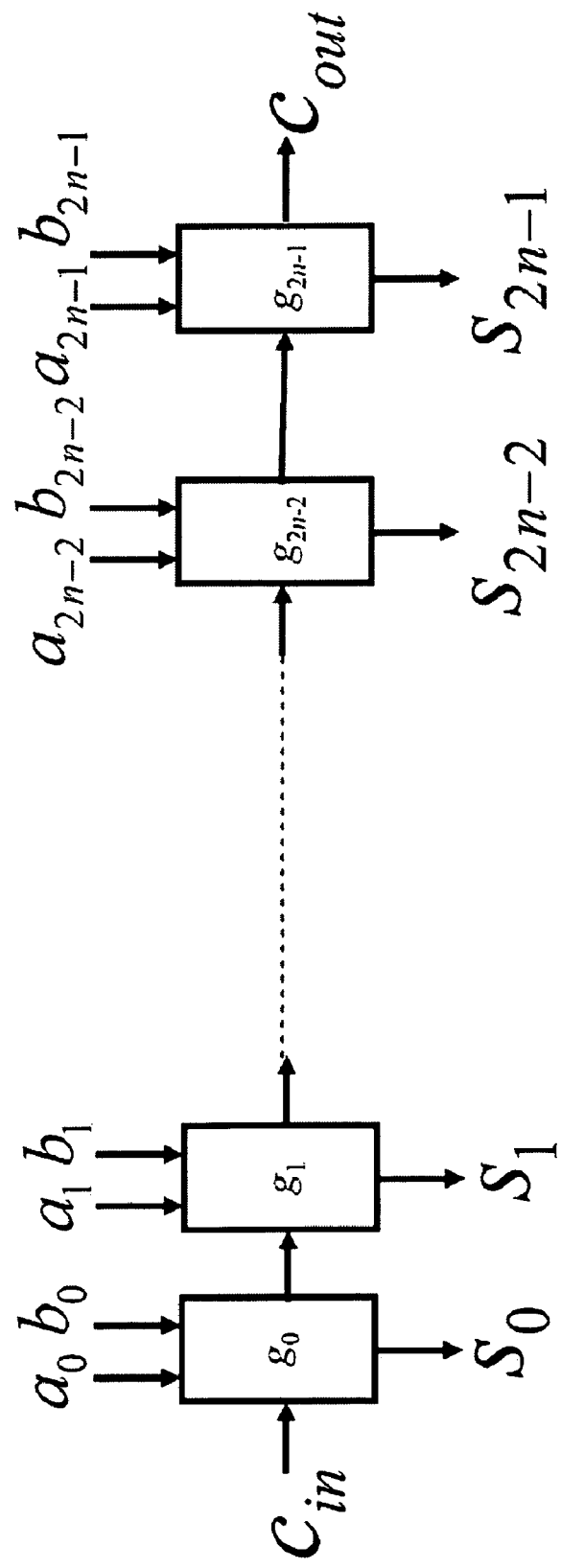
FIG. 31 illustrates functional decomposition of a 2n bit adder for A and B: decomposed into 2n subfunctions $\{g_0, g_1, \ldots, g_{2n-1}\}$.

Let $f=f(X)$ ($X=(A,B)$), be the logic function that performs the addition of two binary numbers of 2n-bits, A and B. Then, the logic function $f$ is shown in FIG. 30. This function can be decomposed into 2n subfunctions $\{g_0, g_1, \ldots, g_{2n-1}\}$ as shown in FIG. 31, where each subfunction can be represented by the logical expressions: Eq. (12) and Eq. (13).

$$g_0 = [c_{out}^{(0)}, S_0] \quad (12)$$
$$= [a_0 b_0 \lor a_0 c_{in} \lor b_0 c_{in}, a_0 \oplus b_0 \oplus c_{in}]$$

$$g_i = [c_{out}^{(i)}, S_i] \quad (13)$$
$$= [a_i b_i \lor a_i c_{out}^{(i-1)} \lor b_i c_{out}^{(i-1)}, a_i \oplus b_i \oplus c_{out}^{(i-1)}]$$
$$(i = 1, 2, \ldots, 2n-1)$$

That is, one of the subfunctions represents the sum $S_i$ of three numbers: two input variables $a_i$, $b_i$ and the intermediate variables $c_{out}^{(i-1)}$ that shows the carry propagation; and the other subfunction represents the carry output $c_{out}^{(i)}$ of the three numbers: two input variables $a_i$, $b_i$ and the intermediate variables $c_{out}^{(i-1)}$ that shows the carry propagation.

Figure 32:
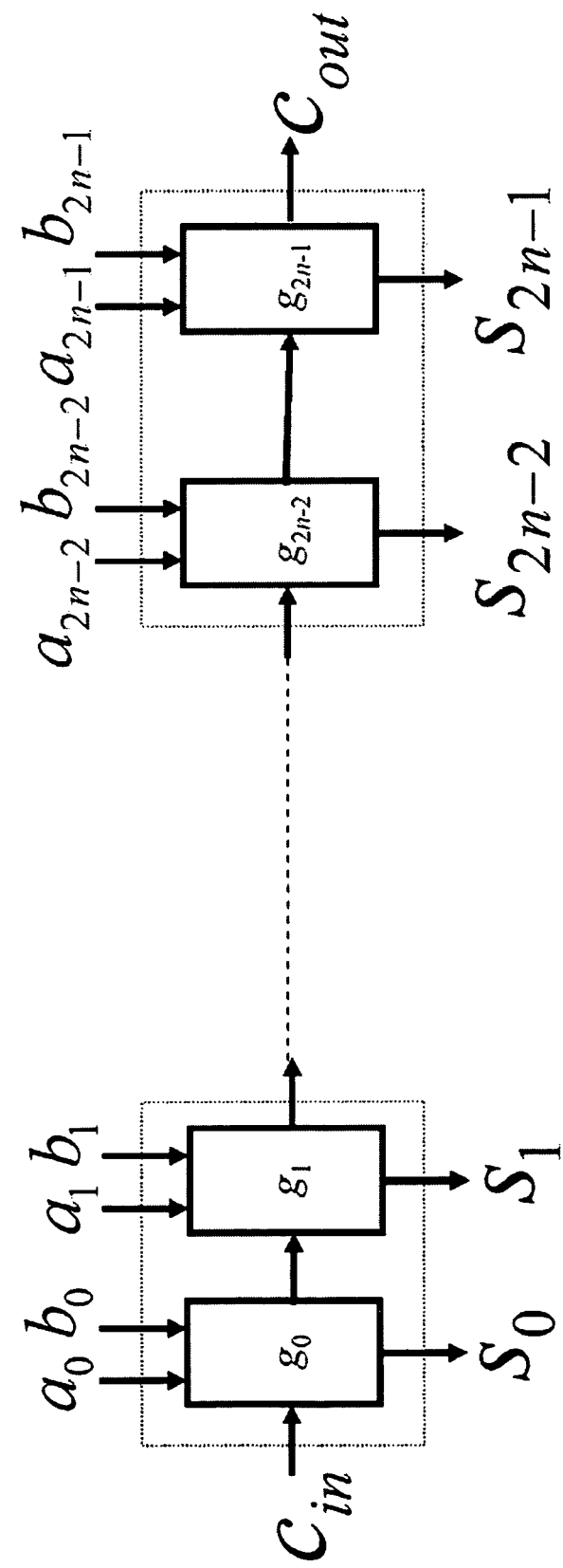
FIG. 32 illustrates functional decomposition of a 2n bit adder for A and B: decomposed into 2n subfunctions $\{g_0, g_1, \ldots, g_{2n-1}\}$.
Figure 33:
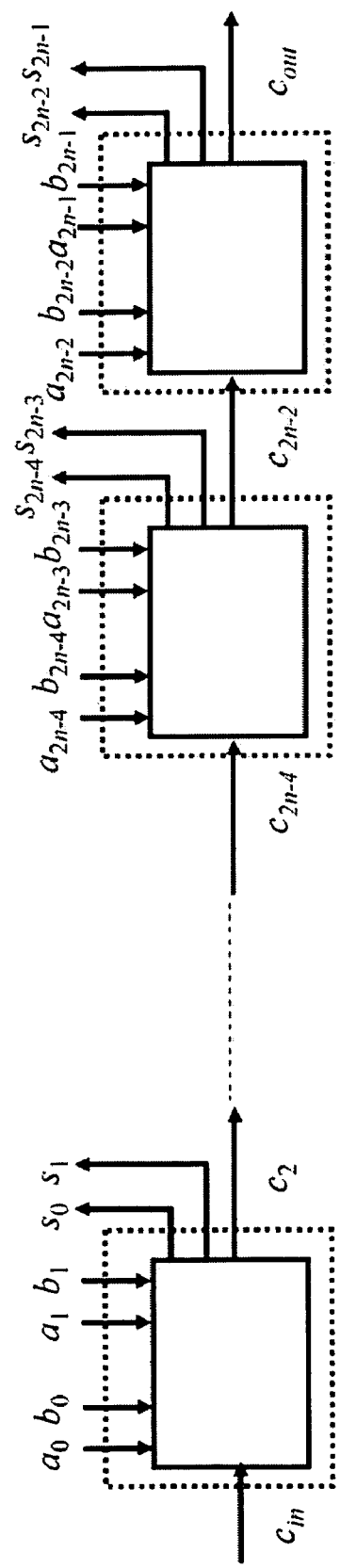
FIG. 33 illustrates functional decomposition of a 2n bit adder for A and B: decomposed into n subfunctions $\{f_0, f_1, \ldots, f_{n-1}\}$.

Assume that such an adder is implemented by the PLD consisting of four stages of the memories for logic (4-0)-(4-3) as shown in FIG. 25. We partition the subfunctions $\{g_0, g_1, \ldots, g_{2n-1}\}$ into n groups as shown in FIG. 32: $\{g_0, g_1\}$, $\{g_2, g_3\}, \ldots, \{g_{2n-2}, g_{2n-1}\}$. Then, as shown in FIG. 33, let the groups of subfunctions be denoted by n subfunctions: $f_0$, $f_1, \ldots$, and $f_{n-1}$. Here, these subfunctions have three inputs and three outputs, and they can be represented by Eq. (14) or Eq. (15).

$$f_0 = [c_{out}^{(0)}, S_1, S_0] \tag{14}$$
$$= [a_1 b_1 \vee (a_1 \vee b_1)(a_0 b_0 \vee a_0 c_{in} \vee b_0 c_{in}),$$
$$a_1 \oplus b_1 \oplus (a_0 b_0 \vee a_0 c_{in} \vee b_0 c_{in}), a_0 \oplus b_0 \oplus c_{in}]$$

$$f_i = [c_{out}^{(i)}, S_{2i+1}, S_{2i}] \tag{15}$$
$$= [a_{2i+1} b_{2i+1} \vee a_{2i+1} \vee b_{2i+1})(a_{2i} b_{2i} \vee a_{2i} c_{out}^{(i-1)} \vee b_{2i} c_{out}^{(i-1)}),$$
$$a_{2i+1} \oplus b_{2i+1} \oplus (a_{2i} b_{2i} \vee a_{2i} c_{out}^{(i-1)} \vee b_{2i} c_{out}^{(i-1)}), a_{2i} \oplus b_{2i} \oplus c_{out}^{(i-1)}]$$
$$(i = 1, 2, \ldots, n-1)$$

Figure 35:
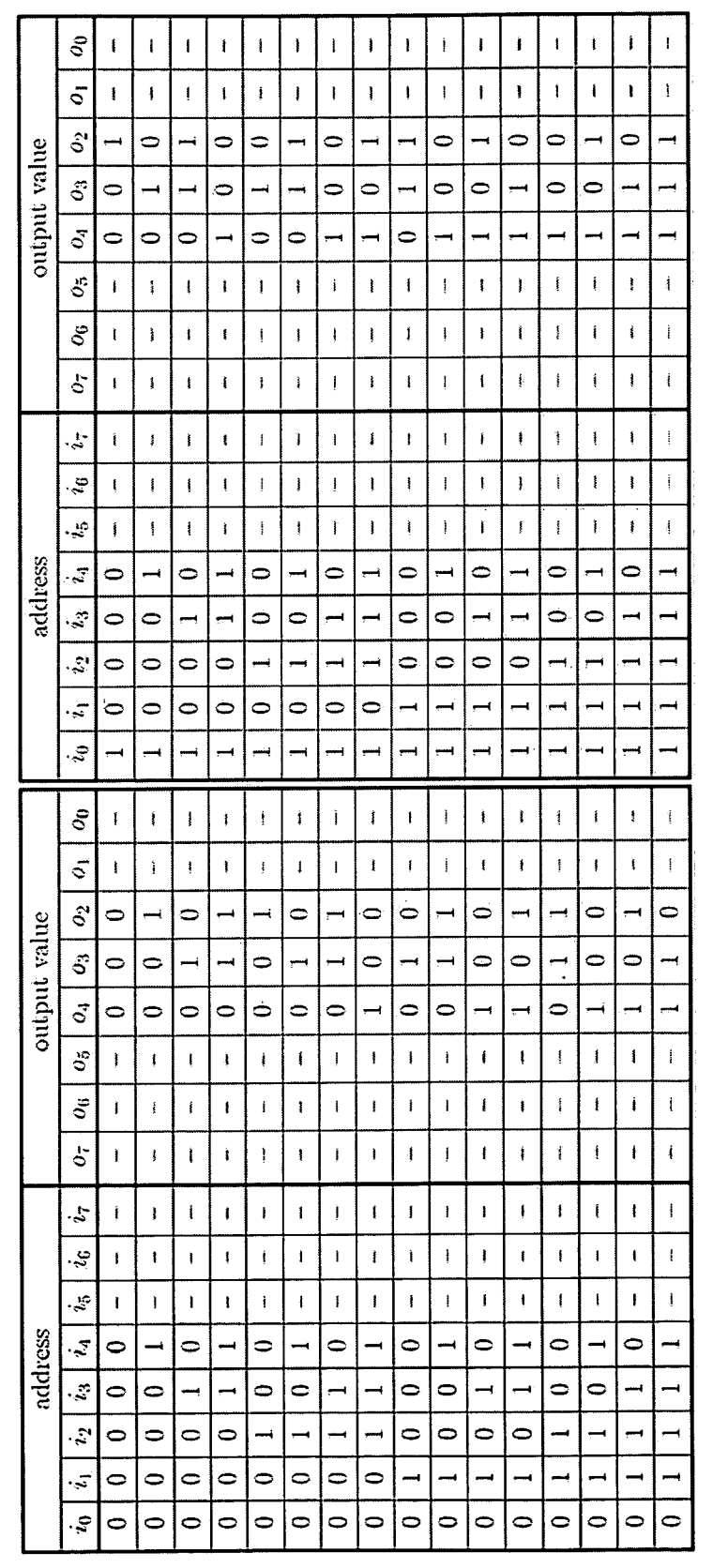
Figure 36:
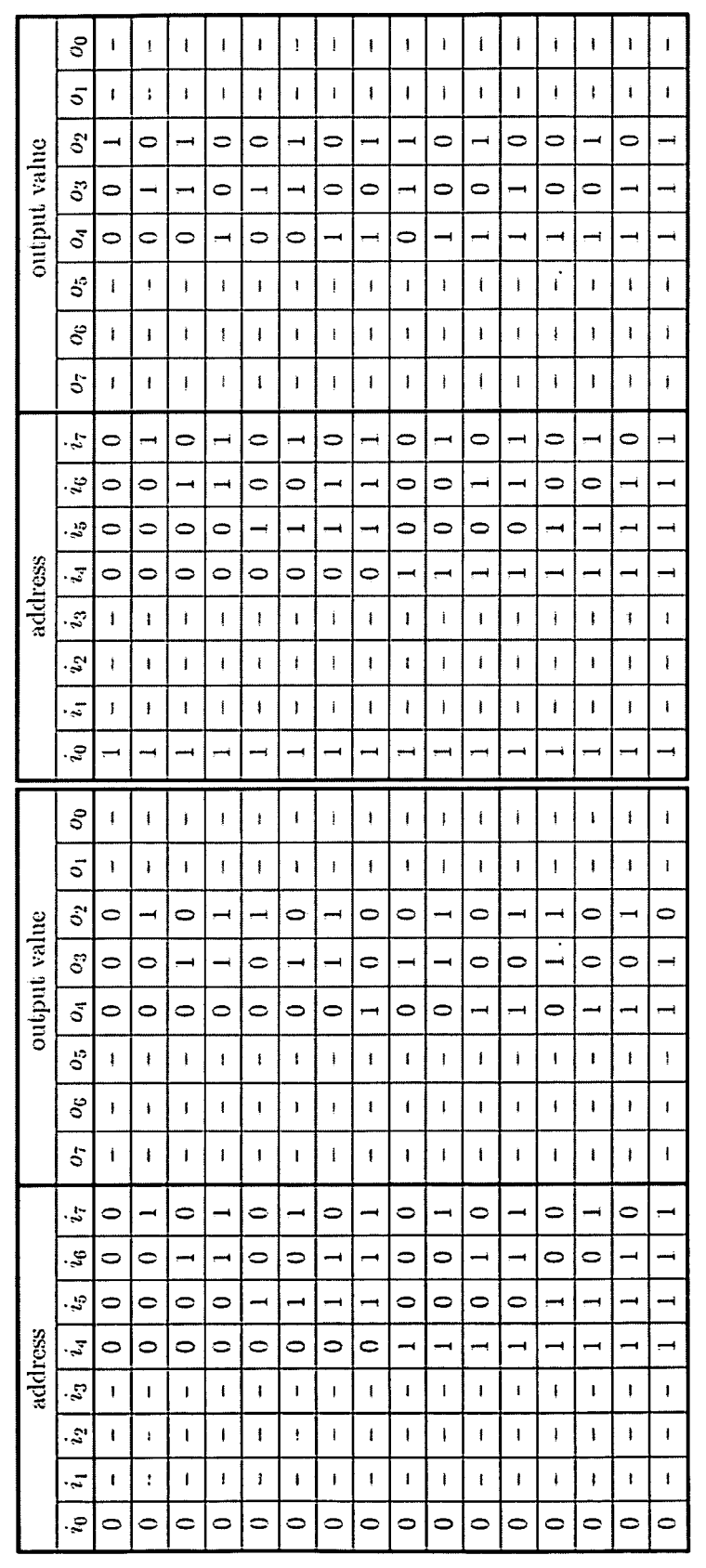

The truth table of each decomposition functions is shown in FIG. 34. Then, the truth table in FIG. 35 is stored in the first page of the memory for logic (4-0), and the truth tables (LUTs) in FIG. 36 are stored in the 0-th page of the memories for logic (4-0)-(4-3). Here, to $S_{2i}$, $S_{2i+1}$, and $c_{out}^{(i)}$ (i∈{1, 2, ..., n−1}), we allocate the output bits of the memory for logic, so that they are sent to the input lines $i_2$, $i_3$, and $i_4$ of the interconnection circuit (5-(i+1)).

In the 0-th page of the memories for input selection (3-0)-(3-3), the information of 0-bit-shift, 5-bit-shift, 9-bit-shift, 13-bit-shift are stored. In the p-th pages ($1 \leq p \leq (n-1)/4$), the information of (16p+1)-bit-shift, (16p+5)-bit-shift, (16p+9)-bit-shift, and (16p+13)-bit-shift is stored.

The 0-th page of the memory for interconnections (6-0) stores the information to shift eight bits. The 0-th page of memories for interconnections (6-1)-(6-3) store the information to shift four bits. The p-th page of memories for interconnections (6-0)-(6-3) stores the information to shift four bits, where ($1 \leq p \leq (n-1)/4$). However, the [n/4]-th page of the memory for interconnections (6-a) (a=n mod 4) stores the information to shift five bits, because the page stores the information for connection of the output variables (five bits) of the decomposition function of the final stage. To shift four bits, we store ($s_3, s_2, s_1, s_0$)=(0, 1, 0, 0); to shift five bits, we store ($s_3, s_2, s_1, s_0$)=(0, 1, 0, 1); and to shift eight bits, we store ($s_3, s_2, s_5, s_0$)=(1, 0, 0, 0), in the memory for interconnections. For example, when n=13, the content of the memory for interconnections (6) is shown in Table 5.

TABLE 5

| Page | Memory for Interconnection 6-0 | Memory for Interconnection 6-1 | Memory for Interconnection 6-2 | Memory for Interconnection 6-3 |
|---|---|---|---|---|
| 0 | (1, 0, 0, 0) | (0, 1, 0, 0) | (0, 1, 0, 0) | (0, 1, 0, 0) |
| 1 | (0, 1, 0, 0) | (0, 1, 0, 0) | (0, 1, 0, 0) | (0, 1, 0, 0) |
| 2 | (0, 1, 0, 0) | (0, 1, 0, 0) | (0, 1, 0, 0) | (0, 1, 0, 0) |
| 3 | (0, 1, 0, 0) | (0, 1, 0, 1) | | |

The variable for designating block in the 0-th page of the memory for block designation (8-0), stores 1. The variables for designating memory area in the 0-th page of memories for block designation (8-1)-(8-3) store 0. The variable for designating block in the p-th page of the memories for block designation (8-0)-(8-3) ($1 \leq p \leq (n-1)/4$) stores 0. For example, when n=13, the content of the memory for interconnections (6) is shown in Table 6.

TABLE 6

| Page | Memory for Interconnection 6-0 | Memory for Interconnection 6-1 | Memory for Interconnection 6-2 | Memory for Interconnection 6-3 |
|---|---|---|---|---|
| 0 | 1 | 0 | 0 | 0 |
| 1 | 0 | 0 | 0 | 0 |
| 2 | 0 | 0 | 0 | 0 |
| 3 | 0 | | | |

We assume that the PLD is programmed as mentioned above. From here, we explain the operation of the PLD. In the following explanations, we assume that n=5, for simplicity.

First of all, to the input variable register (1), variables A, B, and $c_{in}$ are sent, and they are stored in the register (1). Moreover, n=5 is stored in the operation step register (61). And, the operation control part (10) first sets the count value i of the step counter (62) to n=5, and resets the count value k of page counter (63) to 0. In addition, the Johnson counter (69) is reset to 0. As a result, the page counter (63) of the operation control part (10) sets the 0-th page to the memories for the input selection (3-0)-(3-3); the memories for interconnections (6-0)-(6-3); and the memories for block designation (8-0)-(8-3), the 0-th page, as the page selection number $p_r$.

Moreover, input selectors (2-0)-(2-3) connects electrically, eight of the input terminals (in(00)-in(x−1)), with the output terminals (out(00)-out(07)), according to the information for input selection on the control lines.

More precisely, the memory for input selection (3-0) stores the information to connect (in(00)-in(07)) with (out(00)-out(07)); the memory for input selection (3-1) stores the information to shift by five bits, and to connect (in(05)-in(12)) with (out(00)-out(07)); the memory for input selection (3-2) stores the information to shift by nine bits, and to connect (in(09)-in(16)) with (out(00)-out(07)); and the memory for input selection (3-3) stores the information to shift by 13 bits, and to connect (in(13)-in(20)) with (out(00)-out(07)).

Moreover, memories for interconnections (6-0)-(6-3) produce information for connection ($s_3^{(0)}, \ldots, s_0^{(0)}$) stored in the 0-th page to control lines of the interconnection circuits (5-0)-(5-3). The interconnection circuits (5-0)-(5-3) connect input lines (i8-i15) with output lines (o0-o7), according to the information for connections ($s_3^{(0)}, \ldots, s_0^{(0)}$) supplied by the control lines. More precisely, the interconnection circuit (5-0) connects (i8-i15) with (o0-o7) by shifting eight bits, and connects (i0-i7) with (o8-o15). Moreover, the memories for interconnections (6-1)-(6-3) send the signals to the interconnection circuit to connect (i4-i11) with (o0-o7), and to connect (i12-i15) and (i0-i3) with (o8-o15).

Moreover, memories for block designation (8-0)-(8-3) send the variables for designating memory area written in the 0-th page, to address decoders (16) of memories for logic (4-0)-(4-3). As a result, in the memory for logic (4-0), one page becomes an accessible state, and in memories for logic (4-1)-(4-3), one page becomes an accessible state.

Next, the operation control part (10) produces the input variable X by the input variable register (1). At this time, to the input terminals of the input selectors (2-1)-(2-3), the values of the input variable are sent as shown in Table 7.

TABLE 7

| i(00) | i(01) | i(02) | i(03) | i(04) | i(05) | i(06) | i(07) | i(08) |
|---|---|---|---|---|---|---|---|---|
| $c_{in}$ | $a_1$ | $a_0$ | $b_1$ | $b_0$ | $a_3$ | $a_2$ | $b_3$ | $b_2$ |
| i(09) | i(10) | i(11) | i(12) | i(13) | i(14) | i(15) | i(16) | i(17) |
| $a_5$ | $a_4$ | $b_5$ | $b_4$ | $a_7$ | $a_6$ | $b_7$ | $b_6$ | $a_9$ |
| | | | | | | i(18) | i(19) | i(20) |
| | | | | | | $a_{10}$ | $b_9$ | $b_{10}$ |

The input selector (2-0) produces (out(00), out(01), out(02), out(03), out(04))=($c_{in}$, $a_1$, $a_0$, $b_1$, $b_0$), and sends these signals to the input line ($i_8$, $i_9$, $i_{10}$, $i_{11}$, $i_{12}$) of the interconnection circuit (5-0). As for (out(05)-out(07)), since they are not used, they are omitted. The interconnection circuit (5-0) shifts the signals by eight bits, and sends these signals to the output lines ($o_0$, $o_1$, $o_2$, $o_3$, $o_4$). Thus, input variables ($c_{in}$, $a_1$, $a_0$, $b_1$, $b_0$) are sent to the memory for logic (4-0).

Next, the output controller (64) of the operation control part (10) sets $CE_0$ to 1, and makes the memory for logic (4-0) produce the data outputs. Also, it sets $ADSP_0$ to 1, and sets the address ($i_0$, $i_1$, $i_2$, $i_3$, $i_4$, $i_5$, $i_6$, $i_7$)=($c_{in}$, $a_1$, $a_0$, $b_1$, $b_0$, -, -, -) in the address register in memory for logic (4-0). Here, "-" denotes the don't care (can be either 0 or 1). After setting the address, the output controller (64) set $ADSP_0$ to 0.

After setting the address, in the output terminals of the memory for logic (4-0), the values (-, -, $S_0$, $S_1$, $c_{out}^{(0)}$, -, -, -) of the truth values $f_0(c_{in}, a_1, a_0, b_1, b_0)$ stored in address ($c_{in}$, $a_1$, $a_0$, $b_1$, $b_0$, -, -, -) of $LUT(LUT_1)$ on the first page appears, and these values are sent to the interconnection circuit (5-1). That is, (-, -, $S_0$, $S_1$, $c_{out}^{(0)}$, -, -, -) are sent to the input lines ($i_0$, $i_1$, $i_2$, $i_3$, $i_4$, $i_5$, $i_6$, $i_7$) of the interconnection circuit (5-1).

On the other hand, the input selector (2-1) produces (out(00), out(01), out(02), out(03))=($a_3$, $a_2$, $b_3$, $b_2$), and sends these signals to the input lines ($i_8$, $i_9$, $i_{10}$, $i_{11}$) of the interconnection circuit (5-1).

The interconnection circuit (5-1) produces the values shown in Table 8.

TABLE 8

| $o_0$ | $o_1$ | $o_2$ | $o_3$ | $o_4$ | $o_5$ | $o_6$ | $o_7$ |
|---|---|---|---|---|---|---|---|
| $c_{out}^{(0)}$ | — | — | — | $a_3$ | $a_2$ | $b_3$ | $b_2$ |
| $o_8$ | $o_9$ | $o_{10}$ | $o_{11}$ | $o_{12}$ | $o_{13}$ | $o_{14}$ | $o_{15}$ |
| — | — | — | — | — | — | $S_0$ | $S_1$ |

The signals in the output lines ($o8$-$o15$) of the interconnection circuit (5-1) are sent to the external output lines (7-1). Thus, the operation results $S_0$ and $S_1$ are sent to two of the external output lines (7-1).

Next, the step counter (62) in the operation control part (10) decrements the count value i to 4. The output controller (64) in the operation control part (10) sets $CE_1$ to 1, and let the memory for logic (4-1) to produce the output. Also, the output controller (64) sets $ADSP_1$ to 1, and set the address ($i_0$, $i_1$, $i_2$, $i_3$, $i_4$, $i_5$, $i_6$, $i_7$)=($c_{out}^{(0)}$, -, -, -, $a_3$, $a_2$, $b_3$, $b_2$) to the address register in the memory for logic (4-1). After setting the address, the output controller (64) sets $ADSP_1$ to 0. In addition, the output controller (64) sets $CE_0$ to 0, and stops the memory for logic (4-0) to produce the outputs, because the output values of the memory for logic (4-0) of the 0-th stage have been already taken into the address register.

After setting the address, in the output terminals of the memory for logic (4-1), values (-, -, $S_2$, $S_3$, $c_{out}^{(1)}$, -, -, -) of the truth values $f_1(c_{out}^{(0)}, a_3, a_2, b_3, b_2)$ stored in the address ($c_{out}^{(0)}$, -, -, -, $a_3$, $a_2$, $b_3$, $b_2$) of $LUT(LUT_0)$ in the 0-th page appear. Then, these outputs are connected to the interconnection circuit (5-2). That is, to the input lines ($i_0$, $i_1$, $i_2$, $i_3$, $i_4$, $i_5$, $i_6$, $i_7$) of the interconnection circuit (5-2), (-, -, $S_2$, $S_3$, $c_{out}^{(1)}$, -, -, -) are sent.

The input selector (2-2) produces (out(00), out(01), out(02), out(03))=($a_5$, $a_4$, $b_5$, $b_4$), and sends these signals to the input lines ($i_8$, $i_9$, $i_{10}$, $i_{11}$) of the interconnection circuit (5-2).

From the interconnection circuits (5-2), the values shown in Table 9 are produced.

TABLE 9

| $o_0$ | $o_1$ | $o_2$ | $o_3$ | $o_4$ | $o_5$ | $o_6$ | $o_7$ |
|---|---|---|---|---|---|---|---|
| $c_{out}^{(1)}$ | — | — | — | $a_5$ | $a_4$ | $b_5$ | $b_4$ |
| $o_8$ | $o_9$ | $o_{10}$ | $o_{11}$ | $o_{12}$ | $o_{13}$ | $o_{14}$ | $o_{15}$ |
| — | — | — | — | — | — | $S_2$ | $S_3$ |

Output lines ($o_8$-$o_{15}$) of the interconnection circuit (5-2) are taken out as the external output lines (7-2). Therefore, the operation results $S_2$ and $S_3$ are sent to two of the external output lines (7-2).

In a similar ways, the operations are done in the memories for logic (4-2) and (4-3). And, the operation results $S_4$ and $S_5$ of the memory for logic (4-2) are sent to two of the external output lines (7-3). Moreover, the output values (-, -, $S_6$, $S_7$, $c_{out}^{(3)}$, -, -, -) of the memory for logic (4-3) are fed back to the input lines (i0-i7) of the interconnection circuit (5-0).

Next, the step counter (62) of the operation' control part (10) decrements the count value i to 1. Because the operation in the memory for logic (4-3) finished, the page counter (63) increments the count value k by one, and sends the value k as the count signal $p_k$.

With this, because the access pages of the memory for input selection (3), the memory for interconnections (6), and the memory for block designation (8) are changed, the outputs from these memories will also change. More precisely, the amount of shifts specified by the memory for input selection (3-0) will be 17. Moreover, the information for connection produced by the memory for interconnections (5-*o*) is changed to ($s_3$, $s_2$, $s_1$, $s_0$)=(0, 1, 0, 0), and the information for connection produced by the memory for interconnections (5-1) is changed to ($s_3$, $s_2$, $s_1$, $s_0$)=(0, 1, 0, 1). In addition, the value of the variable for designating block p($p_p$=1), produced by the memory for block designation (8-0) is changed to 0. Thus, in the memory for logic (4-0**), the 0-th page becomes an accessible state.

Moreover, with this, the operation results $S_6$ and $S_7$ of the memory for logic (4-3) are sent to two of the external output lines (7-0).

And, similarly to the above case, the operation is done in the memory for logic (4-0), and the output values (-, -, $S^8$, $S^9$, $c^{out(4)}$, -, -, -) of the memory for logic (4-0) are sent to the input lines ($i_0$-$i_7$) of the interconnection circuit (5-1). The interconnection circuit (5-1) shifts these signals by five bits, and send ($S_8$, $S_9$, $c_{out}^{(4)}$) to the output lines ($o_{13}$, $o_{14}$, $o_{15}$). Thus, the operation result ($S_8$, $S_9$, $c_{out}^{(4)}$) of the memory for logic (4-0) are sent to three of the external output lines (7-1). All the operation results are sent to the output lines (7-0)-(7-3), and the operation completes.

[End of Example 2]

In Example 2, we assumed that the set of input variables X0, X1, . . . , and $X_{s−1}$, where each corresponds to the inputs of an LUT, the sets of variables are disjoint. That is, they have no common elements, or $X_i \cup X_j = \phi (i \neq j)$. However, in the PLD in this invention, we can apply the method when any two sets from $X_0$, $X_1$, . . . , and $X_{s−1}$ have common element(s).

IX. Embodiment 8

Figure 37:
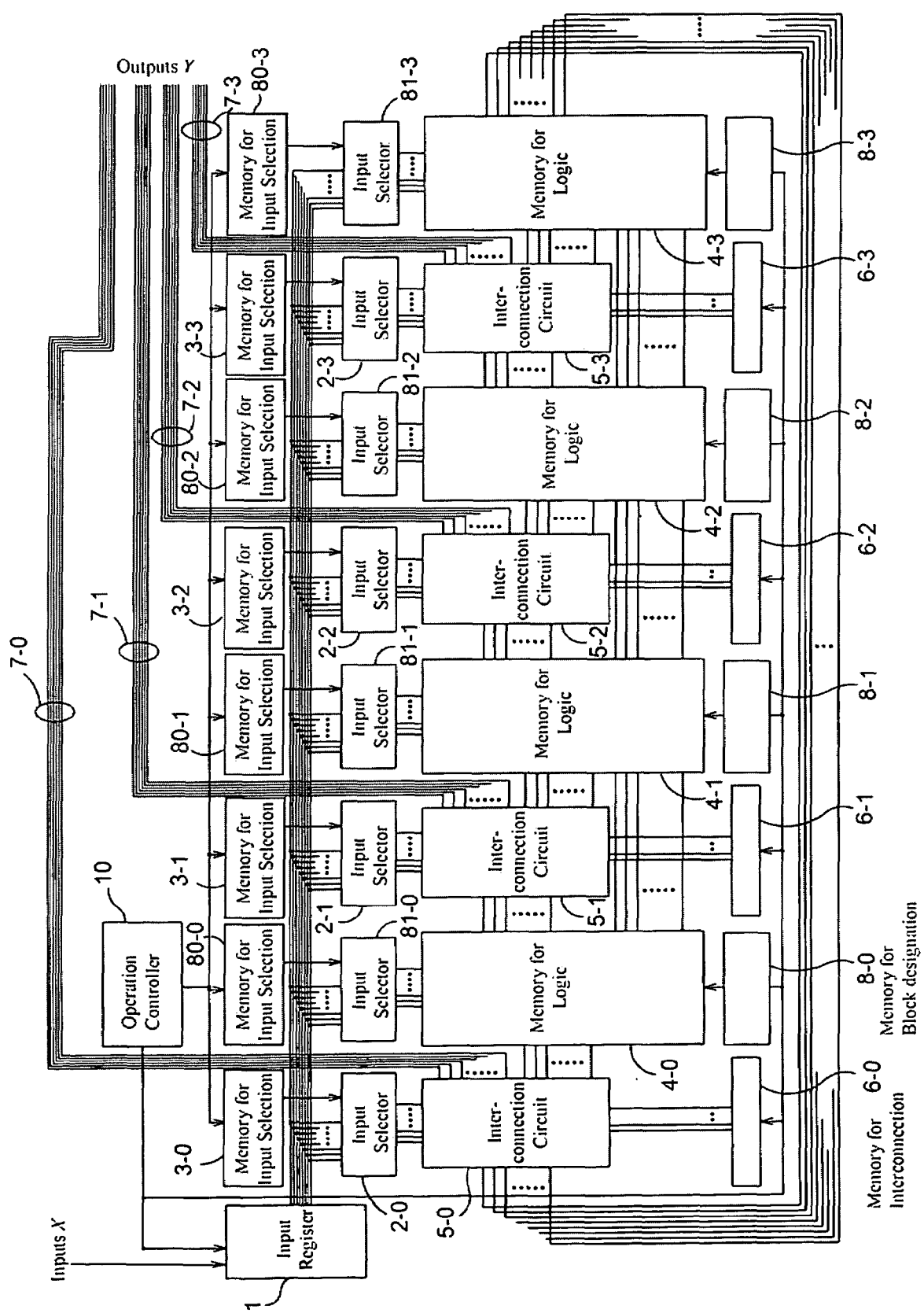
FIG. 37 is a simplified block diagram of the PLD in accordance with EMBODIMENT 8 of the present invention.

FIG. 37 is a simplified block diagram of the PLD in accordance with EMBODIMENT 8 of the present invention.

The first feature of this EMBODIMENT is as follows: The PLD has the input selectors (80-0)-(80-3) that select the input variables and, sent them directly to the memories for logic (4-0)-(4-3) without using interconnection circuits (5-0)-(5-3). The PLD has the input selection memories (81-1)-(81-3) that store the information for the above input selection. In addition, the PLD has the input selectors (2-0)-(2-3) that select the input variable sent the interconnection circuits (5-0)-(5-3). The second feature this EMBODIMENT is as follows: The PLD has direct connection from the memory for logic (4-(i−1)) to the memory for logic (4-i): A part of the intermediate variables produced by the memory for logic (4-(i−1), i∈{1, 2, 3}) in the preceding stage are sent to the memory for logic (4-i) of the succeeding stage without using the interconnection circuit (5-i).

In such a structure, we can reduce the number of input lines to the interconnection circuits (5-0)-(5-3). As a result, we can reduce the size of the interconnection circuits (5-0)-(5-3). Moreover, when the interconnection circuits (5-0)-(5-3) are realized by the shifters like FIG. 4, the number of levels of the shifter can be reduced, and the circuit becomes faster.

X. Embodiment 9

Figure 38:
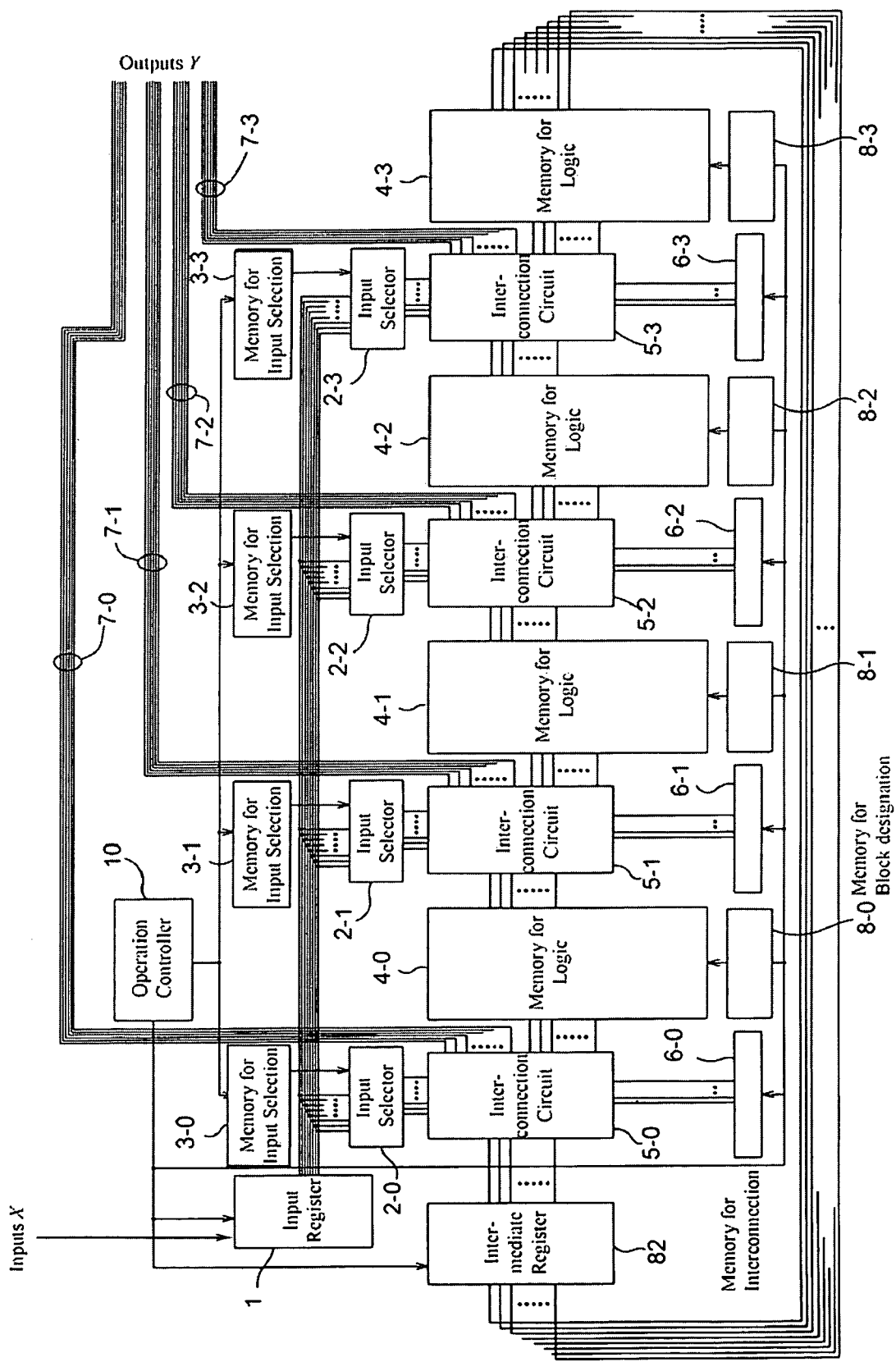
FIG. 38 is a simplified block diagram of the PLD in accordance with EMBODIMENT 9 of the present invention.

FIG. 38 is a simplified block diagram of the PLD in accordance with EMBODIMENT 9 of the present invention.

The feature of this EMBODIMENT is that the PLD has the intermediate variable register (82) in the input side of the interconnection circuit for the feedback. In this case, the register temporarily stores the output signals of the memory for logic (4-3) in the final stage, and sends the signal to the interconnection circuit (5-0).

In EMBODIMENT 7, we used synchronous memories that operate synchronizing with the clock as the memories for logic (4-0)-(4-3). However, we can also use asynchronous memories in the memories for logic (4-0)-(4-3).

However, if we use asynchronous ones for the memories for logic (4-0)-(4-3), then some undesirable phenomena, such as an oscillation, may occur. This is because the output signals of the memory for logic (4-3) in the final stage are fed back to the input of the memory for logic (4-0) in the first stage.

Therefore, in this EMBODIMENT, we use the intermediate variable register (82). Each time the operation of a cycle is finished, the output values of memories for logic (4-0)-(4-3) are fixed, and the values of the intermediate variables produced by the memory for logic (4-3) are stored in the intermediate variable register (82). When it moves to the next operation loop, the intermediate variables stored in the intermediate variable register (82) are sent to the memory for logic (4-0), to do the operation of the next loop.

In this way, even if we use the asynchronous ones for memories for logic (4-0)-(4-3), we can prevent the oscillation, and obtain the correct results.

XI. Embodiment 10

Figure 39:
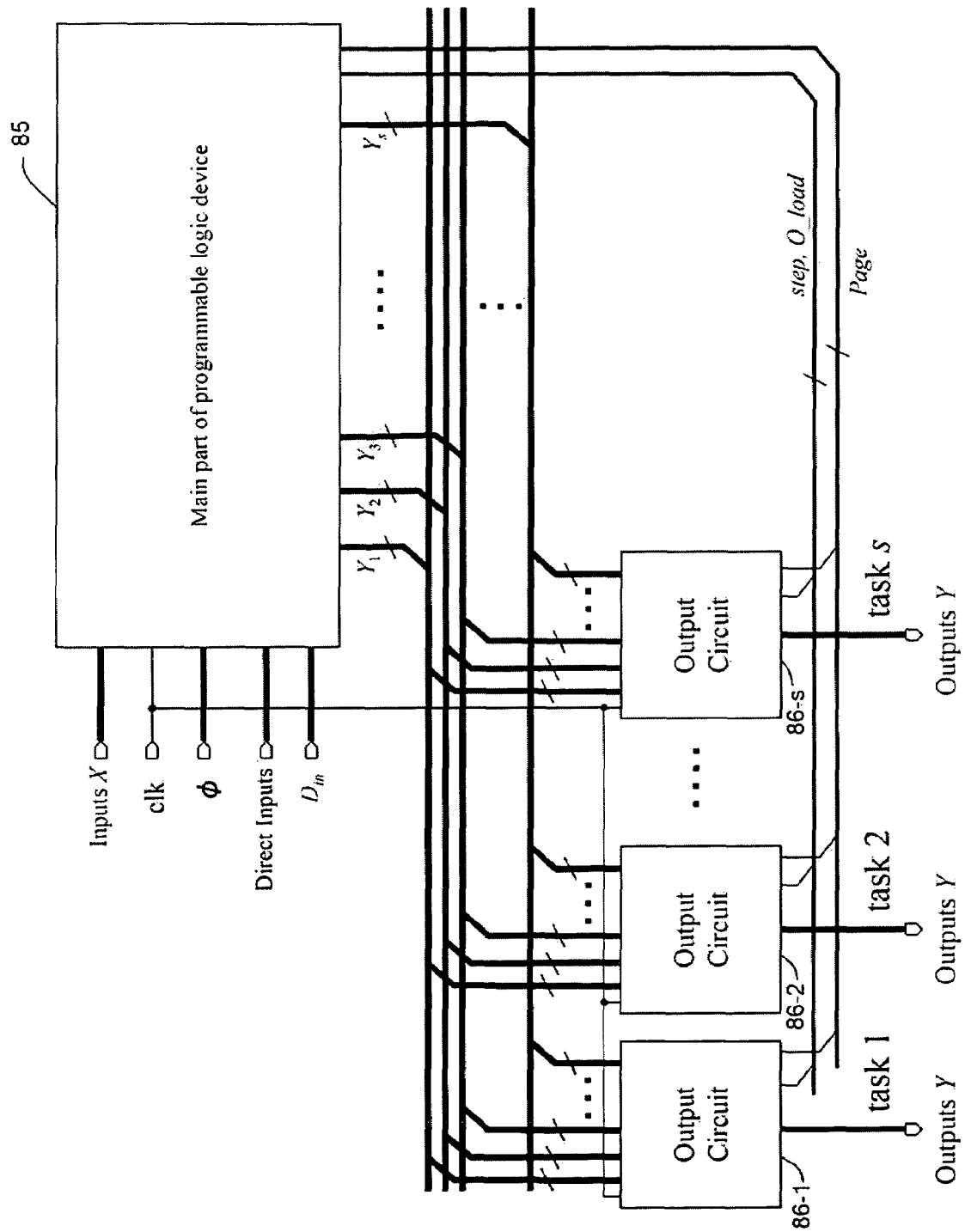
FIG. 39 is a block diagram of the PLD in accordance with EMBODIMENT 10 of the present invention.

FIG. 39 is a block diagram of the PLD in accordance with EMBODIMENT 10 of the present invention. The PLD of this EMBODIMENT consists of output circuits (86-1)-(86-s), and s (s≧2) copies of the operation part (85). In the PLD of this EMBODIMENT, at most s operations can be done by the pipelining. Therefore, in FIG. 39, s copies of output circuits (86) are employed. However, the number of output circuits (86) can be reduced if necessary.

Figure 40:
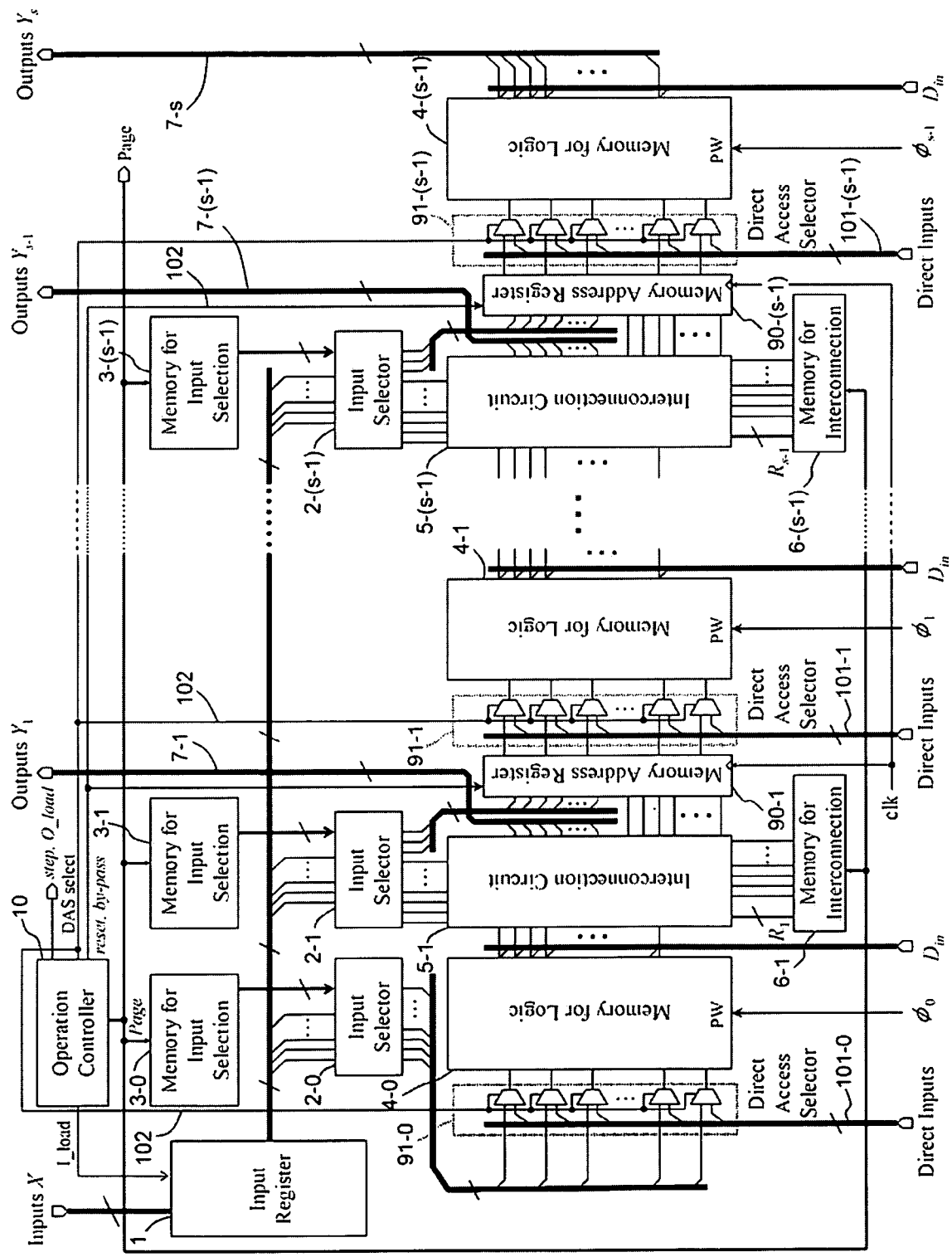
FIG. 40 is a simplified block diagram of the operation part of the PLD in accordance with EMBODIMENT 10 of the present invention.

FIG. 40 is a simplified block diagram of the operation part (85) of the PLD in accordance with EMBODIMENT 10 of the present invention. In FIG. 40, the following components are the same as FIG. 1, so the same symbols are used: The input variable register (1); input selectors (2-0)-(2-(s−1)) (s≧3); memories for input selection (3-0)-(3-(s−1)); memories for logic (4-0)-(4-(s−1)); interconnection circuits (5-0)-(5-(s−1)); memories for interconnections (6-0)-(6-(s−1)); external output lines (7-1)-(7-s); and the operation control part (10).

The PLD in this EMBODIMENT, s (s≧2) copies of memories for logic (4-i, i=0, . . . , s−1) are connected in series. Between the (i−1)-th stage (i∈{1, . . . , s−1}) of the memory for logic (4-(i−1)), and the i-th stage of memory for logic (4-i)), the interconnection circuit (5-i), memory address register (denoted by MAR) (90-i), and the direct access selector (denoted by DAS) (91-i) are connected in this order. Moreover, to the input side of the memory for logic (4-0) in the first stage, DAS (91-0) is connected.

All the output lines of the input selection circuit (2-0) are connected with the input lines of the DAS (91-0) in the first stage. Some of the output lines of the input selection circuit (2-i, i∈{1, . . . , s−1}) is connected to a part of the input lines of memory for logic (4-i), and others are connected to a part of the input line of the MAR (90-i).

All the input lines of the memory for logic (4-0) in the first stage, are connected with the output lines of the DAS (91-0). Moreover, all the input lines of other memories for logic (4-i, i∈{1, . . . , s−1}) are connected with the output lines of the DAS (91-i), arranged in the preceding stage.

All the output lines of the memory for logic (4-(s−1)) in the last stage, are connected with the external output line (7-s). Moreover, all the output lines of other memory for logic (4-i, i∈{0, . . . , s−2}), are connected with a part of the input lines of the interconnection circuit (5-(i+1)).

Memories for logic (4-0)-(4-s) have power control terminal PW. When the signal 1 is applied to the power control terminal PW, each memory for logic (4-i, i∈{0, *, s−1}) becomes a wake-up mode. When 0 is applied to PW, each memory for logic (4-i) becomes low power mode. In the power control terminals PW of memories for logic (4-0)-(4-s), the power supply control signals ($\phi_0$-$\phi_{s−1}$) are supplied. With this power supply control signals ($\phi_0$-$\phi_{s−1}$), the power supply control of memories for logic (4-0)-(4-s) is done. When two or more jobs are executed by the pipelining using all the memories for logic, signal 1 is sent to this power supply control signals ($\phi_0$-$\phi_{s−1}$). On the other hand, in other cases, the multiphase clock is used for the power supply control signals ($\phi_0$-$\phi_{s−1}$) according to the flow of the job. As a result, only the memories for logic that executes the operation are in the wake-up mode, and others are in the low power mode. In this way, we can reduce the power dissipation.

Among the input lines of the interconnection circuit (5-i, i∈{1, . . . , s−1}), some are connected with the output lines of the input selection circuit (2-0), and the others are connected with the output lines of the memory for logic (4-(i−1)). Moreover, some of the output lines of the interconnection circuit (5-i) are connected with MAR (90-i), and the others are connected with external output lines (7-i). The details of interconnection circuit (5-i) are described later.

The MAR (90-i, i∈{1, . . . , s−1}) temporarily stores the values of variables supplied by input lines (data input lines). The MAR (90-i) also works as an intermediate variable register. As for the input lines of the MAR (90-i), a part is connected to a part of the output lines of the input selector (2-i), and the others are connected to a part of the output lines of the interconnection circuit (5-i). As for the output lines of the MAR (90-i), all of them are connected with a part of the input lines of the DAS (91-i).

Moreover, MAR (90-i) has the external clock input line, the reset input line, and the bypass control inputs line. To the external clock input line, the clock signal clock is supplied from the outside. Moreover, the operation control part (10)

supplies the reset signal and bypass control signals to the reset input line and the bypass control inputs lines, respectively. This MAR (90-*i*) works as an intermediate variable register: it temporarily stores the address for the memory for logic. In this case, the clock signal supplied to the external clock input line becomes a data strobe signal. The details of the MAR (90-*i*) will be shown later.

The DAS (91-*i*, i∈{0, . . . , s–1}) are installed to directly write the data into the memory for logic (4-*i*) from the outside, or to test the memory for logic (4-*i*). The DAS (91-*i*) has two-input one-output multiplexer (denoted by MUX): The number of MUXs is equal to the number of the input lines (data input lines) of memory for logic (4-*i*). The output terminal of each MUX is connected to each input line of the memory for logic (4-*i*). One input terminal (the 0-side input terminal) of each two-input MUX, is connected to the eternal address input line (101-*i*). On the other hand, the other input terminal (the 1-side input terminal) is connected with the output lines of the MAR (90-*i*). (A part is directly connected to the output lines of the input selection circuit (2-*i*)). The selection control lines (102) are connected to the selection control terminals of the MUXs. The operation control part (10) sends the DAS selection control signal (DAS select) to the selection control line (102). Each MUX selects the 0-side of the input terminal when the DAS selection control signal is 0, and selects the 1-side of the input terminal when the DAS selection control signal is 1.

When we need to access the memory for logic (4-*i*) directly, we put the address of the memory to the external address input lines (101-*i*). The direct access of the memory for logic (4-*i*) becomes possible by setting the DAS selection control signal to 0, and by supplying the address to the external address input lines (101-*i*). By using this feature, we can write the data into the memory for logic (4-*i*), or test the memory for logic (4-*i*).

In this EMBODIMENT, the memories for interconnections (6-*i*, i∈{1, . . . , s–1}) store the variables for designating the memory area, in addition to the connection variables that show information for connection. The information for connection specifies; the method to select the lines that are connected to each input line of the memory for logic (4-*i*) in the succeeding stage among output lines or the external input lines of the memory for logic (4-(i–1)) in the preceding stage between two memories for logic (4-(i–1)) and (4-*i*). Moreover, the variable for designating block specifies the memory area in the memories for logic (4-(i–1)) and (4-*i*). Therefore, the memory for interconnections (6-*i*) can also be used as a means to designate the memory area. The details will be explained later.

Figure 41:
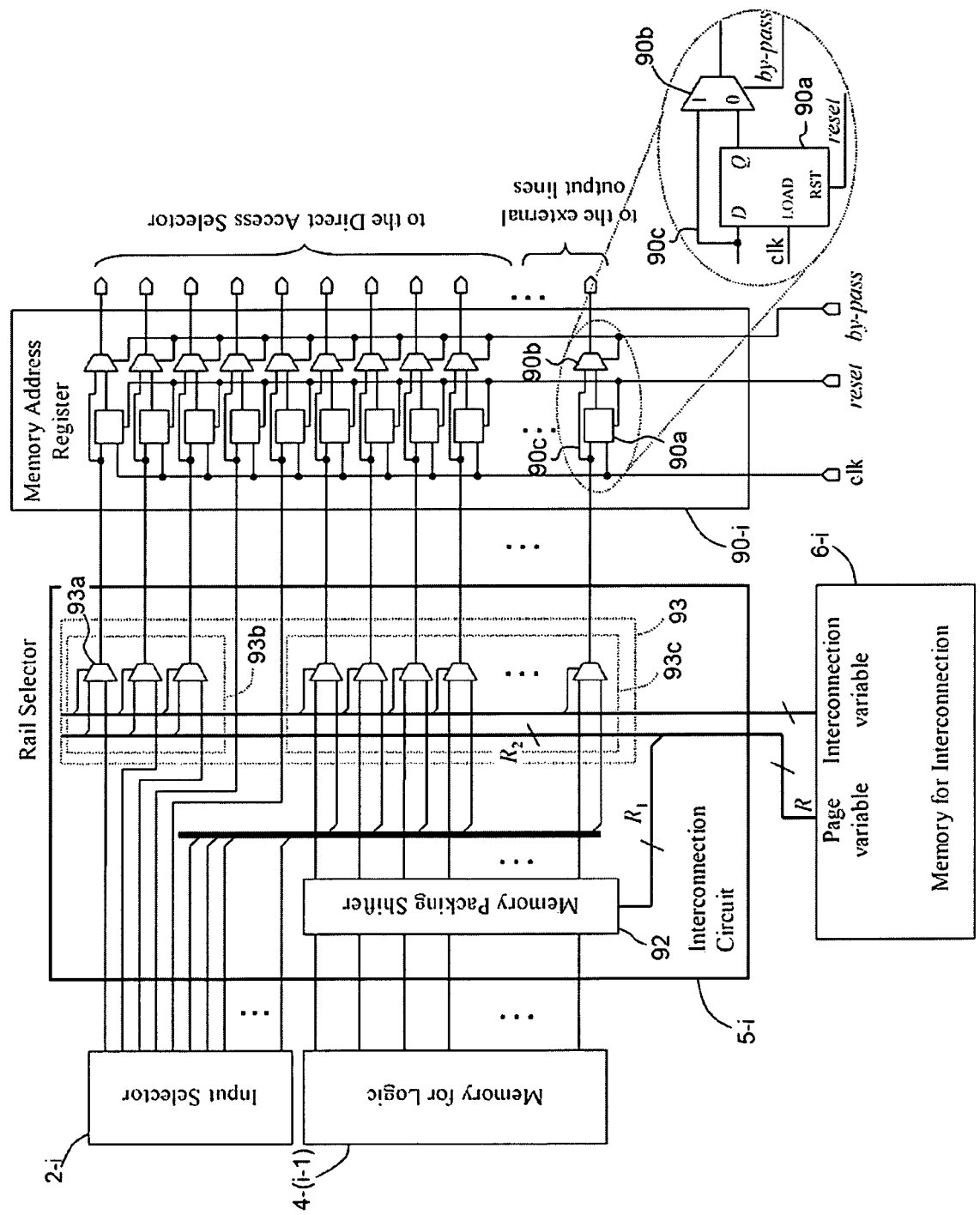
FIG. 41 is a schematic diagram showing the structure of the interconnection circuit and the memory address register in FIG. 40.

FIG. 41 is a schematic diagram showing the structure of the interconnection circuit and the memory address register (denoted by MAR) in FIG. 40. The interconnection circuit (5-*i*) has the memory packing shifter (denoted by MPS) (92), and the rail selector (93).

The MPS (92) has k input lines (data input lines), k output lines (data output lines), and the shift control lines, where the number of the inputs and the outputs of MPS are the same. To each input line of the MPS (92), each output line of the memory for logic (4) in the preceding stage is connected. To the shift control lines of the MPS (92), $R_1$, a part of the variables for designating memory area R, produced by the memory for interconnections (6-*i*) (denoted by "Column selection variable") is supplied. When we need to acquire a part of the data read from the memory cell in the memory for logic (4-(i–1)) in the preceding stage, the column selection variables $R_1$ specify the area of the columns in the memory cells, where the data to be read is stored. The MPS (92) shifts the variables $Y_i=\{y_i\}$ supplied from the output lines of the memory for logic (4-(i–1)), by the amount specified by the column selection variable $R_1$, and send them to the output lines. As a result, the MPS (92) can select the necessary variables from the output variables of the memory for logic (4-(i–1)) in the preceding stage.

The rail selector (93) has plural two-input one-output multiplexers (denoted by MUX) (93*a*). Each MUX (93*a*) has one output terminal, two input terminals (data input terminals), and one selection control inputs terminal.

To the selection control input terminal of each MUX (93*a*), each connection variable produced by the memory for interconnections (6-*i*) is supplied. Each MUX (93*a*) selects the 0-side input terminal or the 1-side input terminal, according to the value of the connection variable supplied to the selection control input terminal.

The output terminal of each MUX (93*a*) is connected with an input line of the MAR (90-*i*). To an input terminal (0-side input terminal) of each MUX (93*a*), an output line of the input selection circuit (2-*i*) is connected. A part of the output lines of the input selection circuit (2-*i*) is directly connected with the input lines of the MAR (90-*i*) without going through an MUX (93*a*).

These MUXs (93*a*) can be divided into two groups: the group for the page/input variable selection (93*b*); and the group for the preceding stage output variables/input variable selection (93*c*).

$R_2$ (denoted by "row selection variable"), a part of the remaining variables for designating memory area R supplied by the memory for interconnections (6-*i*), is sent to the 1-side input terminal of each MUX (93*a*) of the group for page/input variable selection (93*b*). When accessing cells in the memory for logic (4-*i*) of the succeeding stage, the row selection variables $R_2$ specifies the row areas to access in the memory cell. Each MUX (93*a*) in the group for page/input variable selection (93*b*), selects either the row selection variable or the input variable, and send the output to the input line of the MAR (90-*i*). In this way, we can change the number of bits of the row selection variables by installing MUXs (93*a*) in the group for page/input variable selection (93*b*).

Each output line of the MPS (92) is connected with the 1-side input terminal of each MUX (93*a*) of the group for the preceding stage output variables/input variable selection (93*c*). Each MUX (93*a*) in the group for the preceding stage output variables/input variable selection (93*c*), select either: the output variables selected by the MPS, among the outputs of the memory for logic in the preceding stage (4-(i–1)); or input variables. Then, it sends the output to an input line of the MAR (90-*i*).

The MAR (90-*i*) consists of pairs of a synchronous D flip-flop (denoted by DFF) (90*a*) and a bypass selection circuit (90*b*). Each DFF (90*a*) has the data input terminal (D); the data output terminal (Q); the clock terminal (LOAD); and the reset terminal (RST). Moreover, each bypass selection circuit (90*b*) consists of a two-input one-output multiplexer.

To the clock terminal (LOAD) of the DFF (90*a*), the clock signal (clock) from the outside is supplied. This clock signal becomes the data strobe signal. To the reset terminal (RST) of the DFF (90*a*), the reset signal (reset) produced by the operation control part (10) is supplied.

The data input terminal (D) of the DFF (90*a*) is connected to the 1-side input terminal of the bypass selection circuit (90*b*), using the bypass line (90*c*). Moreover, the data output terminal (Q) of the DFF (90*a*) is connected with the 0-side input terminal of the bypass selection circuit (90*b*). The data input terminal of each DFF (90*a*) is connected with each output line of the interconnection circuit (5-*i*) in the preceding stage, that is an output line of rail selector (93), or an input selector (2-*i*).

To the control input terminal of the bypass selection circuit (90*b*), the bypass control signal produced by the operation control part (10) is supplied. The bypass selection circuit (90*b*) selects either the 0-side input terminal or the 1-side input terminal by this bypass control signal.

The data output terminals of a part of DFFs (90*a*) are connected with the DAS (91-*i*) in the succeeding stage, and the data output terminals of a part of the remainder of DFFs are connected with the external output lines (7-*i*). In this case, DFFs (90*a*) that are connected with the MUX (93*a*) of the group for page/input variable selection (93*b*); or DFF (90*a*) that are directly connected with the output lines of the input selector (2-*i*), are connected with the DAS (91-*i*) of succeeding stage. In the DFFs (90*a*) that are connected with MUXs (93*a*) of the group for the preceding stage output variables/input variable selection (93*c*), a part of them are connected to the DAS (91-*i*) of the succeeding stage, and a part of the rest are connected with the external output lines (7-*i*).

Figure 42:
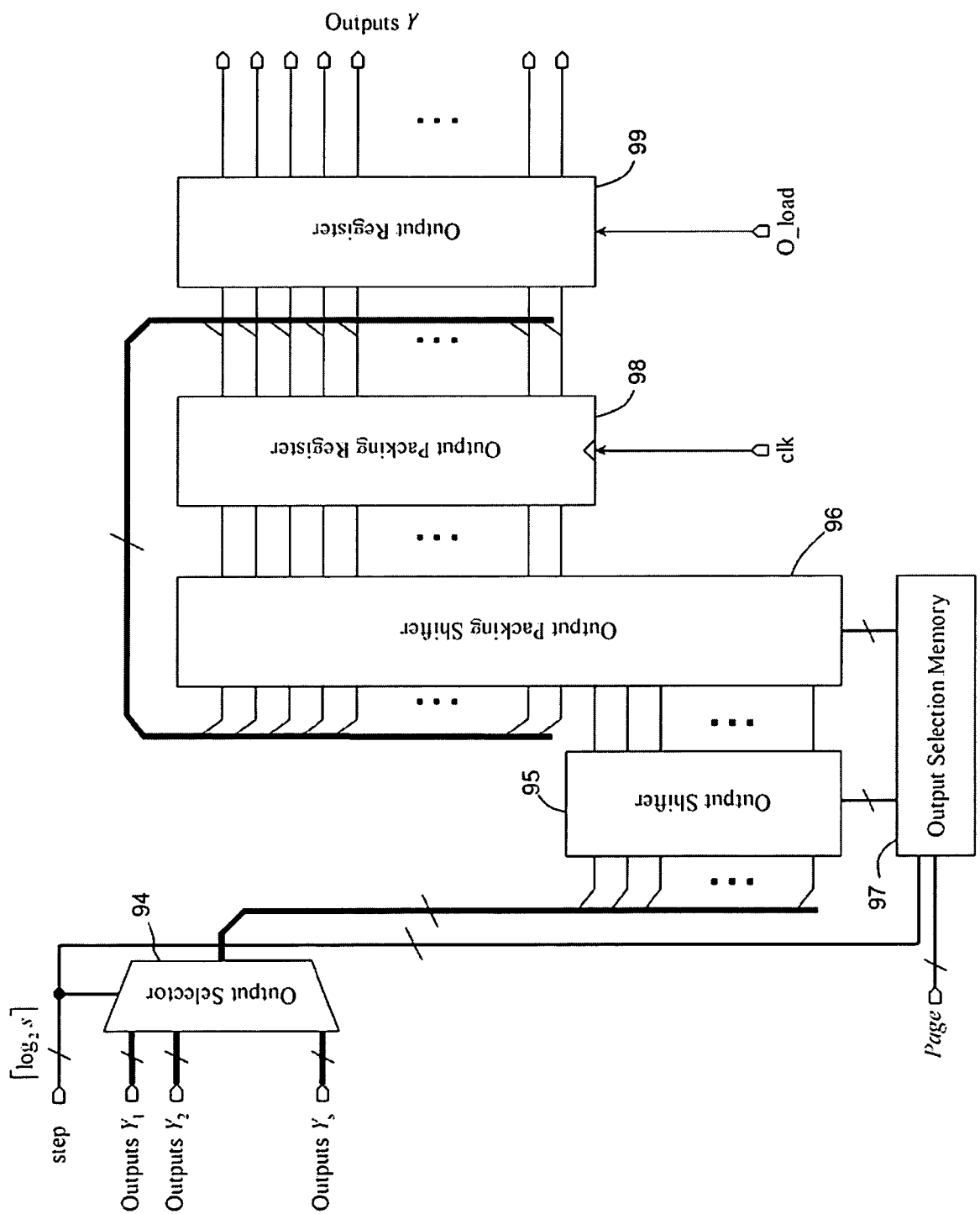
FIG. 42 is a schematic diagram showing the output circuit of the PLD in accordance with EMBODIMENT 10 of the present invention.

FIG. 42 is a schematic diagram showing the output circuit (86-*i*, i∈{1, . . . , s}) of the PLD in accordance with EMBODIMENT 10 of the present invention. The output circuit (86-*i*) consists of the output selection circuit (94); the output shifter (95); the output packing shifter (96); the output selection memory (97); the output packing register (98); and the output register (99).

The output selection circuit (94) selects one of the output variables ($Y_1$-$Y_s$) that are sent to the external output lines (7-1)-(7-*s*), based on the values of the step variable (step) produced by the operation control part (10). Then, it sends the selected output variables $Y_i$ to the output shifter (95). Output variables $Y_i$ are sent to the output shifter (95) from the output selection circuit (94). The output shifter (95) shifts the output variables $Y_i$, and sends them to the output packing shifter (96).

The output packing shifter (96) has plural data input lines and plural data output lines. A part of this data input lines is connected with the output lines of the output shifter (95), and the remainder is connected with the output lines of the output packing registers (98), which will be explained later. The output lines of shifter (96) are connected with the input lines of the output packing register. The number of input lines of the output packing shifter (96) is equal to the sum of the number of output lines of the output shifter (95) and the number of output lines of the output packing register (98). The number of output lines of the output packing shifter (96) is equal to the number of output lines of the output packing register (98).

The output packing shifter (96) shifts the input signals by the specified amount of bits, and send a part of them to the output lines. When the amount of shift is 0, the input lines connected with the output lines of the output packing register (98) are connected with the output lines of the output packing shifter (96).

The output selection memory (97) stores, the information related to the amount of shift of the output shifter (95) and the output packing shifter (96). The output selection memory (97) produces these amounts of shift information to the output shifter (95) and the output packing shifter (96), according to the page variables sent from the operation control part (10). The output shifter (95) and the output packing shifter (96) shift the data according to these amounts of shift information.

The output packing register (98) latches the outputs of the output packing shifter (96), according to the clock input from the outside. The outputs of the output packing register (98) are sent to the output register (99), and fed back to the input side of the output packing shifter (96). In this architecture, we can pack the output variables that appear on the external output lines (70-*i*) sequentially into the output packing register (98) without any space.

The output register (99) receives the output of the output packing register (98) and store them, when the output loading signal (O_load) is generated by the operation control part (10) at the end of all the operations.

Figure 43:
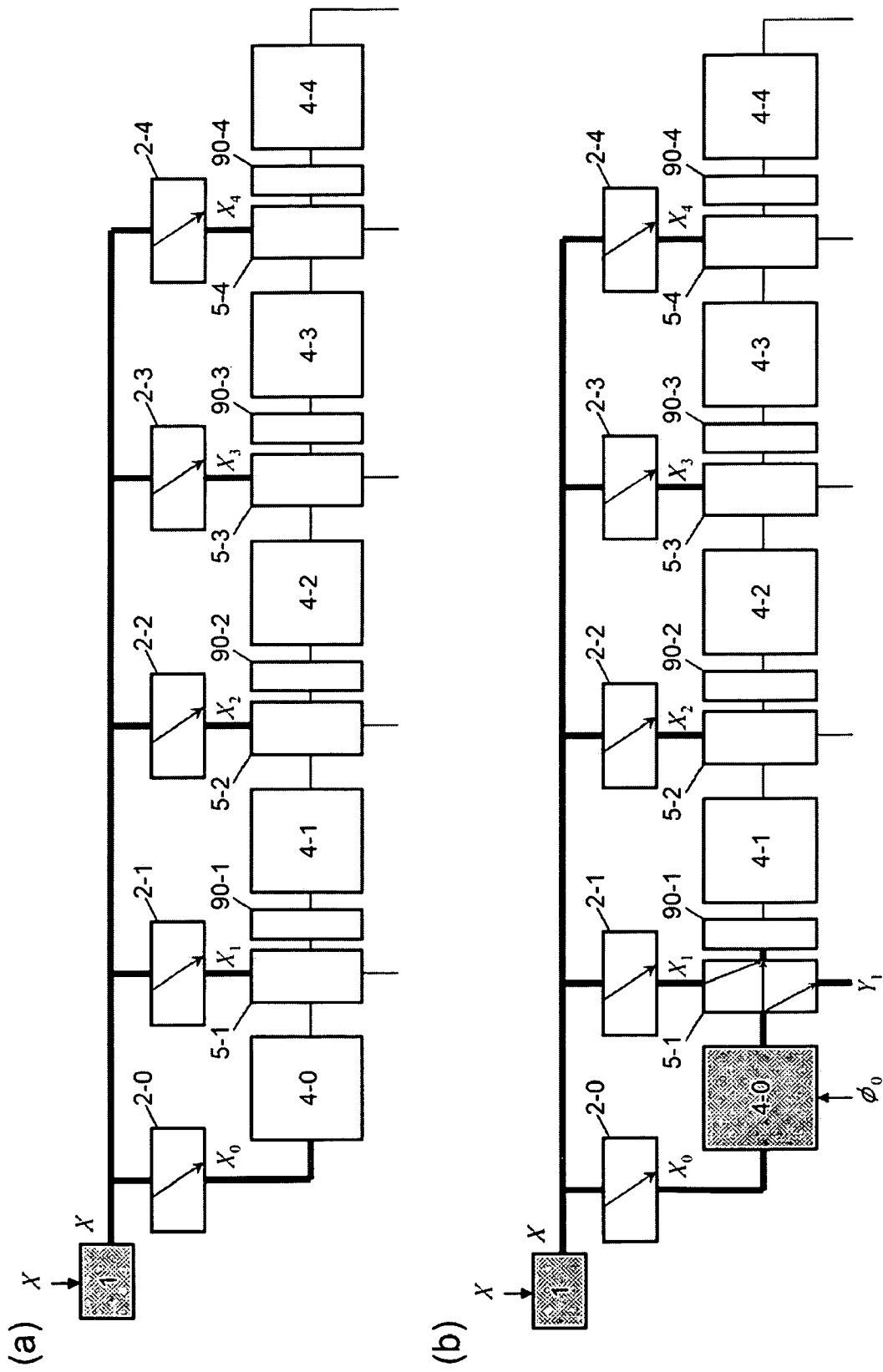
FIGS. 43(*a*) and 43(*b*) illustrate the flow of the operation of the PLD in accordance with EMBODIMENT 10.

For the PLD realized as mentioned above, we will explain the operation for this EMBODIMENT as follows:

FIGS. 43 thorough 45 illustrate the flow of the operation process of the PLD for EMBODIMENT 10. Here, we will explain the example where the number of levels of the memory for logic (4) is five (s=5). In this figure, ($\phi_0$-$\phi_5$) denote a five-phase clock. Moreover, assume that the DAS selection control signal is set to 1. Therefore, DASs (91-0)-(91-4) select the input values from the preceding stage, and transmit them to the memory for logic (4) of succeeding stage.

In the initial state, assume that all the memories for logic (4-0)-(4-4) are in the low-power states.

First, as shown in FIG. 43(*a*), the input variables X are sent from the external input lines to the input variable register (1). The input variable register (1) receives the variable X and stores them. The input variables X are sent from the input variable register (1) to input selectors (2-0)-(2-4). According to the output values of the memory for input selection (3-*i*), each input selection circuit (2-*i*, i∈{0, 1, 2, 3, 4}) selects input variable $X_i$ from the input variable X, to be sent to the memory for logic (4-*i*) of i-th stage.

The input selection circuit (2-0) sends the input variable $X_0$ to the input lines of the memory for logic (4-0). The input selection circuit (2-*i*, i∈{1, 2, 3, 4}) sends the input variable $X_i$ to the input lines of the interconnection circuit (5-*i*).

Figure 44:
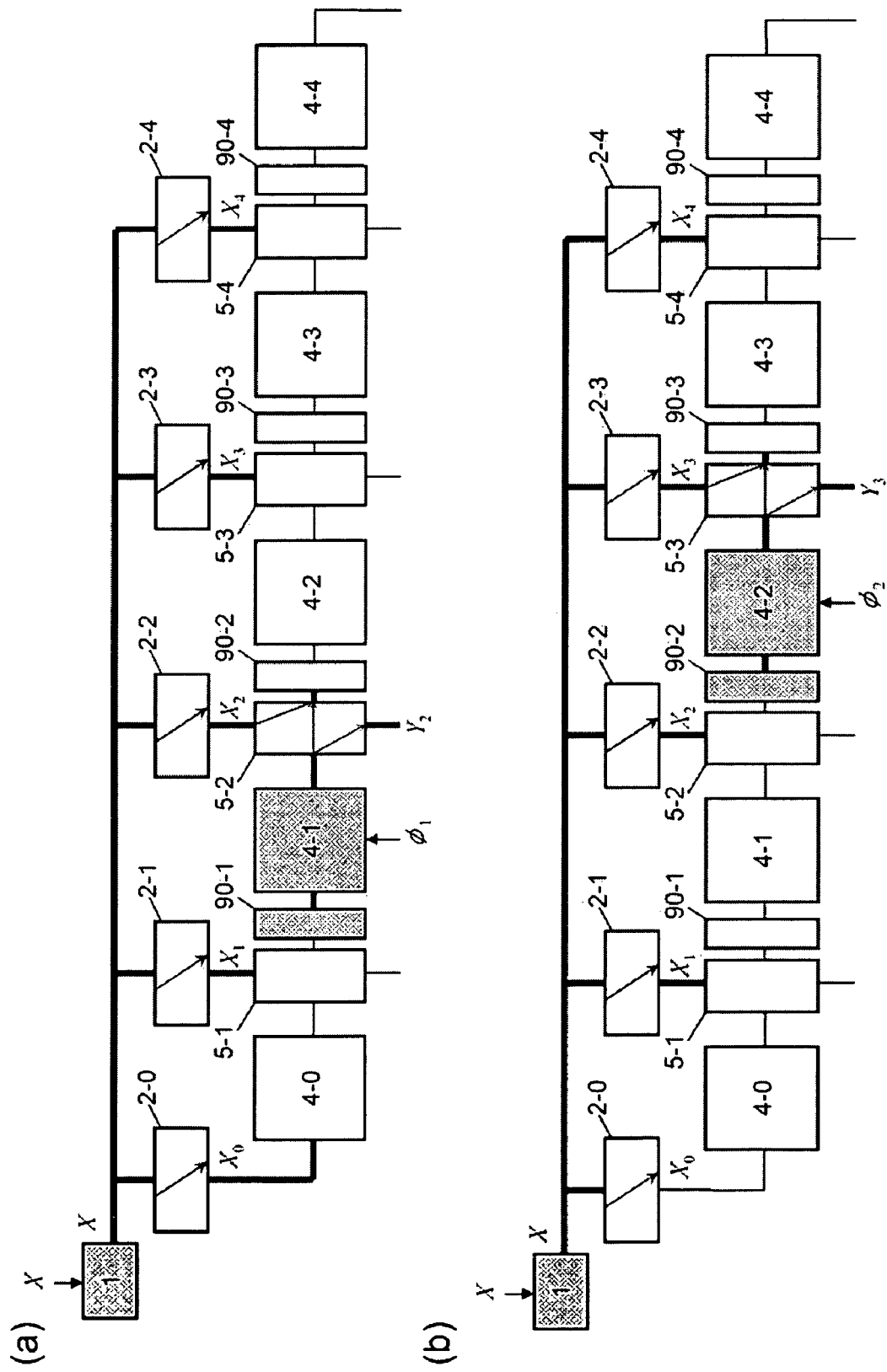
FIGS. 44(*a*) and 44(*b*) illustrate the flow of the operation of the PLD in accordance with EMBODIMENT 10.
Figure 45:
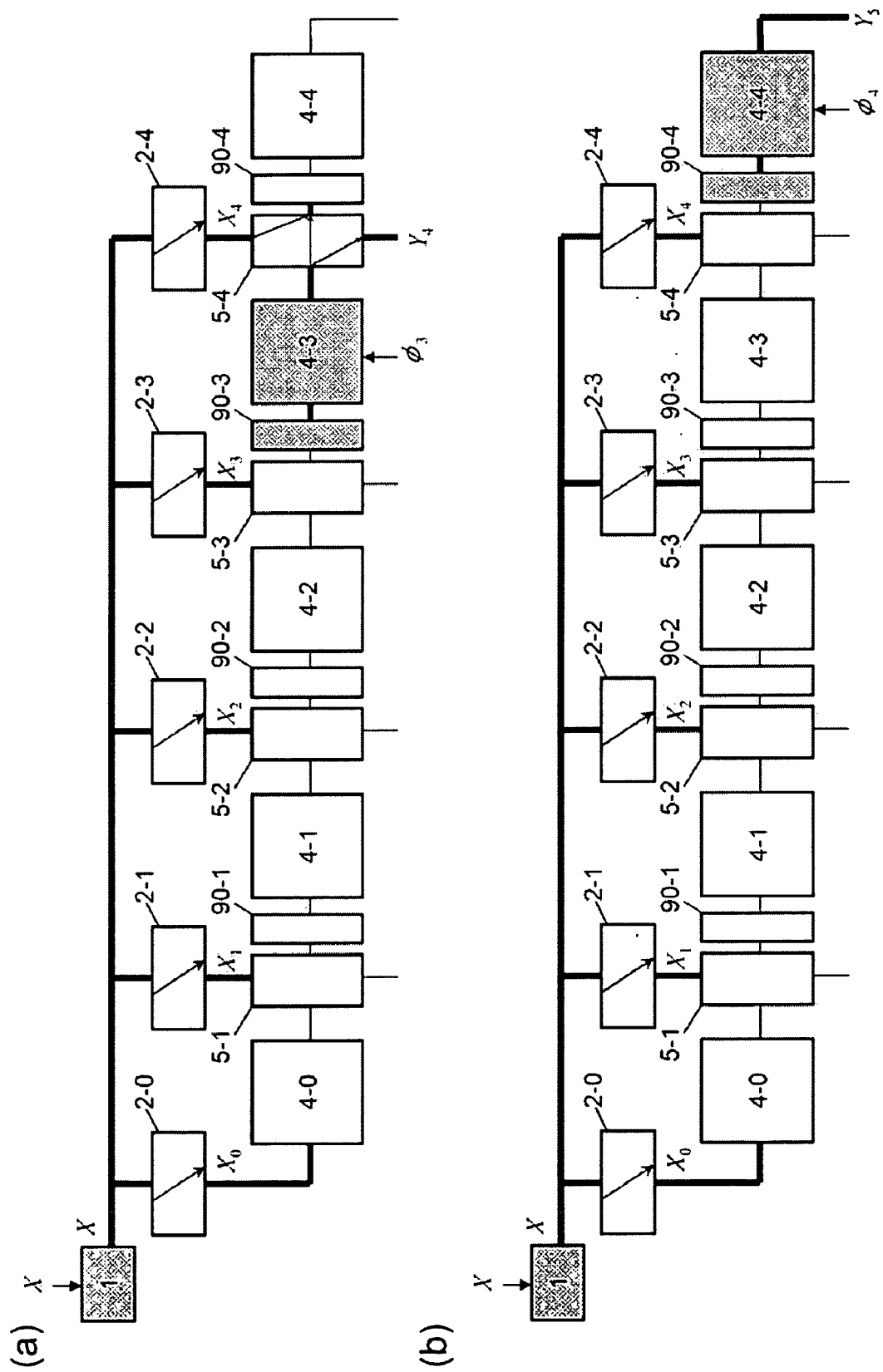
FIGS. 45(*a*) and 45(*b*) illustrate the flow of the operation of the PLD in accordance with EMBODIMENT 10.

Next, as shown in FIG. 43(*b*), the power control signal $\phi_0$ supplied to the power control terminal PW of the memory for logic (4-0) becomes 1. As a result, the memory for logic (4-0) becomes a wake-up state. Also, the operation results of the LUT in the first stage are produced from the output lines of memory for logic (4-0). In FIGS. 43 through 45, the memories for logic marked with the dark color denote that they are in the wake up state.

The interconnection circuit (5-1) connects the output lines of the memory for logic (4-0), and the output lines of the input selector (2-1), with the input lines of the MAR (90-1), according to the outputs of the memory for interconnections (6-1). Then, a part of the operation results of the LUT of the first stage is sent to the external output lines (7-1) as the output variables $Y_1$. Moreover, other variables are sent to the input lines of the MAR (90-1) as the intermediate variable $U_1$. Moreover, the input variables $X_1$ are sent to the input lines of the MAR (90-1).

Next, with the rise of the clock (clk), the MAR (90-1) receives the intermediate variable $U_1$ and the input variable $X_1$, and stores them. Also, the power control signal $\phi_0$ becomes 0, and the memory for logic (4-0) becomes in the low-power state, again. The power control signal (P1 becomes one at this time as shown in FIG. 44(*a*), and the memory for logic (4-1) becomes in the wake-up state. Then, from the output lines of the memory for logic (4-1), the operation results of the LUT of the second stage are produced. The interconnection circuit (5-2) connects the output lines of the memory for logic (4-1) and the output lines of the input selector (2-2), with the input lines of the MAR (90-2), according to the output of the memory for interconnections (6-2). And, a part of the operation result of the LUT in the second stage is sent to the external output lines (7-2) as the output variables $Y_2$. Moreover, other variables are sent to the input lines of the MAR (90-2) as the intermediate variables $U_2$. Also, the input variables $X_2$ are sent to the input lines of the MAR (90-2).

In a similar way, the operation goes on as illustrated in FIGS. 44(b), 45(a), 45(b), and all the operations will be completed.

Thus, in this way, we can reduce the power dissipation of total system; by setting only the memories for logic actually used for the operation to the wake-up state; and by setting the other memories for logic not used for the operation to the low power state.

Although we explained the operation to execute only one task here, we can execute plural tasks by the pipelining, in the PLD of this EMBODIMENT. As a result, we can efficiently process a lot of tasks.

Moreover, we can perform the operation in high speed asynchronous mode without using the clock, by making all the memories for logic (4-0)-(4-(s−1)) wake-up states, and setting the bypass control signal input to the MAR (90-$i$, i∈ $\{1, \ldots, s-1\}$) to be 1.

Next, we explain a memory packing method of the memory for logic (4-$i$, i∈$\{0, \ldots, s-1\}$) that uses variables for designating memory area R and the MPS (92).

Figure 46:
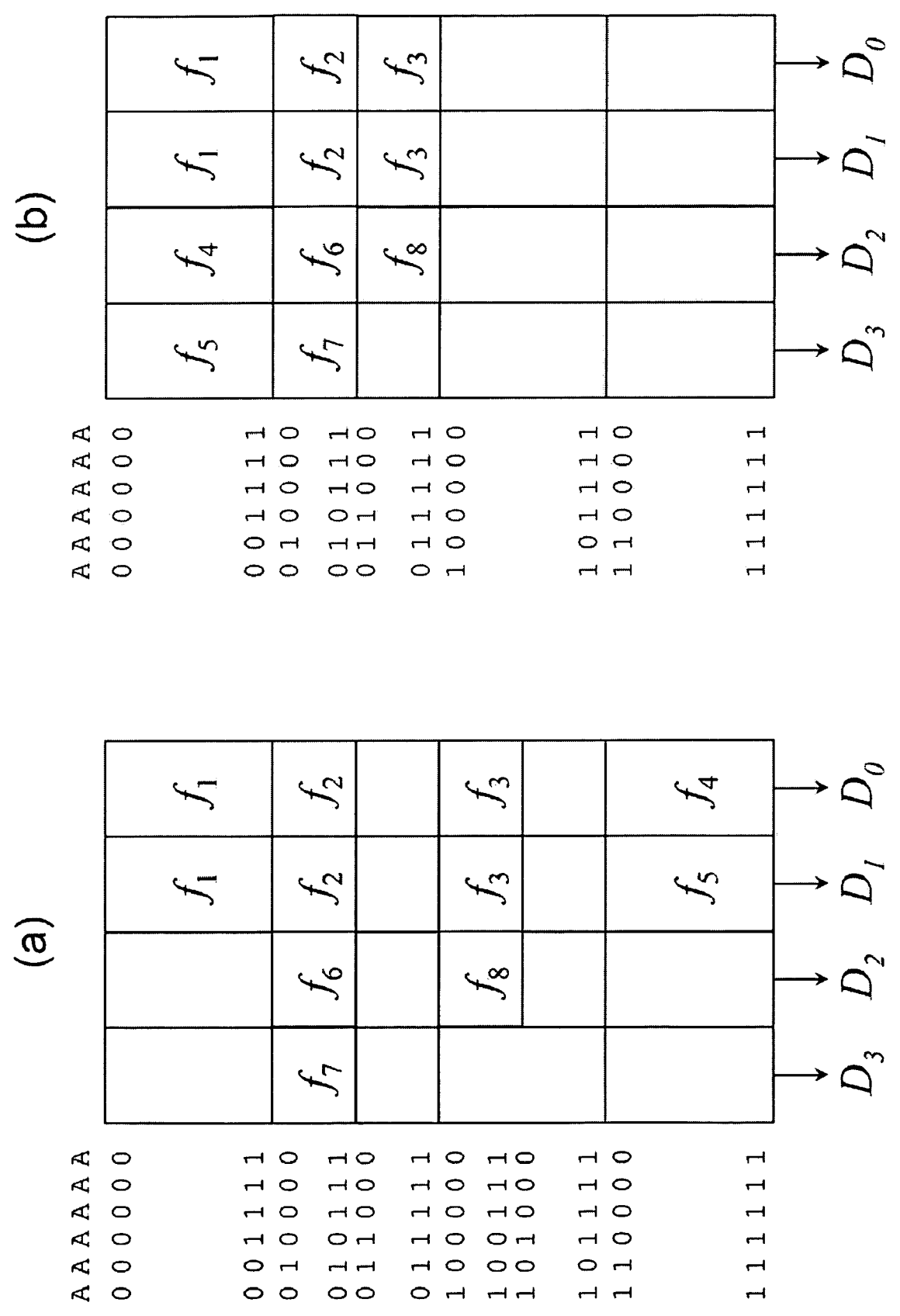

FIG. 46 explains the idea of the memory packing. FIGS. 46(a) and 46(b) show the maps of memories for logic.

In the PLD shown in EMBODIMENT 1, LUTs of plural logic functions can be stored in a memory for logic by changing the page. FIG. 46(a) illustrates the idea. In FIG. 46, two most significant bits of the row address of the memory for logic are used for the page specification bits. Thus, the memory for logic is divided into four pages. In this case, by storing each LUT in a page, we can store at least four LUTs. Note that when an LUT uses only a part of the columns, we can store plural LUTs in one page.

For instance, in FIG. 46(a), three LUTs for logic functions $f_2$, $f_6$, and $f_7$ are stored in the second page. Moreover, two LUTs for $f_3$ and $f_8$ are stored in the third page.

However, in this method, unused areas will be scattered over the memory for logic, and the efficiency of the memory usage is low. In this case, we can improve the efficiency of memory usage by packing memory as shown in FIG. 46(b): pack the LUTs as much as possible in the memory for logic to reduce the space. Thus, we can increase the number of LUTs that are stored in a memory for logic. We denote this method by "Memory packing": to store as many LUTs as much as possible in the memory for logic to reduce the space.

To implement the memory packing as mentioned above, the number bits for page specification should be changeable. Moreover, we need a scheme to read an arbitrary position of columns of the memory for logic.

In FIG. 41, with the interconnection circuit (5-$i$, i∈$\{1, \ldots, s-1\}$) for this EMBODIMENT, we can perform the memory packing. First, the page specification is done by row selection variables $R_2$ produced by the memory for interconnections (6-$i$). Moreover, the number of bits used for the page specification is specified by the variables sent to the MUX (93$a$) of the group for page/input variable selection (93$b$), that is part of the connection variables produced by the memory for interconnections (6-$i$). In the example of FIG. 41, we can use up to three bits as the page specification bits (However, we need not limit to three bits, but can design a PLD to treat other number of bits). When we do not use the page specification bits, we can use these bits for the input variable.

Next, we use the MPS (92) to change the read position of the column address in the memory for logic. For example, when we want to shift the columns of the outputs of the memory for logic (4-($i$−1)) in the preceding stage by eight bits, we use MPS (92). As a result, the columns in the memory for logic can be read from an arbitrary position. The read position of the columns is specified by column selection variables $R_1$ produced by the memory for interconnections (6-$i$).

As mentioned above, by using interconnection circuits (5-$i$, i∈$\{1, \ldots, s-1\}$) of this EMBODIMENT, we can realize the memory packing.

Finally, we will explain briefly the operation of the output circuit (86-$i$) shown in FIG. 42. First, the operation control part (10) produces the step variable (step), that shows the stage number ($i$−1) of the memory for logic (4-($i$−1)), and sends it to the output variables $Y_i$ (86-$i$). The output selector (94) selects the output variables $Y_i$ based on the values of the step variable (step). The selected output variables $Y_i$ are sent to the input lines of the output shifter (95).

On the other hand, the output selection memory (97) produces the information concerning the amount of shifts of the output shifter (95), and the output packing shifter (96).

In general, all the bits of output variables $Y_i$ are not necessarily used, and only effective output variables are sent to a part of the bits in $Y_i$. Then, the output shifter (95) shifts the output variables ($Y_i$) according to the amount of shift information produced by the output selection memory (97). As a result, only the used output variables of $Y_i$ are packed into the output packing shifter from the edge. The output shifter (95) sends the outputs to the input lines of the output packing shifter (96).

In addition, the output packing shifter (96) shifts the signals of the input lines by the necessary amount, and connects a part of them to the output lines. For example, let r be the effective number of bits of the output variables $Y_i$ produced by the output shifter. In this case, the output packing shifter (96) shifts the signals of the input lines by r bits, and sends to the output lines. As a result, the output variables consisting of r bits produced by the output shifter (95) are packed into r least significant bit positions of the input line of the output packing register (98). The output packing register (98) stores the output values of the output packing shifter (96) synchronizing with the clock "clk."

Next, when the step variable (step) becomes i, and the output selector (94) selects the output variables $Y_{i+1}$, the output variables are sent to the lowest bit positions in the input lines of the output packing register (98), in a similar way. At this time, the values of the variables previously stored in the output packing register (98), are fed back to the input lines of the output packing shifter (96). Thus, the values of the variables previously stored in the output packing register (98) are also shifted by the same number of bits as the new output variables, and sent to the output packing register (98). And, the output packing register (98) stores the output values of the output packing shifter (96), synchronized with the clock "clk."

In this way, the output variables are packed into the output packing shifter (96) sequentially without space. When the operation finishes, the operation control part (10) sets the loading signal (O_load) to 1. After this, the output register (99) reads the output values of the output packing shifter (96), stores, and then sends them to the outputs.

By using the output circuit of this EMBODIMENT, we can pack the operation results produced by memories for logic separately, and arrange them into one data, and then send it to the outputs.

XII. Embodiment 11

Figure 47:
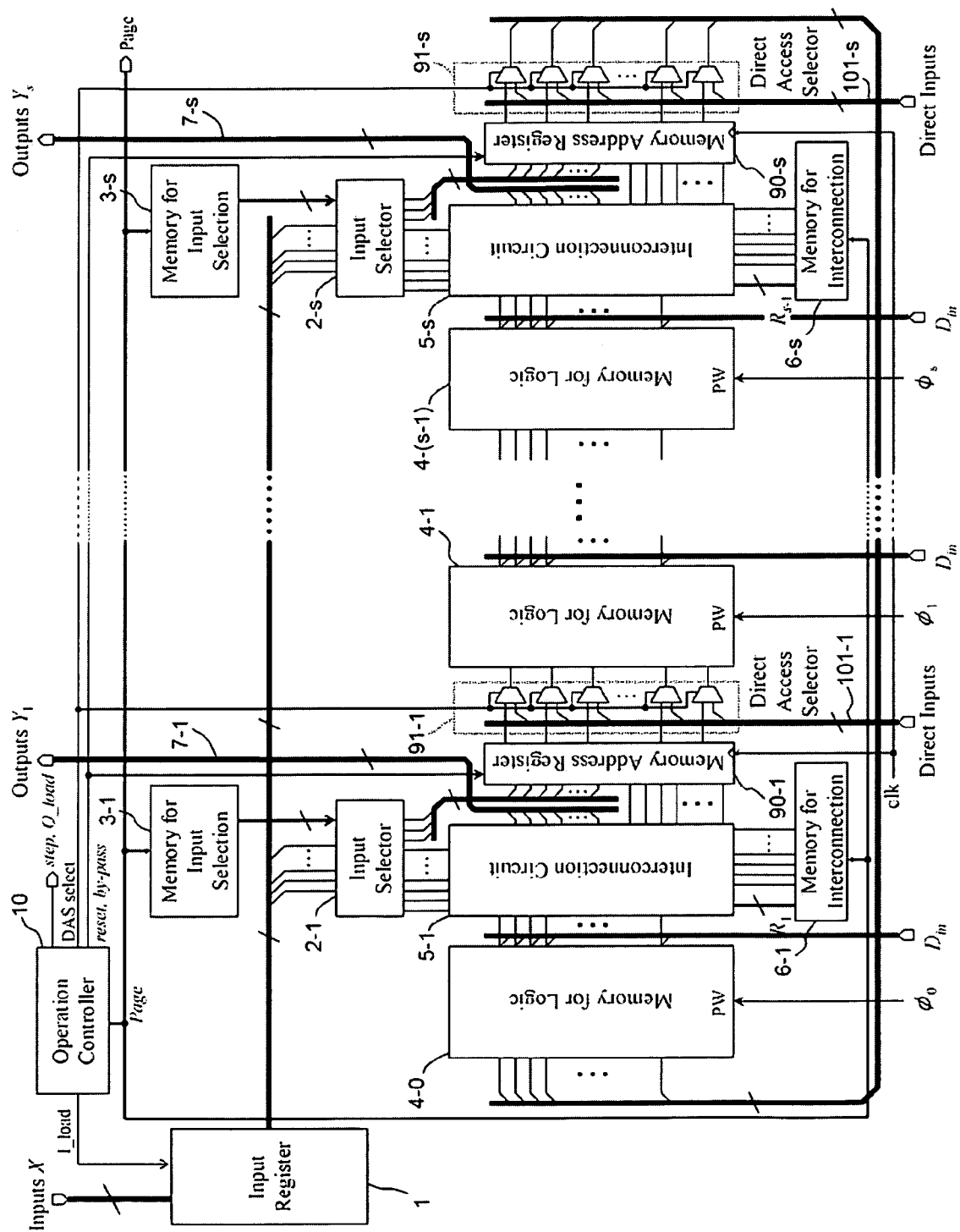
FIG. 47 is a simplified block diagram of the PLD in accordance with EMBODIMENT 11 of the present invention.

FIG. 47 is a simplified block diagram of the PLD in accordance with EMBODIMENT 11 of the present invention. The difference of this EMBODIMENT from EMBODIMENT 10 is that s memories for logic (4-0)-(4-(s−1)) (s≧2) are connected to form a ring: basic structure of the PLD for this EMBODIMENT is similar to the PLD of EMBODIMENT 10. That is, to the succeeding stage of the memory for logic (4-(s−1)), the interconnection circuit (5-s), the MAR (90-s), and the DAS (91-s) are installed, and the output lines of the DAS (91-s) are connected with the input lines of the memory for logic (4-0).

By connecting memories for logic (4-0)-(4-(s−1)) to form a ring, we can make the number of levels in the LUT cascade implemented by the PLD greater than s. Thus, we can increase the degree of freedom for design of the LUT cascade.

Figure 48:
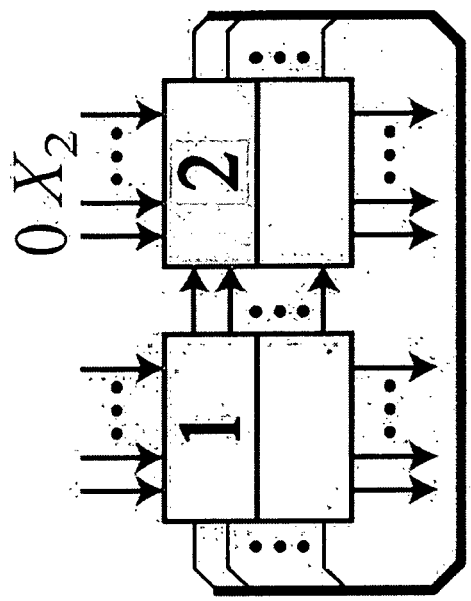
FIGS. 48(*a*) to 48(*d*) are views explaining the example of the PLD for a four-stage LUT cascade using a pair of logic for memories.
Figure 48:
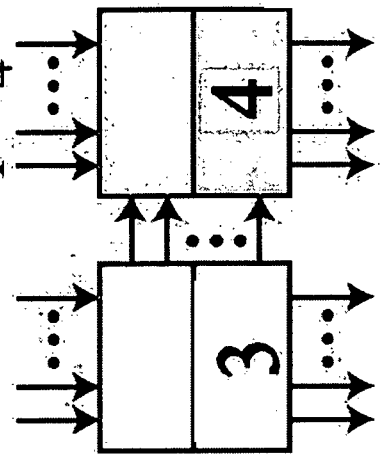
Figure 48:
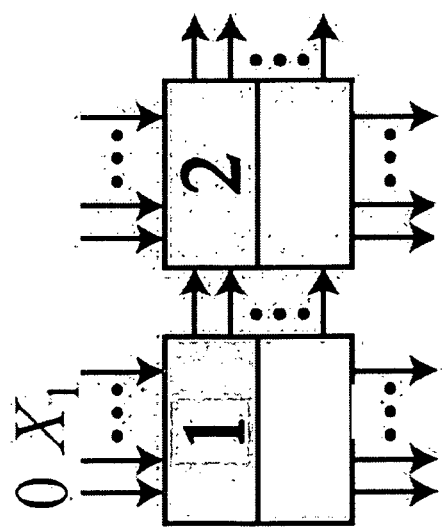
Figure 48:
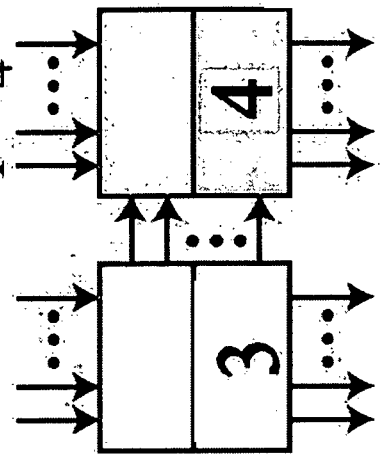

For example, consider the case of s=2. Let us emulate the LUT cascade of four stages by using two memories for logic (4-0) and (4-1). As shown in FIG. 48, the LUT of the first stage is stored in the 0-th page (FIG. 48(a)); the LUT of the second stage is stored in the 0-th page (FIG. 48(b)); the LUT of the third stage is stored in the first page (FIG. 48(c)); and the LUT of the forth stage is stored in the first page (FIG. 48(d)). In this example, we did not use the memory packing; however, we can use the memory packing method mentioned above to increase the efficiency of memory usage.

Moreover, as shown in the following Example 3, we can implement two or more logic functions at the same time with one PLD with the memories for logic connected in a ring.

EXAMPLE 3

Consider two logic functions f and g given by Eq. (16) and Eq. (17), respectively.

$$f = ((x_1 V x_2) x_3 V x_4) x_5 V x_6 \quad (16)$$

$$g = ((x_4 x_5 V x_6) x_1 V x_2) x_3 \quad (17)$$

Figure 49:
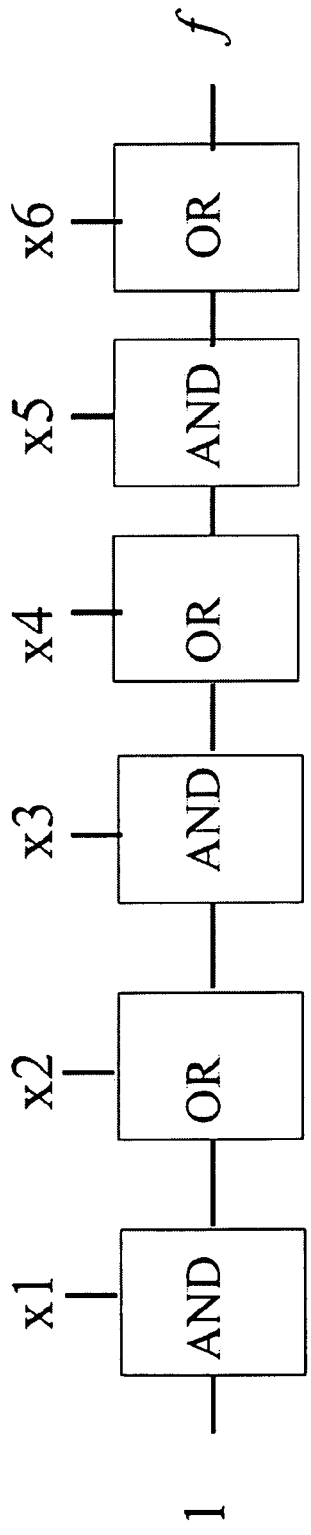
FIGS. 49(*a*) and 49(*b*) illustrate logic functions f and g realized by LUT cascades.
Figure 49:
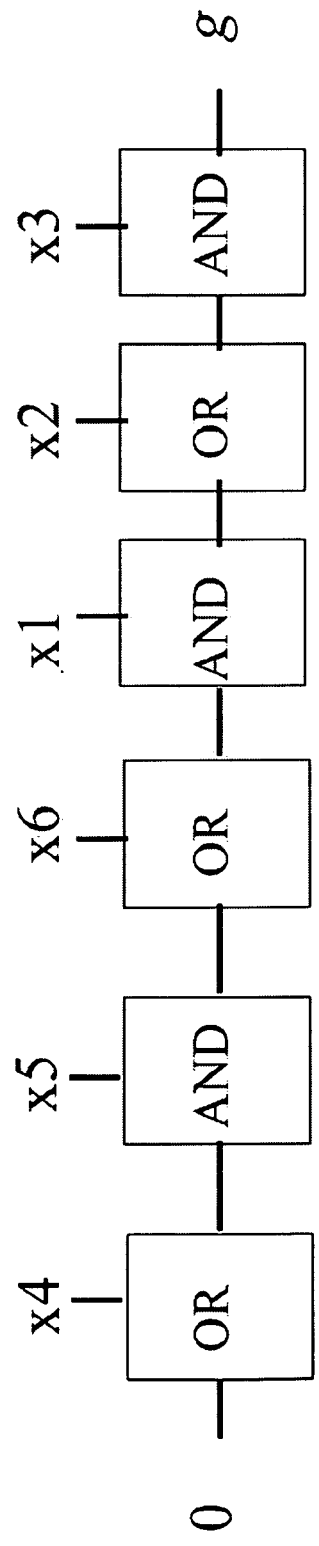

The logic function $f$ for Eq. (16) can be realized by the LUT cascade with six-stages shown in FIG. 49(a). The logic function g for Eq. (17) can be realized by the LUT cascade with six-stages shown in FIG. 49(b).

Figure 50:
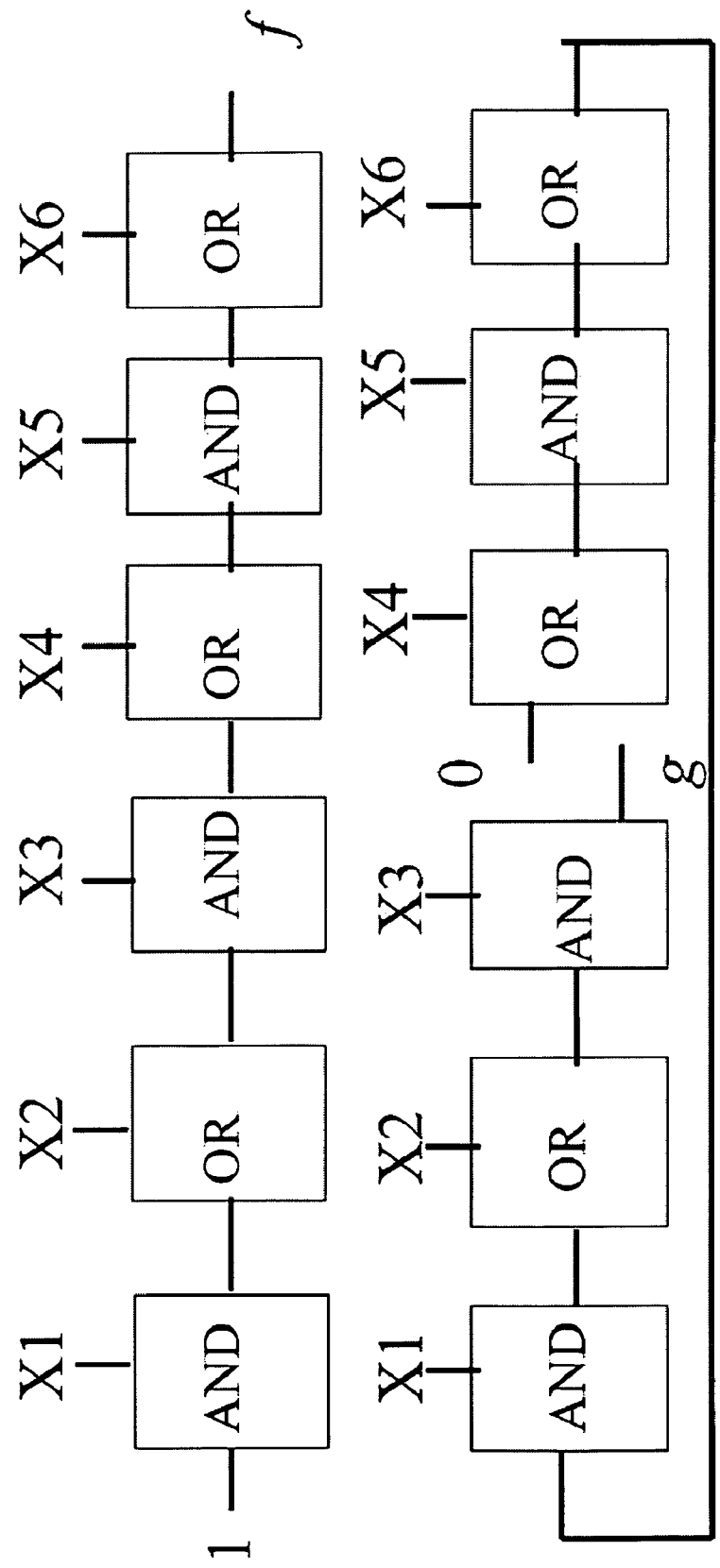
FIG. 50 illustrates logic functions f and g realized by a pair of LUT cascade.

Then, we can implement these two LUT cascades by the PLD with six memories for logic connected in circular. In this case, as shown in FIG. 50, we arrange the cells of two cascades so that each variable in the cells of the LUT cascade for f will overlap with each variable in the cells of the LUT cascade for g.

Figure 51:
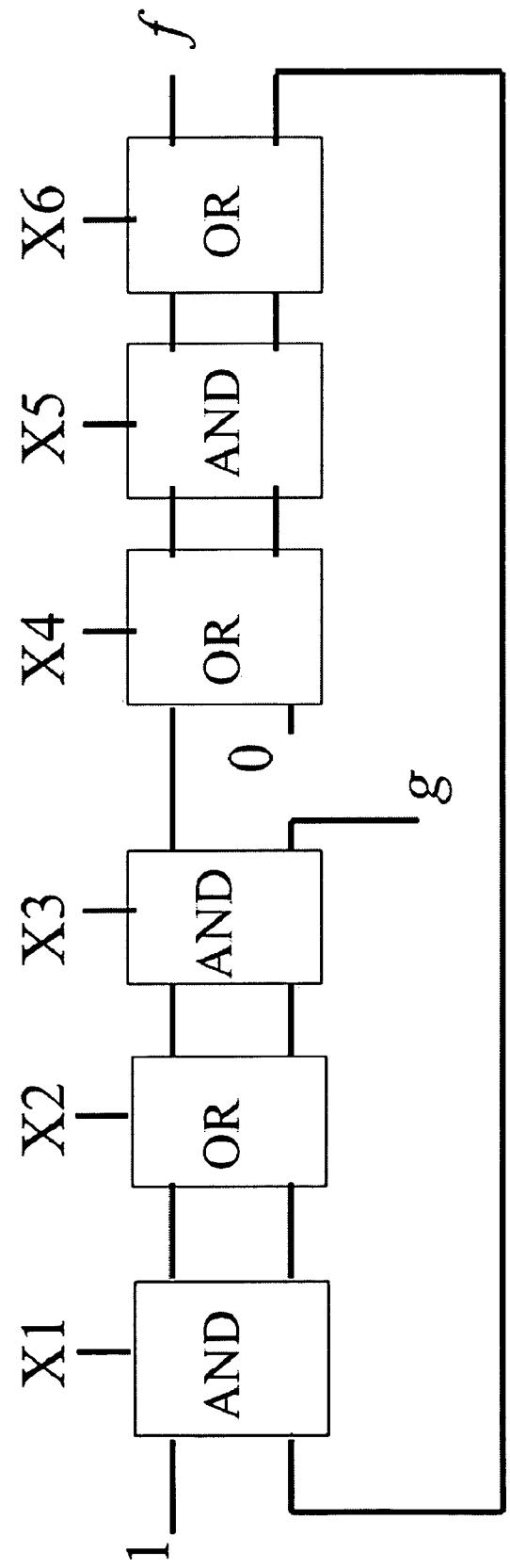
FIG. 51 illustrates the LUT ring that obtained by merging the LUT cascades for f and g.
Figure 52:
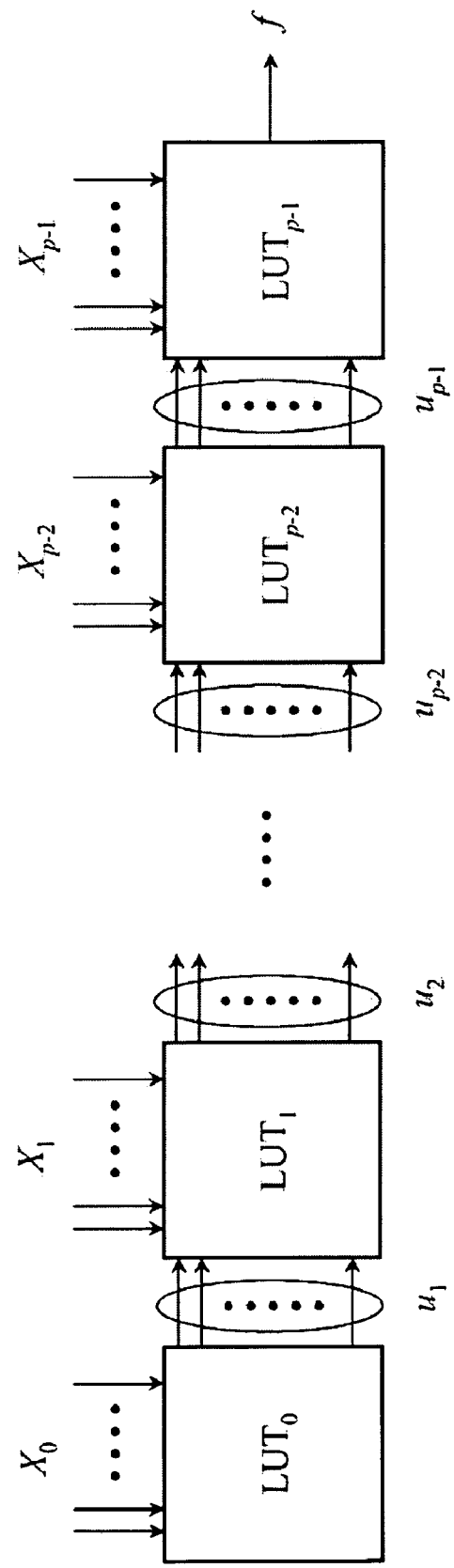
FIG. 52 illustrates the principle of the LUT cascade.

And, combine these two LUT cascades into one LUT ring as shown in FIG. 51. As a result, we can implement two combinational logic circuits by one LUT ring. By storing the data into the memories for logic of the LUT ring, we can implement the two operations for two logic functions f and g at the same time with one PLD.

[End of Example 3]

INDUSTRIAL APPLICABILITY

As mentioned above, we have invented the following PLD: By using the interconnection circuit and the memory for interconnections, we can reconfigure the interconnections between the output lines of the memory for logic in the preceding stage as well as the input lines of the input variable, and the input line of the memory for logic of succeeding stage, according to the objective logic function. As a result, we can increase the degree of freedom in the design of the PLD: we can change both the numbers of rails, and the numbers of the input variables. Thus, we can realize more objective logic functions by one LUT cascade. Moreover, by optimizing the combination of the numbers of rails and the number of input variable, we can reduce the number of input lines for memories for logic. Thus, we can use the memory more efficiently. As a result, the usage area in LSI chip increases. Therefore, we can minimize the circuit, and achieve high-integration of the circuit.

Moreover, in the interconnection circuit of this invention, we provided the scheme to connect the outputs of the memory for logic in the preceding stage with the external output lines that produce the operation result of the logic function. As a result, we can take out the outputs of the memory for logic of the intermediate cell of the LUT cascade as output variables, and thus reduce the necessary amount of memory, and increases the speed of the operation.

Moreover, by allocating different LUT memory area for different objective logic functions, and by selectively changing the accessible memory area according to the value of the means to store the designator for block, we can implement operations of plural objective logic functions.

Furthermore, by using input selectors, we can select the input variables that are sent to the interconnection circuits and the memories for logic, for each unit independently. Thus, we can operate plural memories for logic at the same time, and implement in the pipelining mode.

What is claimed is:

1. A programmable logic device comprising:
    memories for logic which are arranged in series to store LUTs (look up tables) of logic functions;
    plural external input lines for input variables connecting to said memories for logic;
    one or more memories for interconnection which store(s) information for connection how to select either output lines of said memory for logic of the preceding stage or said external input lines connecting to each input line of said memory for logic of the succeeding stage; and
    one or more reconfigurable interconnection circuits which connect(s) the output lines of said memory for logic of the preceding stage or the external input lines with the input lines of said memory for logic of the succeeding stage according to the output of said memory for interconnection.

2. A programmable logic device comprising: memories for logic arranged in a circular shape to store LUTs of logic functions; plural external input lines for input variables connecting to said memories for logic;
    one or more memories for interconnection which store(s) information for connection how to select either output lines of said memory for logic of the preceding stage or said external input lines connecting to each input line of said memory for logic of the succeeding stage; and
    one or more reconfigurable interconnection circuits which connect(s) the output lines of said memory for logic of the preceding stage or the external input lines with the input lines of said memory for logic of the succeeding stage according to the output of said memory for interconnection.

3. The programmable logic device according to claim 1:
    comprising external output lines which send out the result of logic operation to the external circuit; and wherein said memory for interconnection stores information for connection how to select output lines of said memory for logic of the preceding stage that connect to said external output lines;

said interconnection circuit connects the output lines of said memory for logic of the preceding stage with said external output lines according to the output of said memory for interconnection.

4. The programmable logic device according to claim 1:

comprising means to store the designator for block which stores the variable for designating block to specify the block in the memory for logic; and wherein said interconnection circuit connects the output lines of said memory for logic of the preceding stage, the external input lines, and the output lines of means to store the designator for block with the input lines of said memory for logic of the succeeding stage, according to the output of said means to store the designator for block, so that input variables from outputs of said memory for logic of the preceding stage and said external input lines, are sent to the memory area of said memory for logic of the succeeding stage which is specified by variable for designating block, or so that input variables from output of the memory block of said memory for logic of the preceding stage which is specified by variable for designating block and said external input lines, are sent to said memory for logic of the succeeding stage.

5. The programmable logic device according to claim 1 comprising:

an intermediate variable register which stores outputs of said memories for logic and sends them to the inputs to succeeding said memory for logic activated by the external data strobe signal.

6. The progranirnable logic device according to claim 1 comprising:

bypass lines to connect inputs with outputs of said intermediate variable register; and bypass selection circuits that select either the output lines of said intermediate variable register or said bypass lines, and produce the signal of the selected lines.

7. The programmable logic device according to claim 5 comprising: means to designate the memory for logic which specifies the index of said memory for logic to perform the operation by counting the number of said data strobe signals.

8. programmable logic device according to claim 5 comprising: means for power control that set said memories for logic performing the operations to the normal mode and other memories for logic to the low power mode.

9. The programmable logic device according to claim 1: wherein the input lines of part of said memory for logic are directly connected to said external input lines without passing through said interconnection circuit.

10. The programmable logic device according to claim 1: wherein the output lines of part of said memory for logic are directly connected to the input line of part of the memory for logic in the succeeding stage, without passing through said interconnection circuit.

11. The programmable logic device according to claim 1: wherein said interconnection circuit comprises selectors; and each said selector selects either an output line of said memory for logic in the preceding stage or an external input line, or either an output line of said memory for logic in the preceding stage, said external input line, or an output line of the mean to store the designator for block, and connects to the input line of memory for logic in the succeeding stage, according to the output values of said memory for interconnection.

12. The programmable logic device according to claim 1: wherein said interconnection circuit comprises a shifter where output lines of said memory for logic in the preceding stage are shifted to connect to the input line of said memory for logic in the succeeding stage, according to the output values of said memory for interconnection.

13. The programmable logic device according to claim 1: wherein said interconnection circuit comprises multiplexers; and said each multiplexer selects one line out of the plural output lines of said memory for logic in the preceding stage and the plural external input lines, and connects it to an input line of said memory for logic in the succeeding stage, according to the output values of said memory for interconnection.

* * * * *